United States Patent
Yu et al.

(10) Patent No.: US 12,398,318 B2
(45) Date of Patent: Aug. 26, 2025

(54) ORGANIC LIGHT EMITTING DIODE AND ORGANIC LIGHT EMITTING DEVICE HAVING THEREOF

(71) Applicant: LG Display Co., Ltd., Seoul (KR)

(72) Inventors: Young-Jun Yu, Paju-si (KR); Sang-Beom Kim, Paju-si (KR); Hyun-Chul Choi, Paju-si (KR); Ji-Ho Baek, Paju-si (KR); In-Bum Song, Paju-si (KR); Jeong-Dae Seo, Paju-si (KR); Sun-Kap Kwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 938 days.

(21) Appl. No.: 17/539,410

(22) Filed: Dec. 1, 2021

(65) Prior Publication Data
US 2022/0173323 A1    Jun. 2, 2022

(30) Foreign Application Priority Data

Dec. 1, 2020   (KR) .......................... 10-2020-0165607

(51) Int. Cl.

| | | |
|---|---|---|
| H01L 51/54 | (2006.01) | |
| C09K 11/06 | (2006.01) | |
| H10K 59/12 | (2023.01) | |
| H10K 85/30 | (2023.01) | |
| H10K 85/60 | (2023.01) | |
| H10K 50/11 | (2023.01) | |
| H10K 50/15 | (2023.01) | |
| H10K 50/18 | (2023.01) | |
| H10K 50/19 | (2023.01) | |
| H10K 101/00 | (2023.01) | |
| H10K 101/10 | (2023.01) | |

(52) U.S. Cl.
CPC .............. *C09K 11/06* (2013.01); *H10K 59/12* (2023.02); *H10K 85/322* (2023.02); *H10K 85/615* (2023.02); *H10K 85/624* (2023.02); *H10K 85/626* (2023.02); *H10K 85/633* (2023.02); *H10K 85/636* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 50/15* (2023.02); *H10K 50/181* (2023.02); *H10K 50/19* (2023.02); *H10K 2101/10* (2023.02); *H10K 2101/90* (2023.02)

(58) Field of Classification Search
None
See application file for complete search history.

(56) References Cited

U.S. PATENT DOCUMENTS

2019/0305227 A1    10/2019   Yoon et al.

FOREIGN PATENT DOCUMENTS

| KR | 10-2019-0048843 A | 5/2019 |
|---|---|---|
| KR | 10-2020-0081976 A | 7/2020 |
| WO | WO 2020080417 A1 | 4/2020 |
| WO | WO 2020138867 A1 | 7/2020 |

*Primary Examiner* — Andrew K Bohaty
(74) *Attorney, Agent, or Firm* — Seed Intellectual Property Law Group LLP

(57) ABSTRACT

An organic light emitting diode and an organic light emitting device containing the same are provided. The organic light emitting diode includes at least two emitting parts each of which includes independently an emitting material layer. Each of the emitting material layers includes independently an anthracene-based host having different deuterium substitution rates. The organic light emitting device includes the organic light emitting diode. Hosts with different deuterium substitution rates are introduced into each organic emitting material layer to improve luminous efficiency and luminous lifespan of the organic light emitting diode and the organic light emitting device.

21 Claims, 5 Drawing Sheets

ORGANIC LIGHT EMITTING DIODE AND ORGANIC LIGHT EMITTING DEVICE HAVING THEREOF

CROSS-REFERENCE TO RELATED APPLICATIONS

This application claims the priority of Korean Patent Application No. 10-2020-0165607, filed in the Korean Intellectual Property Office on Dec. 1, 2020, the entire content of which is expressly incorporated herein by reference in its entirety.

BACKGROUND

Technical Field

The present disclosure relates to an organic light emitting diode, and more specifically, to an organic light emitting diode having excellent luminous efficiency and luminous lifespan and an organic light emitting device including the diode.

Discussion of the Related Art

An organic light emitting diode (OLED) among a flat display device used widely has come into the spotlight as a display device replacing rapidly a liquid crystal display device (LCD). The OLED can be formed as a thin organic film less than 2000 Å and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage and the OLED has excellent high color purity compared to the LCD.

Since fluorescent material uses only singlet exciton energy in the luminous process, the related art fluorescent material shows low luminous efficiency. On the contrary, phosphorescent material can show high luminous efficiency since it uses triplet exciton energy as well as singlet exciton energy in the luminous process. However, metal complex, representative phosphorescent material, has short luminous lifespan for commercial use. Particularly, blue luminous materials have not showed satisfactory luminous efficiency and luminous lifespan compared to other color luminous materials. Therefore, there remains a need to develop a new compound or a device structure that can enhance luminous efficiency and luminous lifespan of the organic light emitting diode.

BRIEF SUMMARY

Accordingly, embodiments of the present disclosure are directed to an organic light emitting device hat substantially obviates one or more of the problems due to the limitations and disadvantages of the related art.

An aspect of the present disclosure is to provide an organic light emitting diode with improved luminous efficiency and luminous lifespan and an organic light emitting device including the diode.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, the present disclosure provides an organic light emitting diode comprising a first electrode; a second electrode facing the first electrode; a first emitting par disposed between the first and second electrode and comprising a first emitting material layer; a second emitting part disposed between the first emitting part and the second electrode and comprising a second emitting material layer; and a first charge generation layer disposed between the first and second emitting parts, wherein the first emitting material layer includes a first host having the following structure of Formula 1; and wherein the second emitting material layer includes a second host having the following structure of Formula 3:

Formula 1

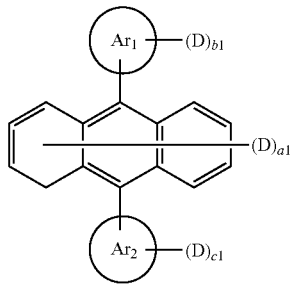

Formula 3

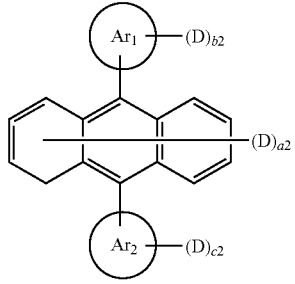

wherein each of $Ar_1$ and $Ar_2$ is independently a $C_6$-$C_{20}$ aryl group; D represents deuterium; each of a1 and a2 is independently an integer of 0 to 8; each of b1, b2, c1 and c2 is independently a number of deuterium substituted carbon atoms in $Ar_1$ and $Ar_2$ not linked to the anthracene core; and a sum of a1, b1 and c1 is different from a sum of a2, b2 and c2.

For example, the organic light emitting diode may further comprise a third emitting part disposed between the first charge generation layer and the second emitting part and including a third emitting material layer, and a second charge generation layer disposed between the second emitting part and the third emitting part.

The organic light emitting diode having a tandem structure may emit a blue (B) light or a white (W) light.

In another aspect, the present disclosure provides an organic light emitting device comprising a substrate and the organic light emitting diode over the substrate.

The substrate may define a red pixel region, a green pixel region and a blue pixel region and the organic light emitting diode may be located correspondingly to the red pixel region, the green pixel region and the blue pixel region, and the organic light emitting device may further comprise a color conversion layer disposed between the substrate and the organic light emitting diode or over the organic light emitting diode correspondingly to the red pixel region and the green pixel region.

The substrate may define a red pixel region, a green pixel region and a blue pixel region and the organic light emitting diode may be located correspondingly to the red pixel region, the green pixel region and the blue pixel region, and the organic light emitting device may further comprise a color filter layer disposed between the substrate and the organic light emitting diode or over the organic light emitting diode correspondingly to the red pixel region, the green pixel region and the blue pixel region.

It is to be understood that both the foregoing general description and the following detailed description are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings.

The present disclosure relates to an organic light emitting diode including multiple emitting parts where an anthracene-based host having a different deuterium substitution rate is introduced into an emitting material layer constituting each emitting part, and an organic light emitting device including the organic light emitting diode. The configuration of the present disclosure enables the organic light emitting diode and the organic light emitting device to maximize their luminous efficiency and luminous lifespan. The organic light emitting diode can be applied into an organic light emitting device such as an organic light emitting display device or an organic light emitting illumination device.

Figure 1:
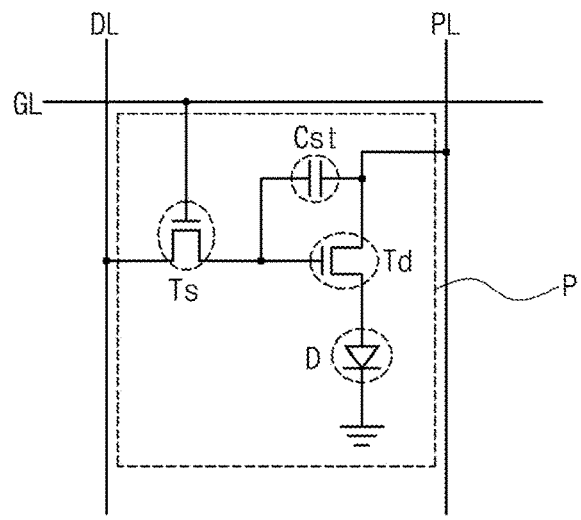
FIG. 1 is a schematic circuit diagram illustrating an organic light emitting display device in accordance with the present disclosure.

FIG. 1 is a schematic circuit diagram illustrating an organic light emitting display device of the present disclosure. As illustrated in FIG. 1, a gate line GL, a data line DL and power line PL, each of which cross each other to define a pixel region P, in the organic light emitting display device. A switching thin film transistor Ts, a driving thin film transistor Td, a storage capacitor Cst and an organic light emitting diode D are formed within the pixel region P. The pixel region P may include a red (R) pixel region, a green (G) pixel region and a blue (B) pixel region.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
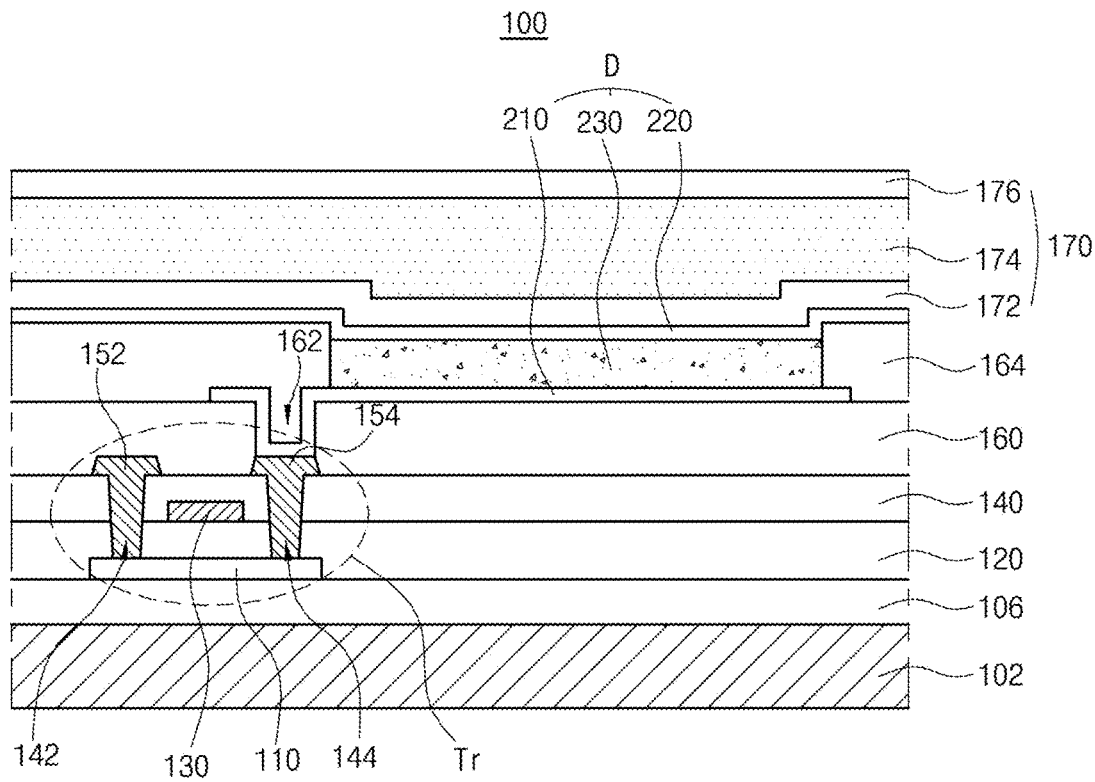
FIG. 2 is a schematic cross-sectional view illustrating an organic light emitting display device as an example of an organic light emitting device in accordance with one exemplary aspect of the present disclosure.

FIG. 2 is a schematic cross-sectional view illustrating an organic light emitting display device in accordance with an exemplary aspect of the present disclosure. As illustrated in FIG. 2, the organic light emitting display device 100 comprises a substrate 102, a thin-film transistor Tr over the substrate 102, and an organic light emitting diode D connected to the thin film transistor Tr. As an example, the substrate 102 defines a red pixel region, a green pixel region and a blue pixel region and the organic light emitting diode D is located in each pixel region. In other words, the organic light emitting diode D, each of which emits red, green or blue light, is located correspondingly in the red pixel region, the green pixel region and the blue pixel region.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the organic light emitting diode D are arranged, forms an array substrate.

A buffer layer 106 may be disposed over the substrate 102, and the thin film transistor Tr is disposed over the buffer layer 106. The buffer layer 106 may be omitted.

A semiconductor layer 110 is disposed over the buffer layer 106. In one exemplary aspect, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light.

Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 2, the gate insulating layer 120 may be patterned identically as the gate electrode 130.

An interlayer insulating layer 140 including an insulating material is disposed on the gate electrode 130 with covering over an entire surface of the substrate 102. The interlayer insulating layer 140 may include an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. Namely, the thin film transistor T4 may correspond to the driving thin film transistor Td (of FIG. 1). The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may include amorphous silicon.

Although not shown in FIG. 2, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 160 is disposed on the source and drain electrodes 152 and 154 with covering the thin film transistor Tr over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The OLED D further includes an emissive layer 230 and a second electrode 220 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive oxide (TCO) such as indium tin oxide (ITO), indium zinc oxide (IZO), indium tin zinc oxide (ITZO), SnO, ZnO, indium cerium oxide (ICO), aluminum doped zinc oxide (AZO), and the like.

In one exemplary aspect, when the organic light emitting display device 100 is a bottom-emission type, the first electrode 210 may have a single-layered structure of TCO. Alternatively, when the organic light emitting display device 100 is a top-emission type, a reflective electrode or a reflective layer may be disposed under the first electrode 210. For example, the reflective electrode or the reflective layer may include, but is not limited to, Ag or aluminum-palladium-copper (APC) alloy. In the OLED of the top-emission type, the first electrode 210 may have a triple-layered structure of ITO/Ag/ITO or ITO/APC/ITO.

In addition, a bank layer 164 is disposed on the passivation layer 160 in order to cover edges of the first electrode 210. The bank layer 164 exposes a center of the first electrode 210. The bank layer 164 may be omitted.

Figure 3:
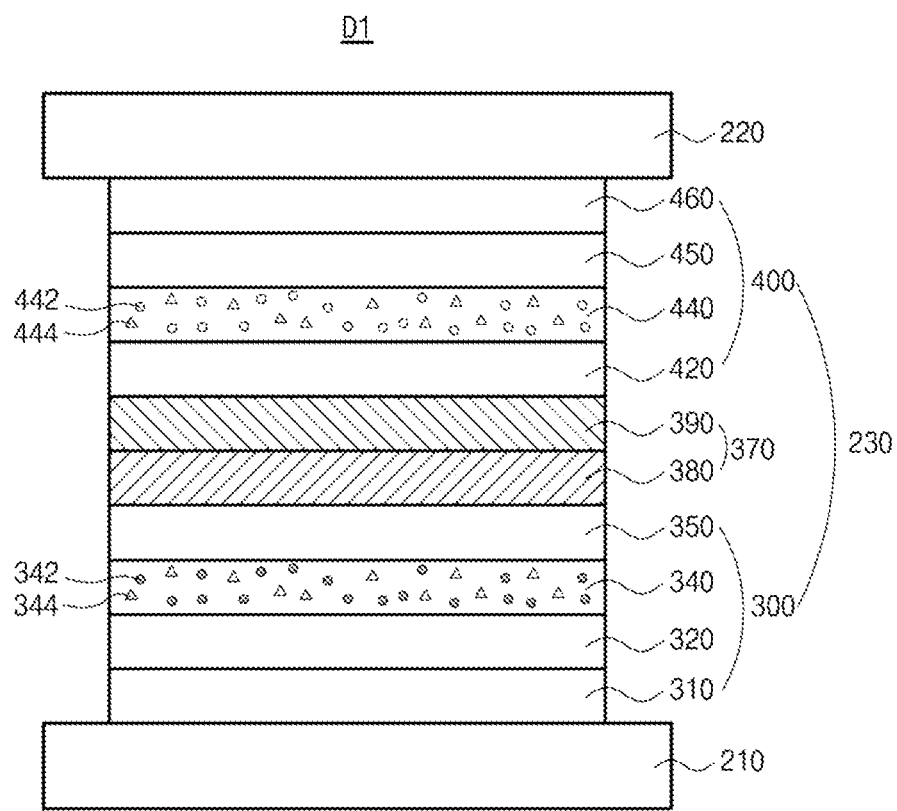
FIG. 3 is a schematic cross-sectional view illustrating an organic light emitting diode having two emitting part in accordance with an exemplary aspect of the present disclosure.

An emissive layer 230 is disposed on the first electrode 210. In one exemplary embodiment, the emissive layer 230 may include a hole injection layer (HIL), a hole transport layer (HTL), an electron blocking layer (EBL), an emitting material layer (EML), a hole blocking layer (HBL), an electron transport layer (ETL), an electron injection layer (EIL) and/or a charge generation layer (CGL), as illustrated in FIG. 3. The emissive layer 230 may have multiple emitting parts to form a tandem structure.

The emissive layer 230 may include at least one emitting material layer including an anthracene-based host and a boron-based dopant. Such an emissive layer 230 enables the OLED D and the organic light emitting display device 100 to improve their luminous efficiency and luminous lifespan. We will describe the OLED in more detail below.

The second electrode 220 is disposed over the substrate 102 above which the emissive layer 230 is disposed. The second electrode 220 may be disposed over a whole display area, and may include a conductive material with a relatively low work function value compared to the first electrode 210, and may be a cathode. For example, the second electrode 220 may include, but is not limited to, aluminum (Al), magnesium (Mg), calcium (Ca), silver (Ag), alloy thereof such as aluminum-magnesium alloy (Al—Mg) and combination thereof such as Ag:Mg. For example, when the second electrode 220 comprises Ag:Mg, Ag and Mg may be mixed with, but is not limited to, a weight ratio between about 5:1 and about 10:1, for example, about 8:1 and 10:1. When the organic light emitting display device 100 is a top-emission type, the second electrode 220 is thin so as to have light-transmissive (or semi-transmissive) property.

In addition, an encapsulation film 170 may be disposed over the second electrode 220 in order to prevent outer moisture from penetrating into the organic light emitting diode D. The encapsulation film 170 may have, but is not limited to, a laminated structure of a first inorganic insulating film 172, an organic insulating film 174 and a second inorganic insulating film 176. The encapsulation film 170 may be omitted.

The organic light emitting display device 100 may further includes a polarizing plate to reduce reflection of external light. For example, the polarizing plate may be a circular polarizing plate. When the organic light emitting display device 100 is a bottom-emission type, the polarizing plate may be disposed under the substrate 102. Alternatively, when the organic light emitting display device 100 is a top-emission type, the polarizing plate may be attached onto the encapsulation film. Further, a cover window may be attached onto the encapsulation film 170 or the polarizing plate in the organic light emitting display device 100 of a top-emission type. In this case, the substrate 102 and the cover window have flexible properties so that a flexible display device can be constructed.

As described above, introducing a separate host having a different deuterium substitution rate into an emitting material layer constituting each emitting part enables the OLED to maximize its luminous efficiency and luminous lifespan. FIG. 3 is a schematic cross-sectional view illustrating an organic light emitting diode having two emitting parts in accordance with an exemplary embodiment of the present disclosure.

As illustrated in FIG. 3, the organic light emitting diode (OLED) D1 in accordance with the first aspect of the present disclosure includes first and second electrodes 210 and 220 facing each other and an emissive layer 230 disposed between the first and second electrodes 210 and 220. The organic light emitting display device 100 (FIG. 2) includes a red pixel region, a green pixel region and a blue pixel region, and the OLED D1 may be disposed in the blue pixel region.

One of the first and second electrodes 210 and 220 is an anode and the other of the first and second electrodes 210 and 220 is a cathode. For example, the first electrode 210 may be an anode injecting holes and the second electrode 220 may be a cathode injecting electrons. In addition, one of the first and second electrodes 210 and 220 is a reflective electrode and the other of the first and second electrodes 210 and 220 is a transmissive (semi-transmissive) electrode. For example, each of the first and second electrodes 210 and 220 may have a thickness, but is not limited to, between about 100 Å about 2000 Å, for example, about 100 Å and about 1000 Å.

The emissive layer 230 includes a first emitting part 300 and a second emitting part 400. In addition, the emissive layer 230 may further include a charge generation layer (CGL) 370 disposed between the first emitting part 300 and the second emitting part 400, thus, the first emitting part 300, the CGL 370 and the second emitting part 400 are disposed sequentially on the first electrode 210. In other words, the first emitting part 300 is disposed between the first electrode 210 and the CGL 370 and the second emitting part 400 is disposed between the second electrode 220 and the CGL 370.

The first emitting part 300 includes a first emitting material layer (lower emitting material layer, EML1) 340. The first emitting part 300 may further include at least one of an HIL 310 disposed between the first electrode 210 and the EML1 340, a first hole transport layer (lower hole transport layer, HTL1) 320 disposed between the HIL 310 and the EML1 340, and a first electron transport layer (lower electron transport layer, ETL1) 350 disposed between the EML1 340 and the CGL 370. Alternatively, the first emitting part 300 may further include first electron blocking layer (lower electron blocking layer, EBL1, not shown) disposed between the HTL1 320 and the EML1 340.

The second emitting part 400 includes a second emitting material layer (upper emitting material layer, EML2) 440. The second emitting part 400 may further include at least one of a second hole transport layer (upper hole transport layer, HTL2) 420 disposed between the CGL 370 and the EML2 440, a second electron transport layer (upper electron transport layer, ETL2) 450 disposed between the second electrode 220 and the EML2 440 and an EIL 460 disposed between the second electrode 220 and the ETL2 450. Alternatively, the second emitting part 400 may further include a second electron blocking layer (upper electron blocking layer, EBL2, not shown) disposed between the HTL2 420 and the EML2 440.

The EML1 340 may include a first host 342 and a first dopant 344 and the EML2 440 may include a second host 442 and a second dopant 444. In this case, each of the first host 342 and the second host 442 forms a medium or a matrix in the EML1 340 and the EML2 440, respectively. In the drawing, for convenience of description, some of the first and second hosts 342 and 442 are shown in the form of particles.

The EML1 340 includes the first host 342 of an anthracene-based organic compound and the first dopant 344 of a boron-based organic compound so as to emit blue light. The EML2 440 includes the second host 442 of an anthracene-based organic compound and the second dopant 444 of a boron-based organic compound so as to emit blue light. The first host 342 is different from the second host 442 in the substitution rate of deuterium introduced into the molecule.

For example, the first host 342 may be an anthracene-based organic compound where all hydrogen (protium) atoms linked to a carbon atom of the molecule, for example, carbon atoms of an aromatic ring in the molecule, are substituted with deuterium atoms. The first host 342 may have the following structure of Formula 1. In contrast, the second host 442 may be an anthracene-based organic compound where hydrogen (protium) atoms linked to a carbon atom of the molecule, for example, carbon atoms of an aromatic ring in the molecule, are not substituted with deuterium atoms or the a portion of the protium atoms are substituted with deuterium atoms. The second host 442 may have the following structure of Formula 3:

Formula 1

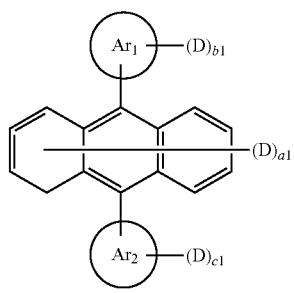

Formula 3

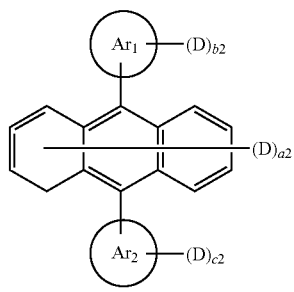

Formula 2

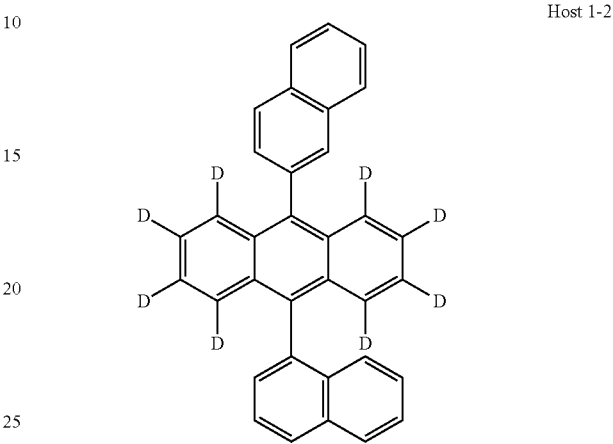

Host 1-2

Host 1-5

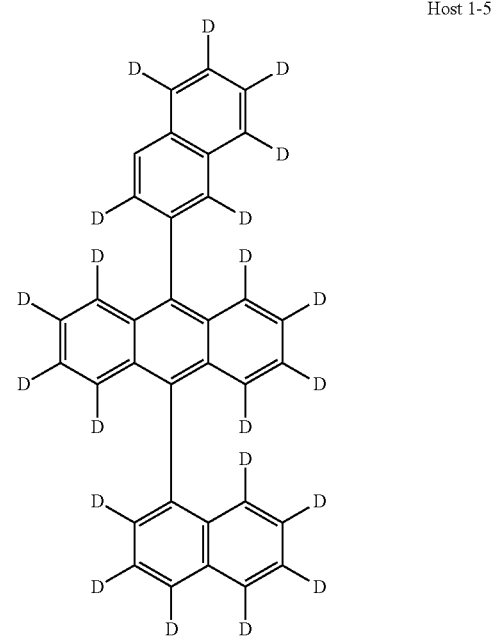

wherein each of $Ar_1$ and $Ar_2$ is independently a $C_6$-$C_{20}$ aryl group; D represents deuterium; each of a1 and a2 is independently a number of deuterium substituted carbons in the anthracene core and each of a1 and a2 is independently an integer of 0 to 8; each of b1, b2, c1 and c2 is independently a number of deuterium substituted carbon atoms in $Ar_1$ and $Ar_2$ not linked to the anthracene core; a sum of a1, b1 and c1 is different from a sum of a2, b2 and c2.

For example, a1 in Formula 1 may differ from a2 in Formula 3, b1 in Formula 1 may differ from b2 in Formula 3 and/or c1 in Formula 1 may differ from c2 in Formula 3. As an example, each of b1, c1, b2 and c2 in Formulae 1 and 3 may be independently an integer of 0 to 19. Both the first host 342 and the second host 442 are anthracene-based derivatives having substantially the same chemical structure except the deuteration rate (deuterium substitution rate). In other words, the first host 342 has a first deuteration rate and the second host 442 has a second deuteration rate different form the first deuteration rate.

In one exemplary aspect, each of Ar1 and Ar2 in Formulae 1 and 3 may be independently selected from a phenyl group, a naphthyl group and an anthracenyl group. As an example, each of Ar1 and Ar2 in Formulae 1 and 3 may be independently 1-naphthyl or 2-naphthyl. For example, one of Ar1 and Ar2 in Formulae 1 and 3 may be 1-naphthyl and the other Ar1 and Ar2 in Formulae 1 and 3 may be 2-naphthyl. In this case, each of b1, b2, c1 and c2 in Formulae 1 and 3 may be independently an integer of 0 to 7.

As an example, the first host 342 having the structure of Formula 1 may comprises an anthracene-based organic compound where at least one of carbon atoms in the anthracene core is substituted with deuterium, and the carbon atoms in both Ar1 and Ar2 are not substituted with deuterium (i.e., a1 is an integer of 1 to 8, each of b1 and c1 is 0). For example, the first host 342 may have a deuteration rate of about 27% to about 37%. Alternatively, the first host 342 of the anthracene-based compound having the structure of Formula 1 may have a deuteration rate of equal to or more than about 90%, for example, 100%. In one exemplary aspect, the first host 342 may be selected from, but is not limited to, the following anthracene-based organic compounds having the structure of Formula 2:

In an exemplary aspect, the second host 442 having the structure of Formula 3 may comprises an anthracene-based organic compound where none of the carbon atoms in the aromatic rings is substituted with deuterium (0% of deuteration rate). Alternatively, the second host 442 having the structure of Formula 3 may comprise an anthracene-based organic compound where at least one of carbon atoms in the anthracene core is substituted with deuterium, and none of the carbon atoms in both $Ar_1$ and $Ar_2$ is substituted with deuterium (i.e., a2 is an integer of 1 to 8, each of b2 and c2 is 0). For example, the second host 442 may have a deuteration rate of about 27% to about 37%. In another exemplary aspect, the second host 442 having the structure of Formula 3 may comprise an anthracene-based organic compound where at least one of carbon atoms in the anthracene core is substituted with deuterium, and at least one of the carbon atom(s) in one of $Ar_1$ and $Ar_2$ is substituted with deuterium, and the carbon atoms in the other of $Ar_1$ and $Ar_2$ is not substitute with deuterium (i.e., a2 is an integer of 1 to 8, one of b2 and c2 is 0 and the other of b2 and c2 is not 0). For example, the second host 442 may have a deuteration rate of about 59% to about 68%. In still another exemplary aspect, the second host 442 of the anthracene-based organic compound having the structure of Formula 3 may have a deuteration rate of equal to or more than about 90%, for example, 100%. For example, the second host 442 may be selected from, but is not limited to, the following anthracene-based organic compounds having the structure of Formula 4:

Formula 4

Host 1-1

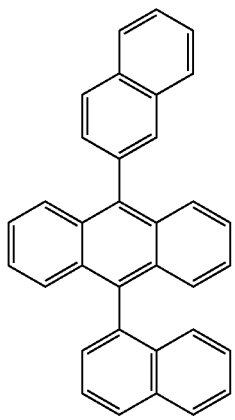

Host 1-2

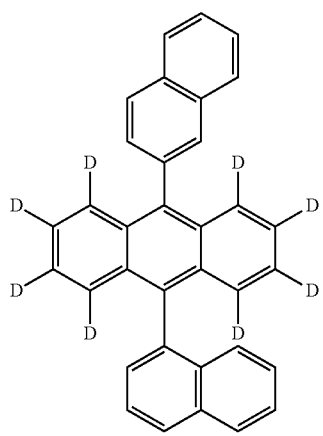

Host 1-3

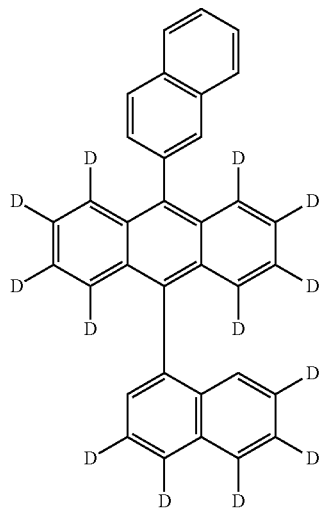

Host 1-4

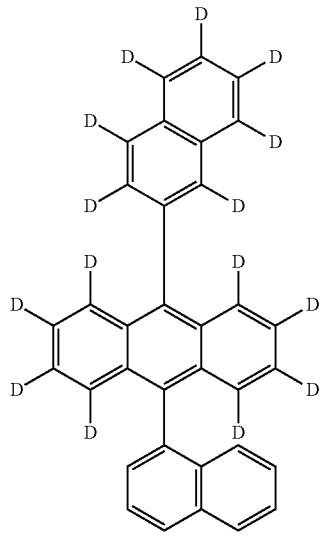

Host 1-5

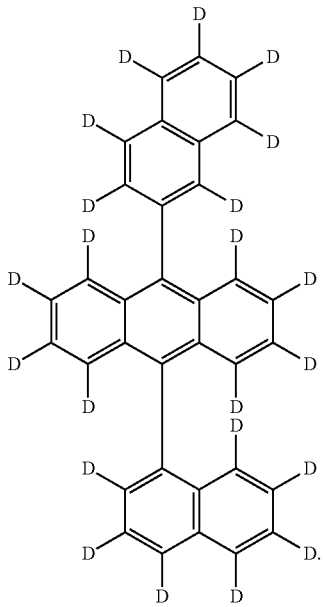

Each of the first dopant 344 and the second dopant 444 may comprise independently a boron-based organic compound so that both the EML1 340 and the EML2 440 may emit blue light. The first dopant 344 may be identical to or different from the second dopant 444. For example, each of the first dopant 344 and the second dopant 444 may comprise a boron-based organic compound having the following structure of Formula 5:

Formula 5

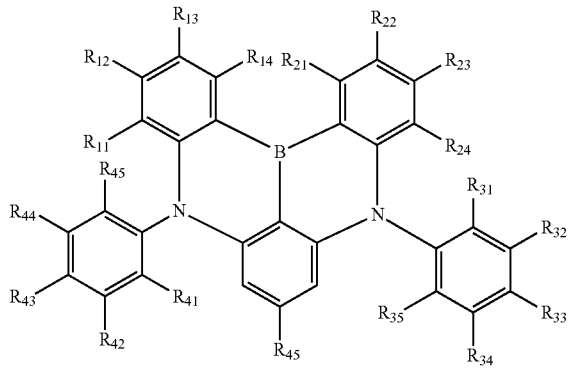

wherein each of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$ and $R_{45}$ is independently selected from the group consisting of protium, deuterium, a $C_1$-$C_{10}$ alkyl group, a $C_6$-$C_{30}$ aryl group, a $C_6$-$C_{30}$ aryl amino group and a $C_5$-$C_{30}$ hetero aryl group, each of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$ and $R_{45}$ may be identical to or different from each other, or adjacent two of $R_{31}$, $R_{32}$, $R_{33}$, $R_{34}$ and $R_{35}$ together with the carbon atoms to which they are attached or adjacent two of $R_{41}$, $R_{42}$, $R_{43}$, $R_{44}$ and $R_{45}$ together with the carbon atoms to which they are attached forms independently an unsubstituted or substituted $C_6$-$C_{10}$ aromatic ring or an unsubstituted or substituted $C_5$-$C_{10}$ hetero aromatic ring; $R_{51}$ is selected from the group consisting of protium, deuterium, a $C_1$-$C_{10}$ alkyl group, a $C_3$-$C_{15}$ cyclo alkyl group, a $C_6$-$C_{30}$ aryl group, a $C_5$-$C_{30}$ hetero aryl group and a $C_6$-$C_{30}$ aryl amino group, wherein each of the $C_6$-$C_{30}$ aryl group and the $C_5$-$C_{30}$ hetero aryl group may be independently unsubstituted or substituted with deuterium or a $C_1$-$C_{10}$ alkyl group, wherein the aryl group of the $C_6$-$C_{30}$ aryl amino group may be unsubstituted or substituted with deuterium or at least one of a $C_1$-$C_{10}$ alkyl group and a $C_6$-$C_{20}$ aryl group.

Each of the $C_6$-$C_{30}$ aryl group, the $C_5$-$C_{30}$ hetero aryl group and the $C_6$-$C_{30}$ aryl amino group of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$, $R_{45}$ and $R_{51}$ may be independently unsubstituted or substituted with a $C_1$-$C_{10}$ alkyl group, for example, a $C_1$-$C_5$ alkyl group such as tert-butyl and/or tert-pentyl.

More particularly, the $C_6$-$C_{30}$ aryl amino group of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$, $R_{45}$ and $R_{51}$ may comprise independently, but is not limited to, a diphenyl amino group and a phenyl-naphthyl amino group. The $C_6$-$C_{30}$ aryl group of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$, $R_{45}$ and $R_{51}$ may comprise independently, but is not limited to, a phenyl group and a naphthyl group each of which is independently unsubstituted or substituted with at least one, for example 1-2, a $C_1$-$C_{10}$ alkyl group. The $C_5$-$C_{30}$ aryl hetero aryl group of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$, $R_{45}$ and $R_{51}$ may comprise independently, but is not limited to, a carbazolyl group. The $C_1$-$C_{10}$ alkyl group of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$, $R_{45}$ and $R_{51}$ may comprise independently, but is not limited to, a $C_1$-$C_5$ alkyl group such as methyl, ethyl, propyl, butyl (e.g., tert-butyl), pentyl (e.g., tert-pentyl). In this case, each of the $C_6$-$C_{30}$ aryl amino group, the $C_6$-$C_{30}$ aryl group, the $C_5$-$C_{30}$ hetero aryl group and the $C_1$-$C_{10}$ alkyl group as well as the substituent linked to those groups may be further substituted with deuterium.

The $C_6$-$C_{30}$ aromatic ring and the $C_5$-$C_{30}$ hetero aromatic ring formed by adjacent two of $R_{31}$ to $R_{35}$ and/or adjacent two of $R_{41}$ to $R_{45}$ may comprise, but is not limited to, a benzofuran ring and a benzothiophene ring each of which may be unsubstituted or substituted with one to three $C_1$-$C_5$ alkyl groups.

In one exemplary aspect, one of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$ and $R_{45}$ may comprise independently, but is not limited to, methyl, tert-butyl or tert-pentyl, and the rest of $R_{11}$, $R_{12}$, $R_{13}$ and $R_{14}$, the rest of $R_{21}$, $R_{22}$, $R_{23}$ and $R_{24}$, the rest of $R_{31}$, $R_{32}$, $R_{33}$, $R_{34}$ and $R_{35}$ and the rest of $R_{41}$, $R_{42}$, $R_{43}$, $R_{44}$ and $R_{45}$ may comprise independently, but is not limited to, protium or deuterium, and $R_{51}$ may comprise protium, deuterium, methyl, a diphenyl amino group, a phenyl-naphthyl amino group or a carbazolyl group. In another exemplary aspect, $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$ and $R_{45}$ may comprise hydrogen and $R_{51}$ may be a diphenyl amino group.

In still another exemplary aspect, $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$ and $R_{35}$ may comprise hydrogen, one of $R_{41}$, $R_{42}$, $R_{43}$, $R_{44}$ and $R_{45}$ may comprise a phenyl group, the rest of $R_{41}$, $R_{42}$, $R_{43}$, $R_{44}$ and $R_{45}$ may comprise hydrogen, and $R_{51}$ may comprise methyl. In further still another exemplary aspect, one of $R_1$, $R_{12}$, $R_{13}$ and $R_{14}$, one $R_{21}$, $R_{22}$, $R_{23}$ and $R_{24}$, one of $R_{31}$, $R_{32}$, $R_{33}$, $R_{34}$ and $R_{35}$ and one of $R_{41}$, $R_{42}$, $R_{43}$, $R_{44}$ and $R_{45}$ may comprise independently, but is not limited to, methyl, tert-butyl or tert-pentyl, the other of $R_{41}$, $R_{42}$, $R_{43}$, $R_{44}$ and $R_{45}$ may comprise a phenyl group and a naphthyl group each of which may be substituted with tert-butyl or tert-pentyl, and the rest of $R_{11}$, $R_{12}$, $R_{13}$ and $R_{14}$, the rest of $R_{21}$, $R_{22}$, $R_{23}$ and $R_{24}$, the rest of $R_{31}$, $R_{32}$, $R_{33}$, $R_{34}$ and $R_{35}$ and the rest of $R_{41}$, $R_{42}$, $R_{43}$, $R_{44}$ and $R_{45}$ may comprise independently, but is not limited to, protium or deuterium, and $R_{51}$ may comprise methyl.

In further still another exemplary aspect, one of $R_{11}$, $R_{12}$, $R_{13}$ and $R_{14}$, one of $R_{21}$, $R_{22}$, $R_{23}$ and $R_{24}$, one of $R_{31}$, $R_{32}$, $R_{33}$, $R_{34}$ and $R_{35}$ and one of $R_{41}$, $R_{42}$, $R_{43}$, $R_{44}$ and $R_{45}$ may comprise independently tert-butyl and tert-pentyl, other two of $R_{41}$, $R_{42}$, $R_{43}$, $R_{44}$ and $R_{45}$ may form a benzofuran ring or a benzothiophene ring that may be substituted with tert-butyl, the rest of $R_{11}$, $R_{12}$, $R_{13}$ and $R_{14}$, the rest of $R_{21}$, $R_{22}$, $R_{23}$ and $R_{24}$, the rest of $R_{31}$, $R_{32}$, $R_{33}$, $R_{34}$ and $R_{35}$ and the rest of $R_{41}$, $R_{42}$, $R_{43}$, $R_{44}$ and $R_{45}$ may comprise protium and deuterium, and $R_{51}$ may comprise methyl.

As an example, each of the first dopant 344 and the second dopant 444 may be independently selected from, but is not limited to, the following boron-based organic compounds having the structure of Formula 6:

Formula 6
Dopant 1
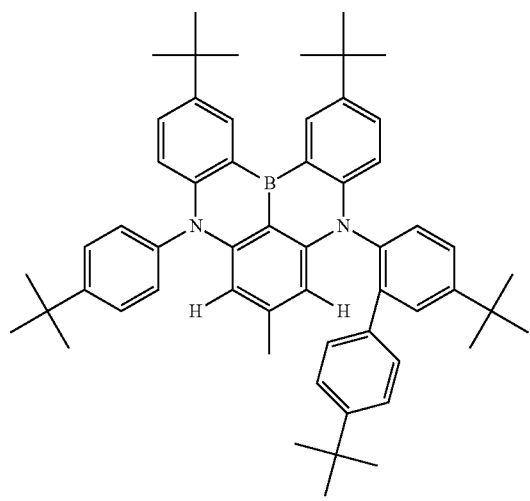
Dopant 2
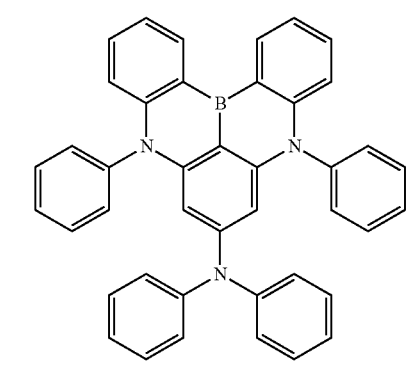
Dopant 3
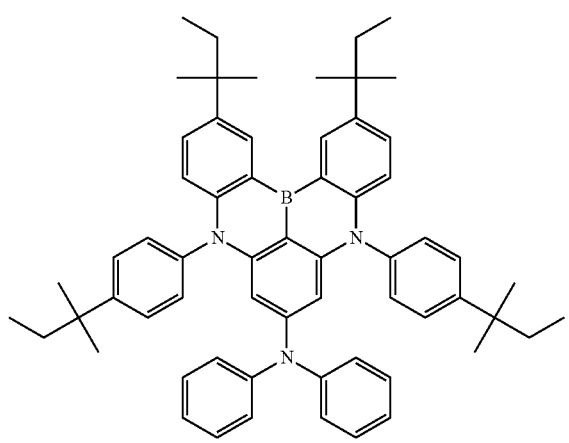
Dopant 4
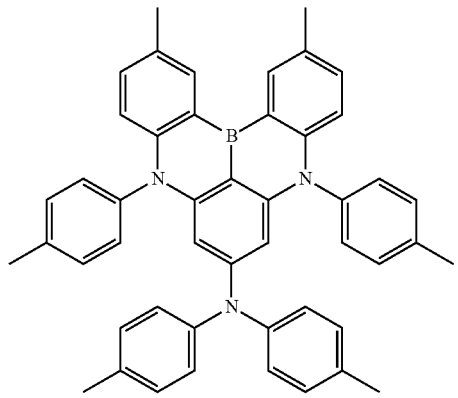
Dopant 5
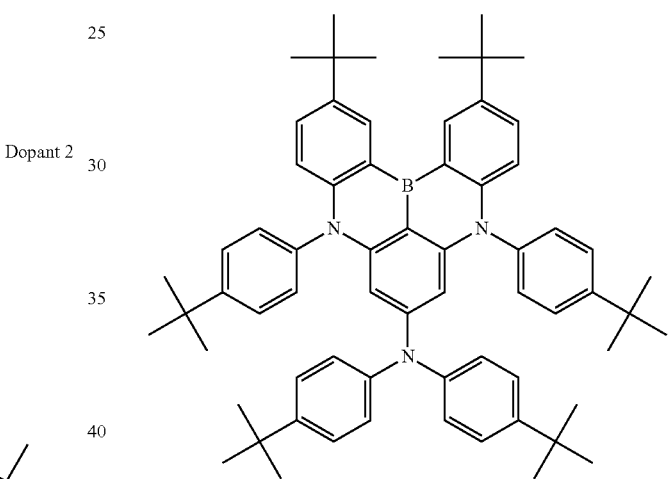
Dopant 6

Dopant 7
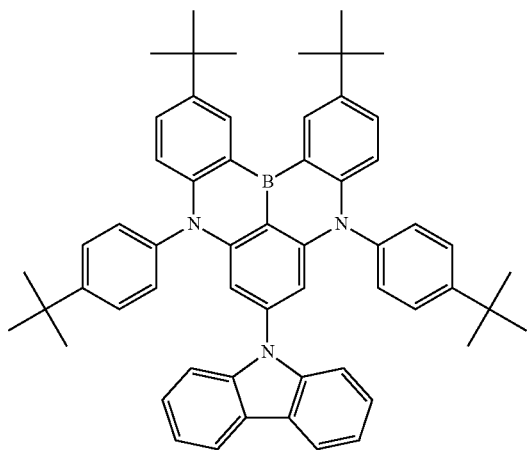
Dopant 8
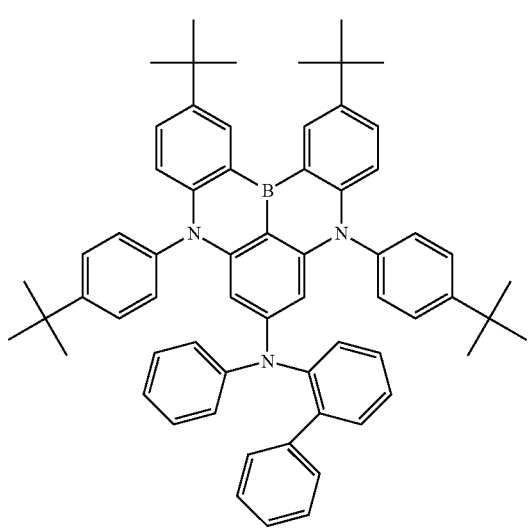
Dopant 9
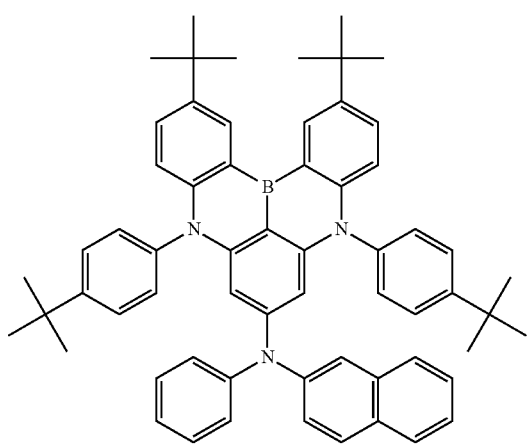
Dopant 10
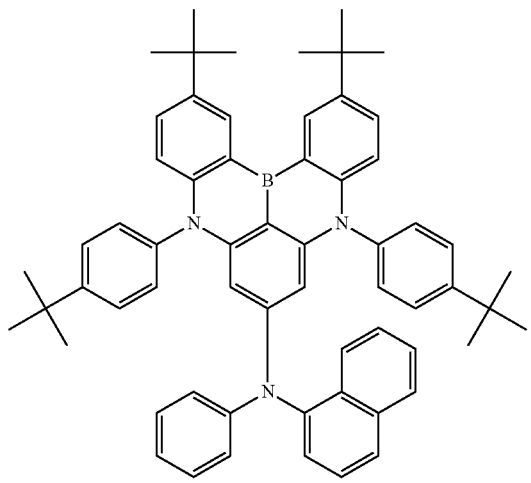
Dopant 11
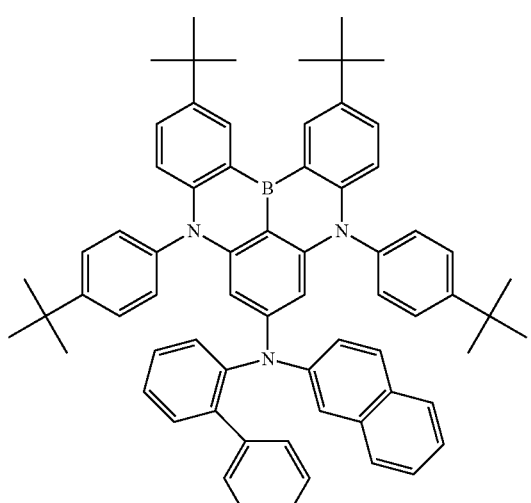
Dopant 12
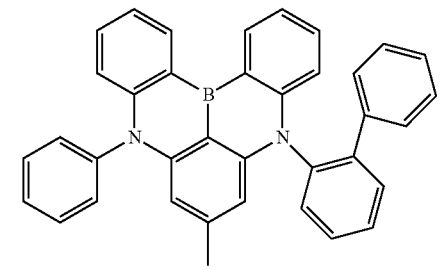
Dopant 13
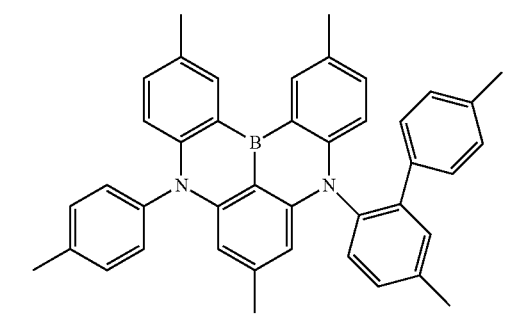

Dopant 14

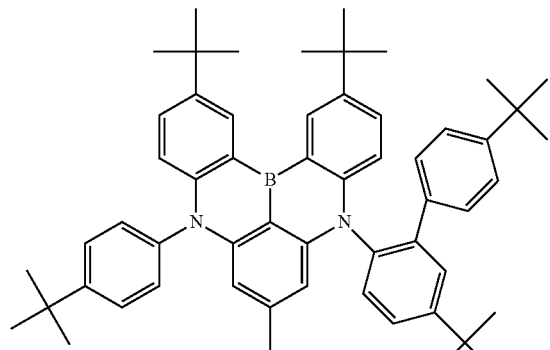

Dopant 15

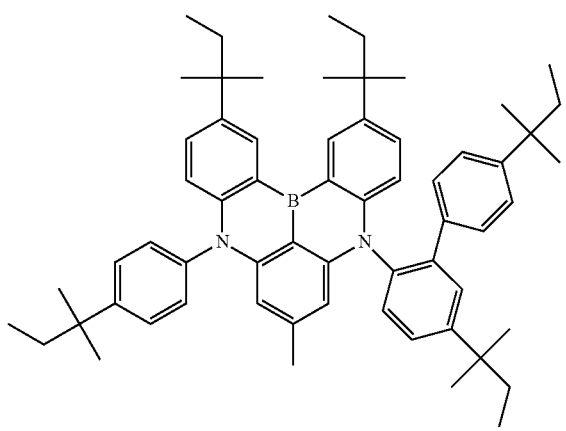

Dopant 16

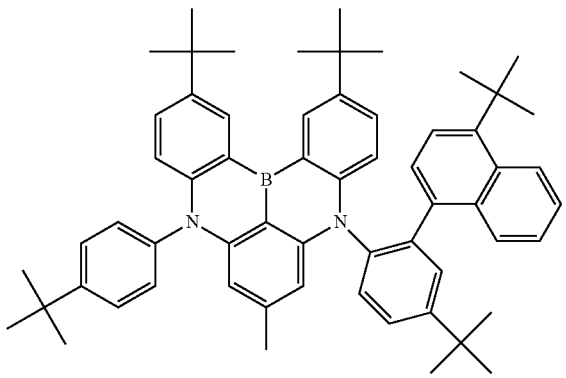

Dopant 17

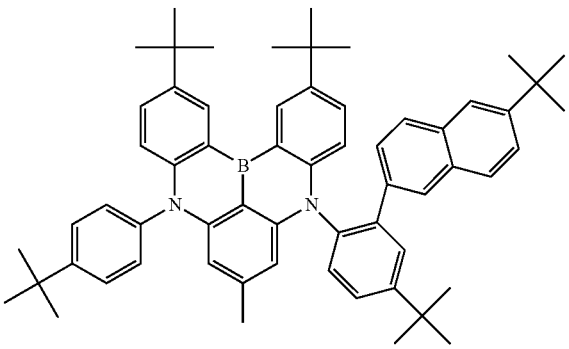

Dopant 18

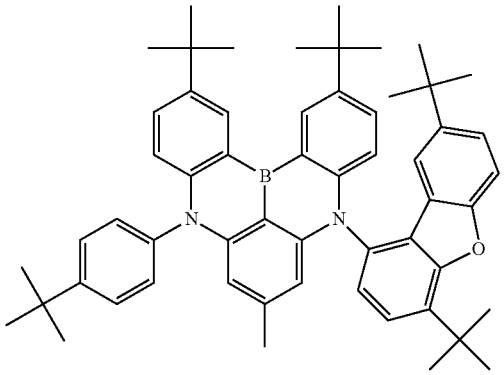

Dopant 19

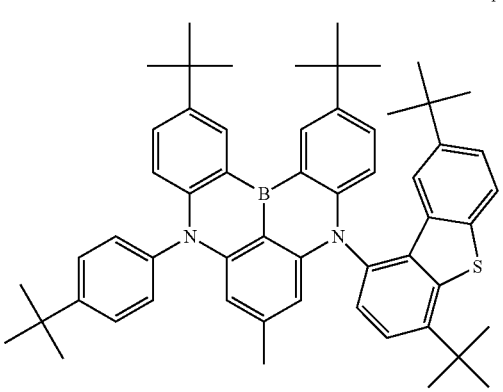

The contents of the first dopant 344 and the second dopant 444 in each of the EML1 340 and the EML2 440 may be, but is not limited to, about 1 wt % to about 10 wt %, for example, about 1 wt % to about 5 wt %. Each of the EML1 340 and the EML2 440 may have a thickness of, but is not limited to, about 100 Å to about 1000 Å, for example, about 200 Å to about 500 Å.

The HIL 310 is disposed between the first electrode 210 and the HTL1 320 and improves an interface property between the inorganic first electrode 210 and the organic HTL1 320. In one exemplary embodiment, the HIL 310 may include hole injection host and hole injection dopant.

In one exemplary aspect, the hole injection host may include, but is not limited to, a spirofluorene-based organic compound having the following structure of Formula 7:

Formula 7

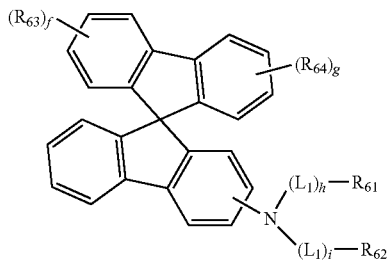

wherein each of $R_{61}$ and $R_{62}$ is independently a $C_6$-$C_{30}$ aryl group or a $C_3$-$C_{30}$ hetero aryl group, wherein each of the $C_6$-$C_{30}$ aryl group and the $C_3$-$C_{30}$ hetero aryl group may be independently unsubstituted or substituted with at least one of a $C_1$-$C_{10}$ alley group and a $C_6$-$C_{30}$ aryl group; each of $R_{63}$ and $R_{64}$ is independently protium, deuterium or a $C_1$-$C_{20}$ alkyl group; each of f and g is a number of substituents and is independently an integer of 0 to 4; each of $L_1$ and $L_2$ is independently a $C_6$-$C_{30}$ arylene group, wherein the $C_6$-$C_{30}$ arylene group may be unsubstituted or substituted with at least one of a $C_1$-$C_{10}$ alkyl group and a $C_6$-$C_{30}$ aryl group; and each of h and i is an integer of 0 or 1.

For example, each of $L_1$ and $L_2$ in Formula 7 may comprise independently a phenylene group unsubstituted or substituted with at least one of a $C_1$-$C_{10}$ alkyl group and a $C_6$-$C_{20}$ aryl group (e.g., phenyl group), and each of $R_{61}$ and $R_{62}$ may comprise independently a phenyl group, a naphthyl group, a fluorenyl group and a carbazolyl group each of which may be independently unsubstituted or substituted with at least one of a $C_1$-$C_{10}$ alkyl group and a $C_6$-$C_{30}$ aryl group (e.g., phenyl group). As an example, the hole injection host may be selected from, but is not limited to, the following spirofluorene-based organic compound having the structure of Formula 8:

Formula 8

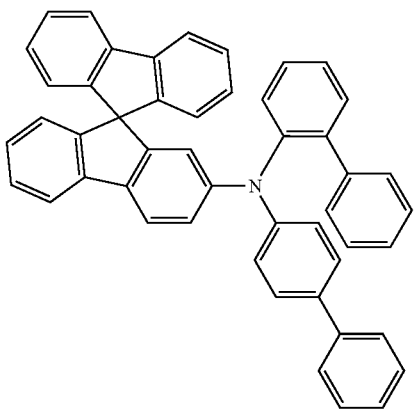

E1

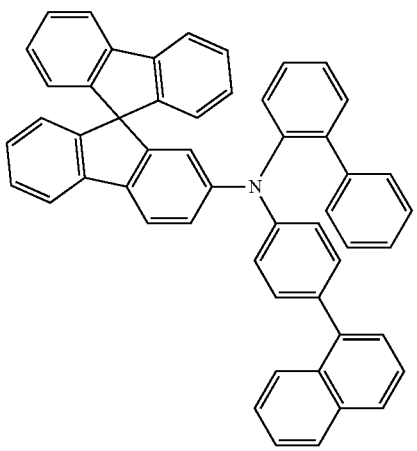

E2

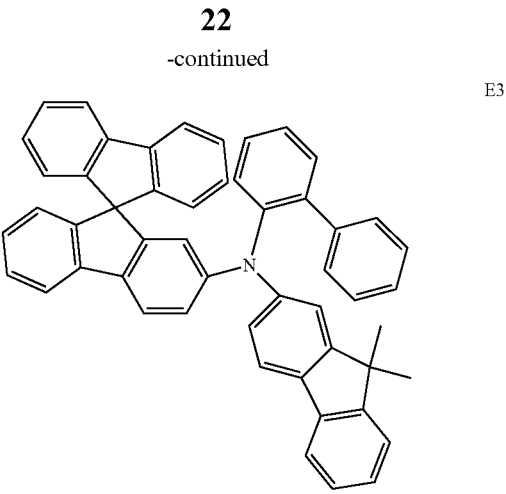

E3

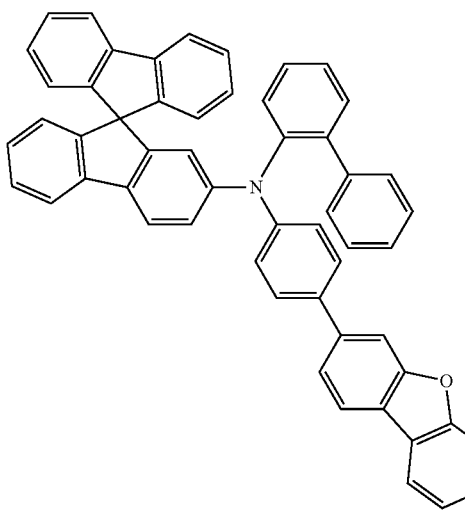

E4

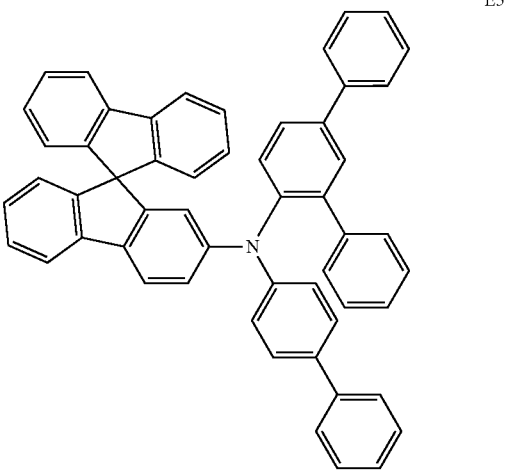

E5

E6
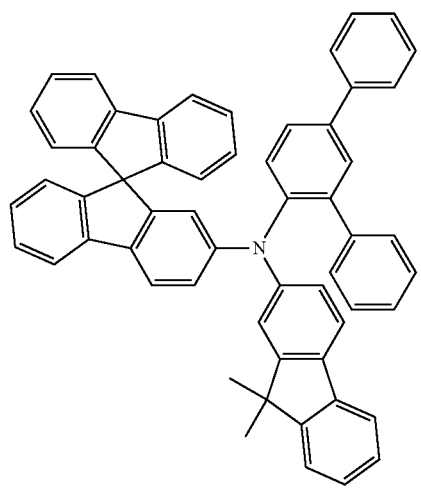
E7
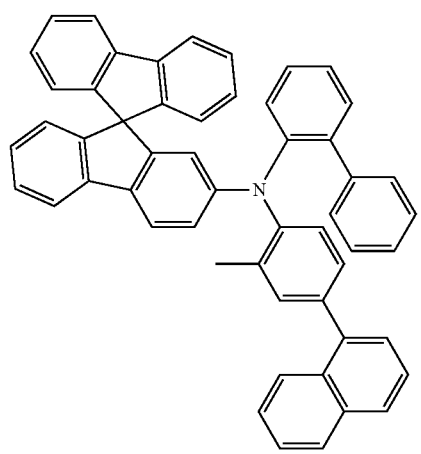
E8
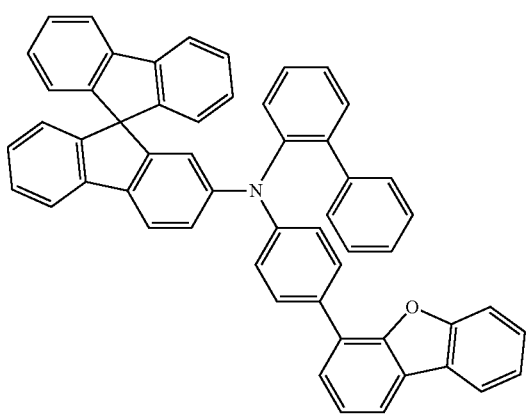
E9
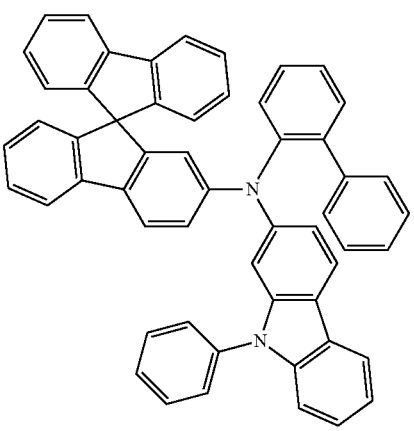
E10
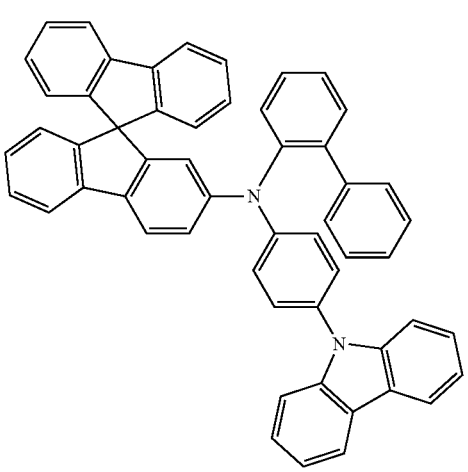
E11
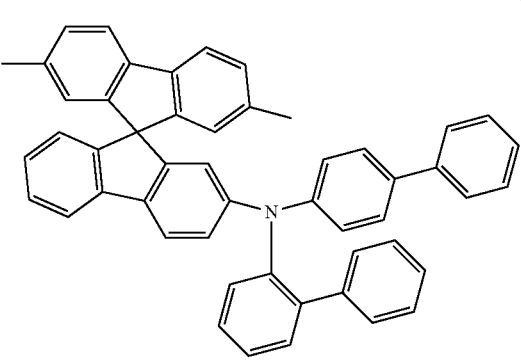

-continued
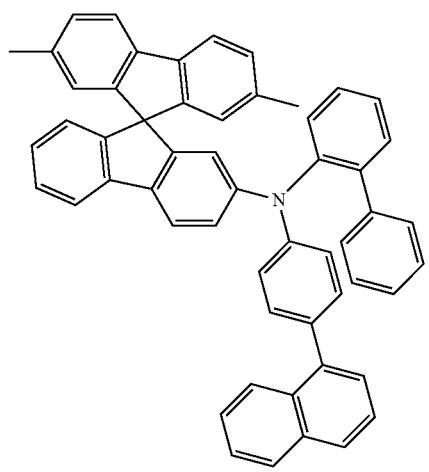
E12
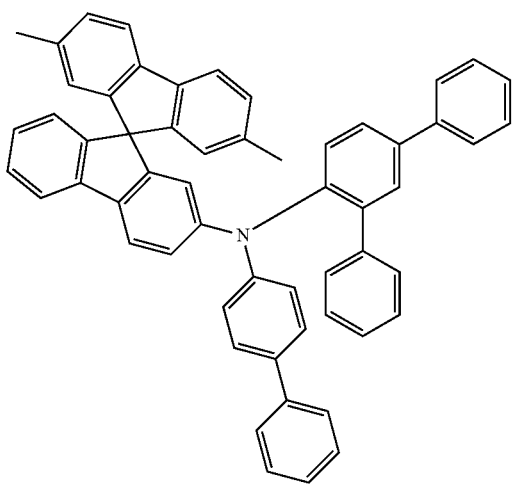
E15
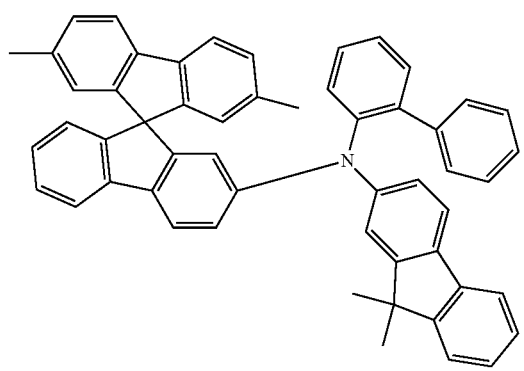
E13
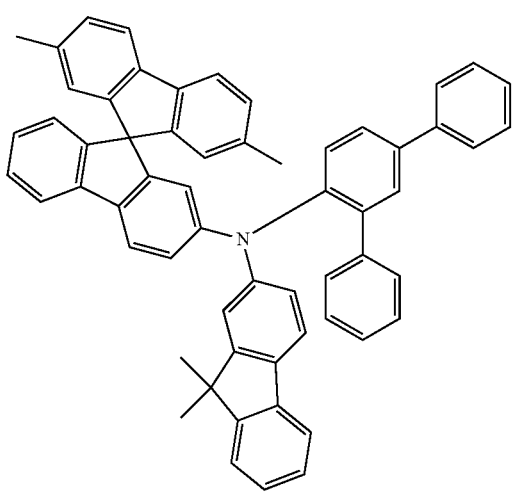
E16
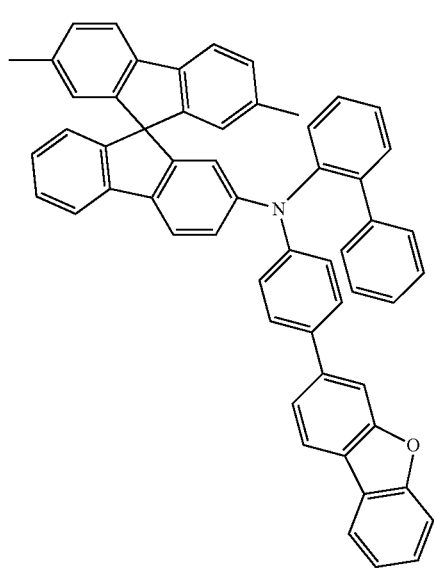
E14
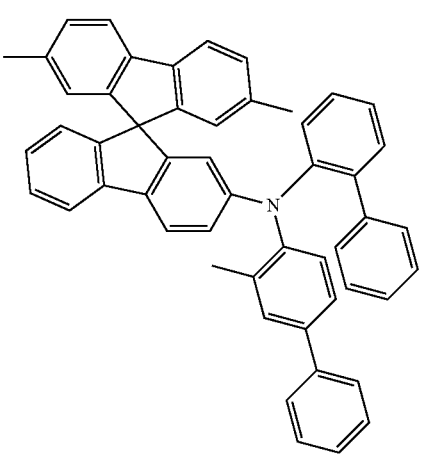
E17

E18
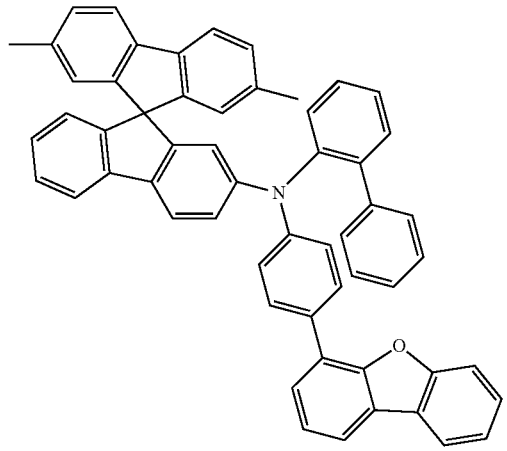
E19
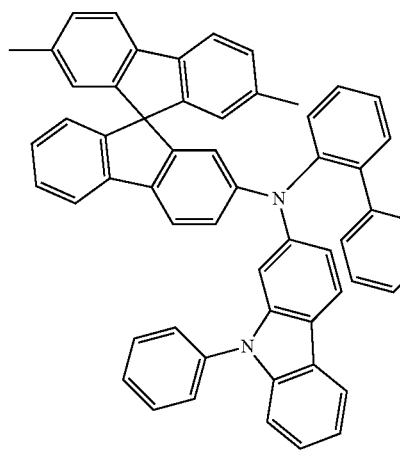
E20
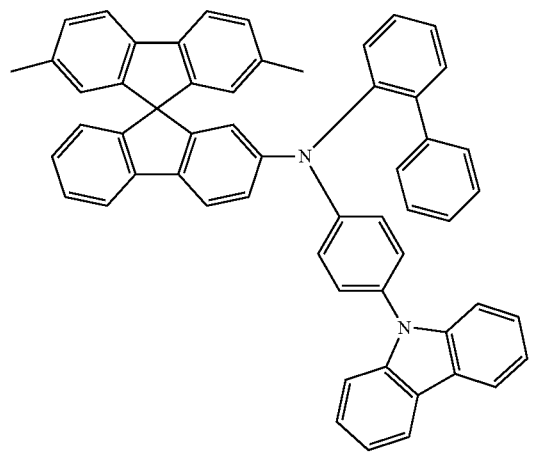
Formula 9
I1
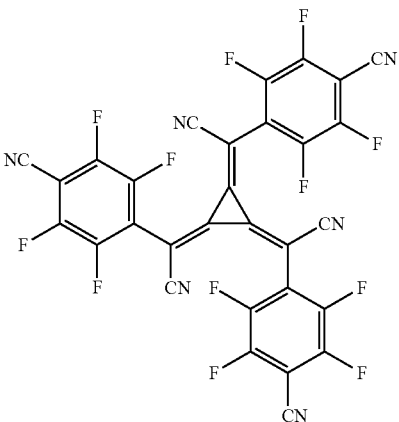
I2
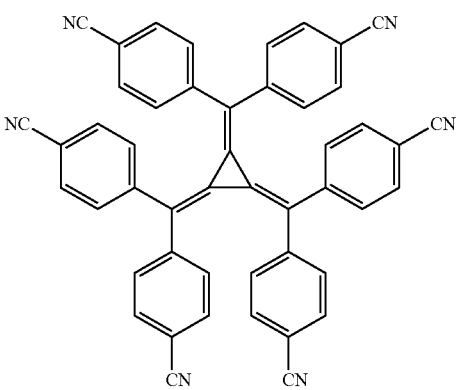
I3
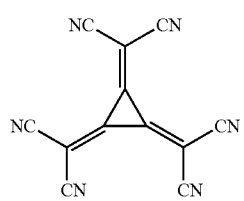
I4
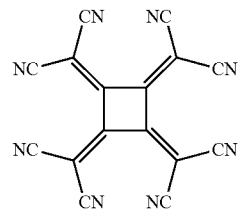
I5
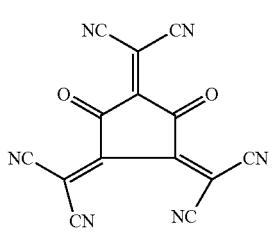
In an exemplary aspect, the hole injection dopant may have a radialene structure. The hole injection dopant having the radialene structure may be selected from, but is not limited to, the following organic compounds having the structure of Formula 9:

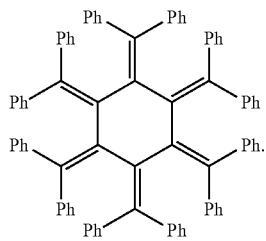

I6

The contents of the hole injection dopant in the HIL 310 may be, but is not limited to, about 0.1 wt % to about 10 wt %, for example, about 0.1 wt % to about 5 wt %.

The HIL 310 may have a thickness of, but is not limited to, about 10 Å to about 300 Å, for example, about 50 Å to about 150 Å.

Each of the HTL1 320 and the HTL2 420 transports holes to the EML1 340 and the EML2 440, respectively. In one exemplary aspect, each of the HTL1 320 and the HTL2 420 may include independently, but is not limited to, the spiro-fluorene-based organic compound having the structure of Formulae 7 and 8. Each of the HTL1 320 and the HTL2 420 may have a thickness of, but is not limited to, about 200 Å to about 1000 Å, for example, about 200 Å to about 500 Å.

The ETL1 350 transports electrons into the EML1 340. In an exemplary aspect, the ETL1 350 may include an organic compound having triplet energy level $T^1$ of equal to or more than about 2.6 eV. As an example, the ETL1 350 may include an azine-based organic compound having the following structure of Formula 10:

Formula 10

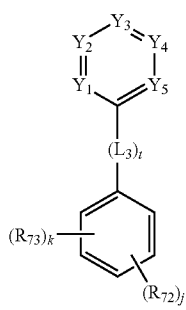

wherein each of $Y_1$, $Y_2$, $Y_3$, $Y_4$ and $Y_5$ is independently $CR_{71}$ or nitrogen (N), provided that one to three of $Y_1$, $Y_2$, $Y_3$, $Y_4$ and $Y_5$ is nitrogen; $R_{71}$ is hydrogen or a $C_6$-$C_{30}$ aryl group; $L_3$ is a $C_6$-$C_{30}$ arylene group; $R_{72}$ is a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group may be independently unsubstituted or substituted with a $C_6$-$C_{30}$ aryl group or a $C_3$-$C_{30}$ hetero aryl group; $R_{73}$ is hydrogen or adjacent two of $R_{73}$ form a $C_6$-$C_{20}$ aromatic ring when k is 2 or more; j is 1 or 2; k is an integer of 0 to 4; and l is 0 or 1.

For example, the $C_6$-$C_{30}$ aryl group or $C_3$-$C_{30}$ hetero aryl group substituted to $R_{72}$ may comprise a $C_{10}$-$C_{30}$ fused aryl group and a $C_{10}$-$C_{30}$ fused hetero aryl group. $R_{73}$ in Formula 10 may be fused to form a naphthyl group. As an example, the ETL1 350 may be selected from, but is not limited to, the following azine-based organic compounds having the structure of Formula 11:

Formula 11

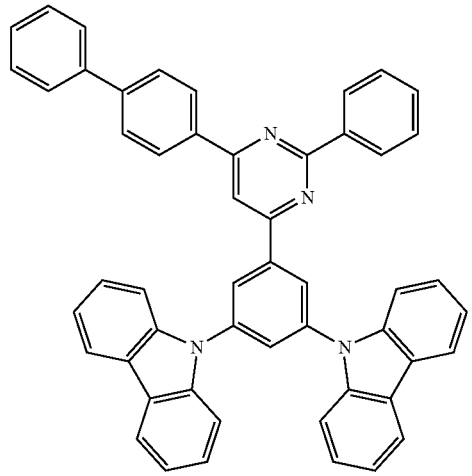

F1

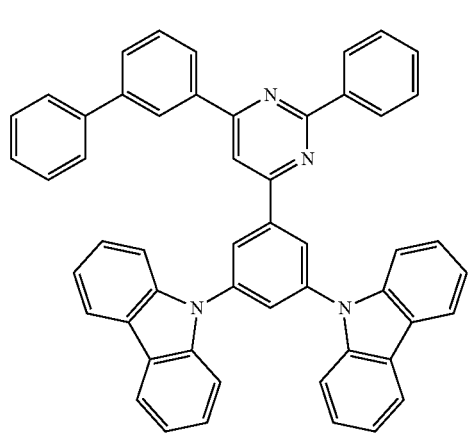

F2

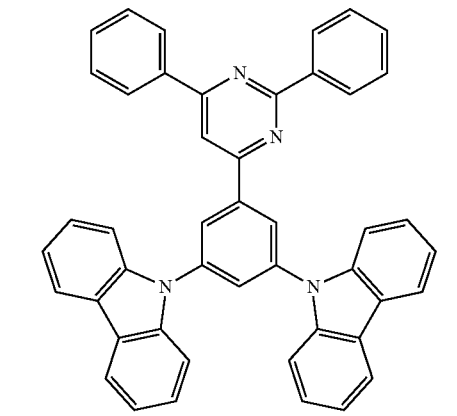

F3

F4
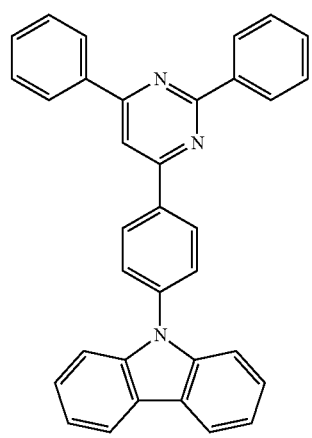
F5
F6
F7
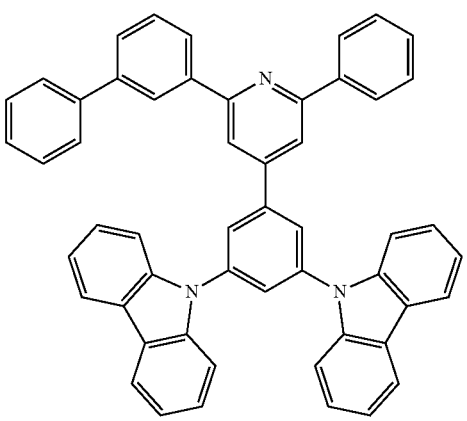
F8
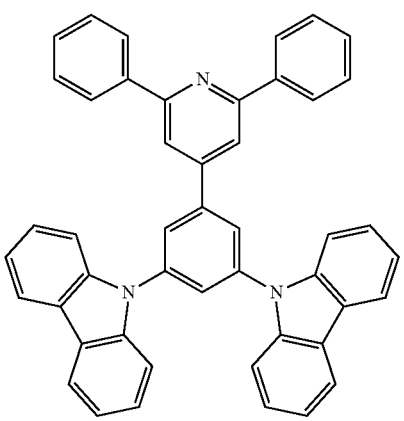
F9
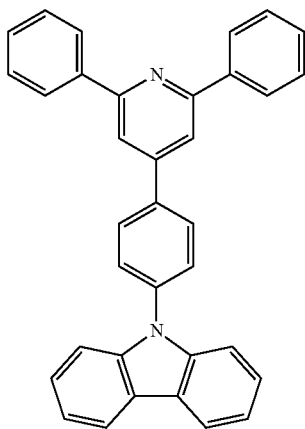

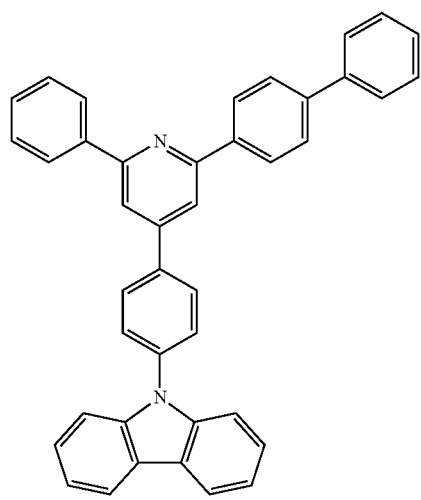
F10
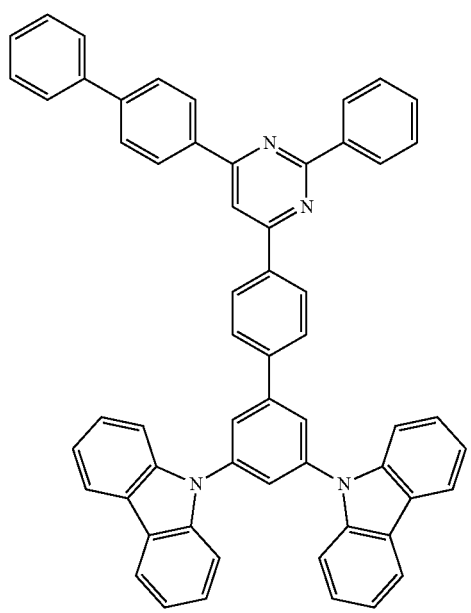
F11
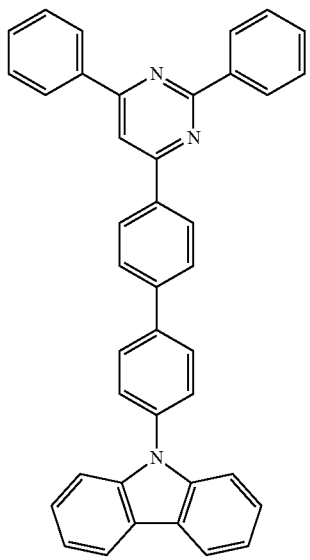
F12
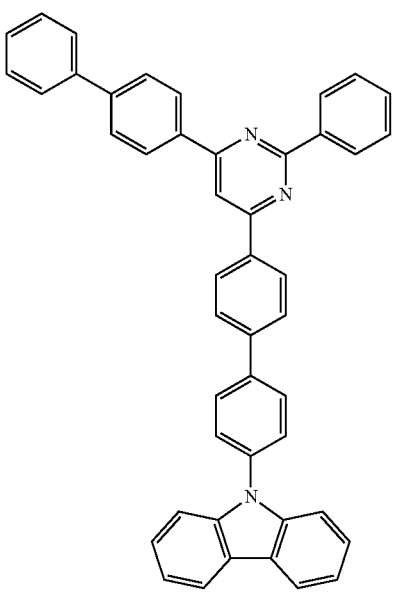
F13

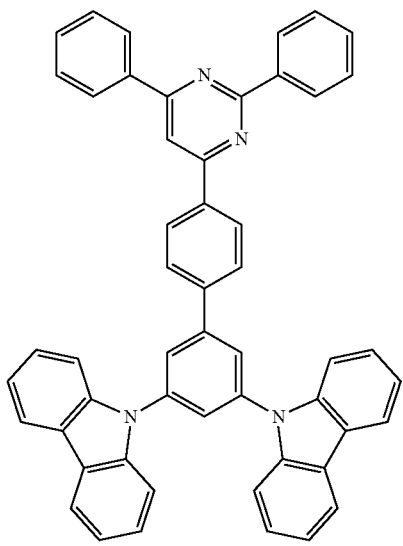

F14

The ETL2 450 transports electrons into the EML2 440. The ETL2 450 may include an organic compound having excellent electron injection property and charge mobility. As an example, the ETL2 450 may include a benzimidazole-based organic compound having the following structure of Formula 12:

Formula 12

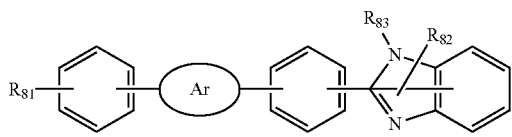

wherein Ar is a $C_{10}$-$C_{30}$ arylene group; $R_{81}$ is a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group is unsubstituted or substituted with a $C_1$-$C_{10}$ alkyl group; each of $R_{82}$ and $R_{83}$ is independently hydrogen, a $C_1$-$C_{10}$ alkyl group or a $C_6$-$C_{30}$ aryl group.

For example, Ar may comprise a naphthylene group and an anthracenylene group, $R_{81}$ may comprise a phenyl group and a benzimidazole group each of which is independently unsubstituted or substituted with a $C_1$-$C_{10}$ alkyl group and each of $R_{82}$ and $R_{83}$ may comprise independently hydrogen, methyl, ethyl and a phenyl group. As an example, the benzimidazole-based organic compound in the ETL2 450 may be selected from, but is not limited to, the following benzimidazole-based organic compounds having the structure of Formula 13:

Formula 13

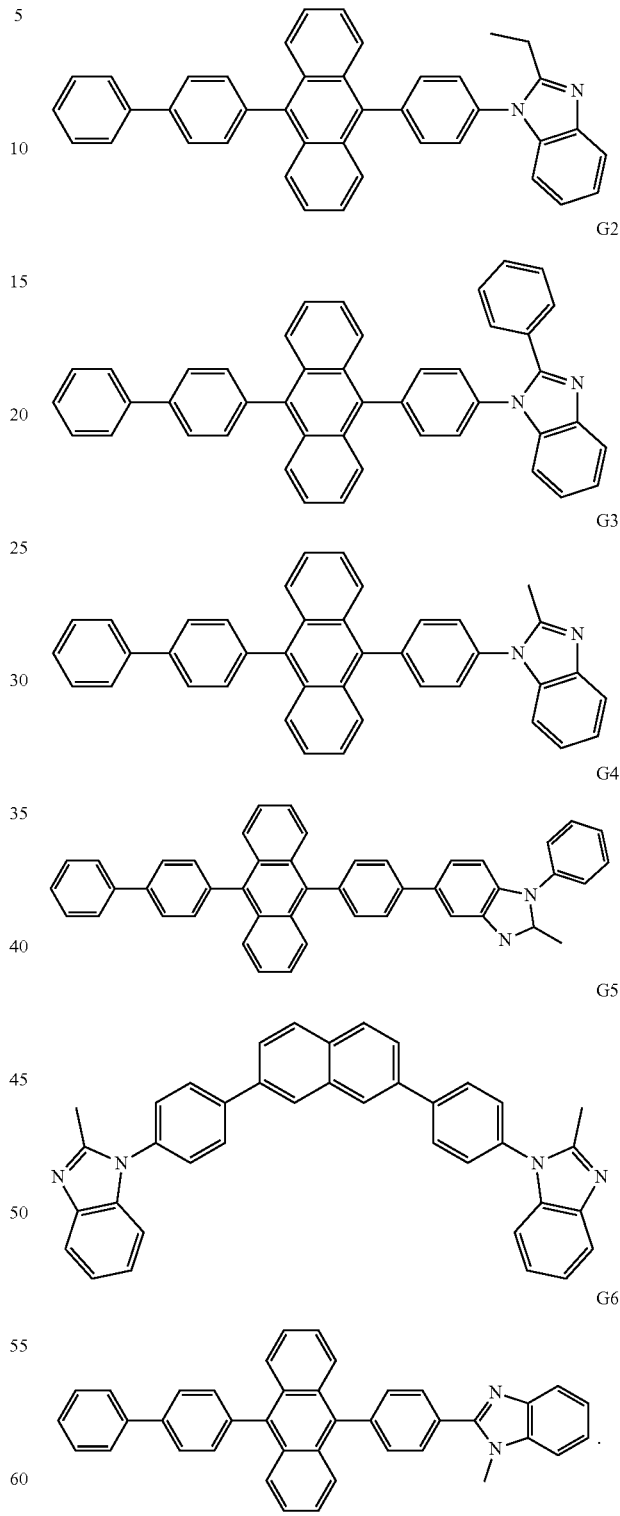

In one exemplary aspect, the ETL2 450 may include the benzimidazole-based organic compound having the structure of Formulae 12 to 13 and other electron transport material being an organometallic compound. The other electron transport material being an organometallic compound in the ETL2 450 may comprise, but is not limited to, lithium quinolate (Liq), tris(8-hydroxyquinoline aluminum (Alq$_3$) and bis(2-methyl-8-quinolinolato-N1,O8)-(1,1'-biphenyl-4-olato)aluminum (BAlq). The contents of the other electron transport material being the organometallic compound in the ETL2 450 may be, but is not limited to, equal to or less than about 50 wt %, for example, about 2 wt % to about 50 wt %. When the ETL2 450 includes the benzimidazole-based organic compound and the other electron transport material being the organometal compound, the ETL2 450 may have a thickness of, but is not limited to, about 50 Å to about 500 Å, for example, about 50 Å to about 350 Å.

In another exemplary aspect, the ETL2 450 may include the benzimidazole-based organic compound having the structure of Formulae 12 to 13, the azine-based organic compound having the structure of Formulae 10 to 11, and other electron transport material of the organometallic compound. In this case, the benzimidazole-based organic compound having the structure of Formulae 12 to 13 and the azine-based organic compound having the structure of Formulae 10 to 11 may be mixed with a weight ratio of about 1:4 to about 4:1, for example, about 1:2 to about 2:1.

The contents of the other electron transport material being the organometallic compound in the ETL2 450 may be, but is not limited to, equal to or less than about 50 wt %, for example, about 2 wt % to about 50 wt %. When the ETL2 450 includes the benzimidazole-based organic compound, the azine-based organic compound and the other electron transport material being the organometal compound, the ETL2 450 may have a thickness of, but is not limited to, about 100 Å to about 500 Å, for example, about 100 Å to about 350 Å.

The EIL 460 is disposed between the second electrode 220 and the ETL2 450, and can improve physical properties of the second electrode 220 and therefore, can enhance the lifespan of the OLED D1. In one exemplary embodiment, the EIL 460 may include, but is not limited to, an alkali metal halide or alkaline earth metal halide such as LiF, CsF, NaF, BaF$_2$ and the like, and/or an organic metal compound such as lithium benzoate, sodium stearate, and the like.

Alternatively, the EIL 460 may be doped with an alkali metal such as Li, Na, K and Cs, an alkaline earth metal such as Mg, Sr, Ba and Ra and/or a lanthanide metal such as Yb in addition to the alkali metal halide, the alkaline earth metal halide and the organic metal compound. In this case, the alkali metal halide/alkaline earth metal halide/organic metal compound and the alkali metal/alkaline earth metal/lanthanide metal in the EIL 460 may be mixed with, but is not limited to, a weight ratio of about 4:1 to about 1:4, for example, about 2:1 to about 1:2. The EIL 460 may have a thickness of, but is not limited to, about 5 Å to about 100 Å, for example, about 10 Å to about 50 Å.

The CGL 370 is disposed between the first emitting part 300 and the second emitting part 400. The CGL 370 includes an N-type CGL (N-CGL) 380 disposed between the ETL1 350 and the HTL2 420 and a P-type CGL (P-CGL) 390 disposed between the N-CGL 380 and the HTL2 420. The N-CGL 380 provides electrons with the EML1 340 of the first emitting part 300 and the P-CGL 390 provides holes with the EML2 440 of the second emitting part 400.

The N-CGL 380 may be an organic layer including an N-type host and an N-type dopant. For example, the N-type host may include a phenanthroline-based organic compound having the following structure of Formula 14:

Formula 14

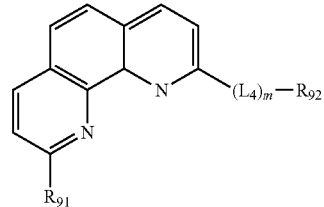

wherein $R_{91}$ is hydrogen or a $C_6$-$C_{30}$ aryl group, wherein the $C_6$-$C_{30}$ aryl group may be unsubstituted or substituted with a $C_1$-$C_{10}$ alkyl group; $R_{92}$ is a $C_6$-$C_{30}$ aryl group, wherein the $C_6$-$C_{30}$ aryl group may be unsubstituted or substituted with a $C_1$-$C_{10}$ alkyl group; each of $L_4$ is independently a $C_6$-$C_{30}$ arylene group or a $C_5$-$C_{30}$ hetero arylene group; and m is 1 or 2.

For example, $R_{91}$ in Formula 14 may comprise hydrogen and an unsubstituted or methyl-substituted phenyl group, an unsubstituted or methyl-substituted naphthyl group, $R_{92}$ may comprise a phenyl group, a naphthyl group and a phenanthrenyl group each of which is independently unsubstituted or substituted with methyl, and $L_4$ may comprise a phenylene group, a naphthylene group, an anthracenylene group and a phenanthrolinylene group. As an example, the N-type host may be selected from, but is not limited to, the following phenanthroline-based organic compounds having the structure of Formula 15:

Formula 15

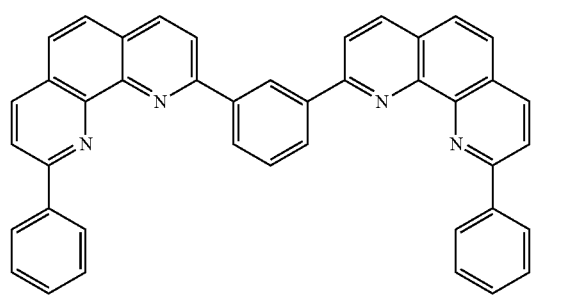

H1

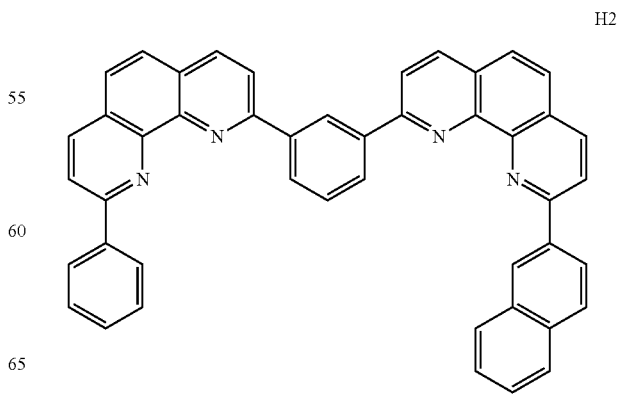

H2

H3

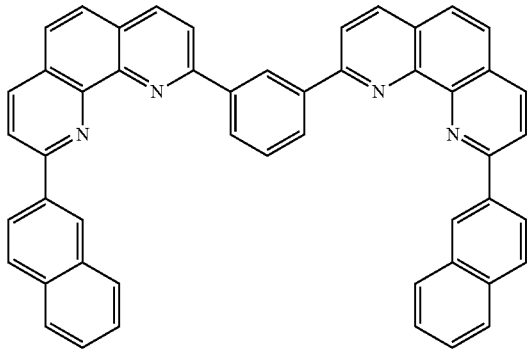

H4

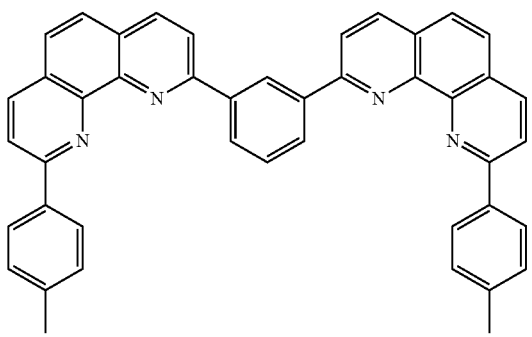

H5

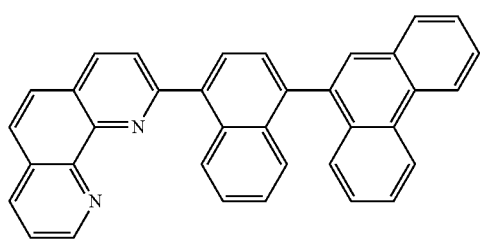

H6

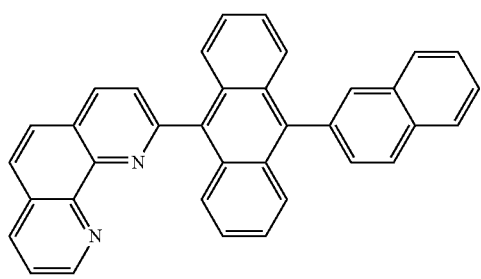

H7

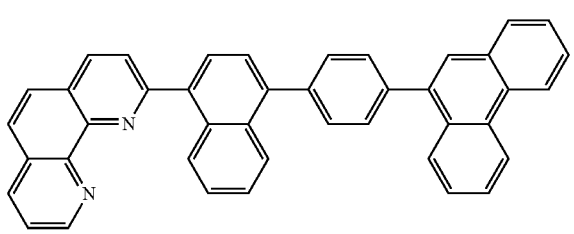

H8

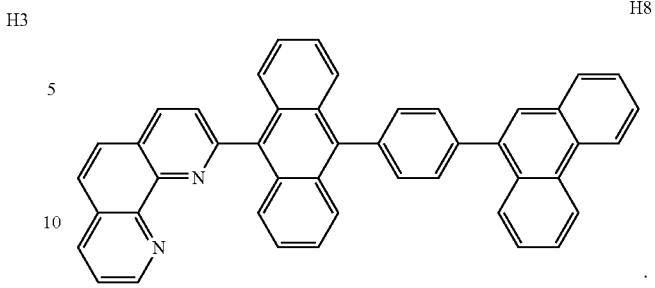

The N-type dopant may include an alkali metal such as Li, Na, K and Cs and/or an alkaline earth metal such as Mg, Sr, Ba and Ra. The N-type dopant allows the N-CGL 380 to have improved electron generations and electron injection. For example, the contents of the N-type dopant in the N-CGL 380 may be, but is not limited to, about 1 wt % to about 10 wt %. The N-CGL 380 may have a thickness of, but is not limited to, about 30 Å to about 500 Å, for example, about 50 Å to about 300 Å.

The P-CGL 390 may be an organic layer including a P-type host and a P-type dopant. For example, the P-type host may comprise the spirofluorene-based organic compound having the structure of Formulae 7 and 8, and the P-type dopant may comprise anyone selected from the radialene-based organic compound having the structure of Formula 9, but is not limited thereto. The contents of the P-type dopant in the P-CGL 390 may be, but is not limited to, about 1 wt % to about 40 wt %, for example, about 3 wt % to about 30 wt %. The P-CGL 390 may have a thickness of, but is not limited to, about 30 Å to about 500 Å, for example, about 50 Å t about 200 Å.

In accordance with this aspect, the EML1 340 includes an anthracene-based organic compound having the structure of Formulae 1 to 2 where at least the anthracene-core is fully deuterated so as to have excellent hole injection property as the first host 342, and the EML2 440 includes an anthracene-based organic compound having the structure of Formulae 3 to 4 where all the carbon atoms are not deuterated or a part of carbon atom is deuterated so as to have excellent electron injection property as the second host 442. Accordingly, the OLED D1 can lower its driving voltage and maximize its luminous efficiency and luminous lifespan.

Figure 4:
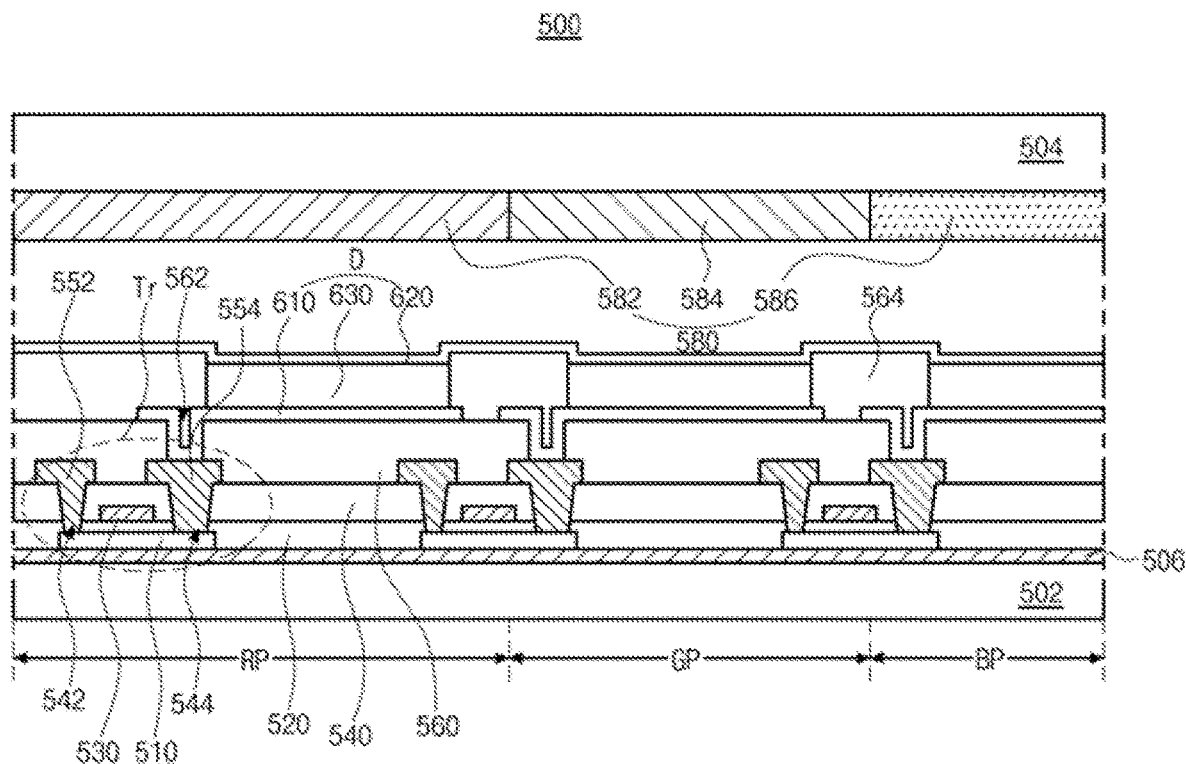
FIG. 4 is a schematic cross-sectional view illustrating an organic light emitting display device in accordance with another exemplary aspect of the present disclosure

In the above embodiment, the OLED has two emitting parts. Unlikely, an OLED can emit white light. FIG. 4 is a schematic cross-sectional view illustrating an organic light emitting display device as an organic light emitting device in accordance with another exemplary aspect of the present disclosure.

As illustrated in FIG. 4, the organic light emitting display device 500 comprises a first substrate 502 that defines each of a red pixel region RP, a green pixel region GP and a blue pixel region BP, a second substrate 504 facing the first substrate 502, a thin film transistor Tr over the first substrate 502, an organic light emitting diode D disposed between the first and second substrates 502 and 504 and emitting white (W) light and a color filter layer 580 disposed between the organic light emitting diode D and the second substrate 504.

Each of the first and second substrates 502 and 504 may include, but is not limited to, glass, flexible material and/or polymer plastics. For example, each of the first and second substrates 502 and 504 may be made of PI, PES, PEN, PET, PC or combination thereof. The first substrate 502, over which a thin film transistor Tr and an organic light emitting diode D are arranged, forms an array substrate.

A buffer layer 506 may be disposed over the first substrate 502, and the thin film transistor Tr is disposed over the buffer layer 506 correspondingly to each of the red pixel region RP, the green pixel region GP and the blue pixel region BP. The buffer layer 506 may be omitted.

A semiconductor layer 510 is disposed over the buffer layer 506. The semiconductor layer 510 may be made of oxide semiconductor material or polycrystalline silicon.

A gate insulating layer 520 including an insulating material, for example, inorganic insulating material such as silicon oxide ($SiO_x$) or silicon nitride ($SiN_x$) is disposed on the semiconductor layer 510.

A gate electrode 530 made of a conductive material such as a metal is disposed over the gate insulating layer 520 so as to correspond to a center of the semiconductor layer 510. An interlayer insulting layer 540 including an insulating material, for example, inorganic insulating material such as silicon oxide ($SiO_x$) or silicon nitride ($SiN_x$), or an organic insulating material such as benzocyclobutene or photo-acryl, is disposed on the gate electrode 530.

The interlayer insulating layer 540 has first and second semiconductor layer contact holes 542 and 544 that expose both sides of the semiconductor layer 510. The first and second semiconductor layer contact holes 542 and 544 are disposed over opposite sides of the gate electrode 530 with spacing apart from the gate electrode 530.

A source electrode 552 and a drain electrode 554, which are made of a conductive material such as a metal, are disposed on the interlayer insulating layer 540. The source electrode 552 and the drain electrode 554 are spaced apart from each other with respect to the gate electrode 530, and contact both sides of the semiconductor layer 510 through the first and second semiconductor layer contact holes 542 and 544, respectively.

The semiconductor layer 510, the gate electrode 530, the source electrode 552 and the drain electrode 554 constitute the thin film transistor Tr, which acts as a driving element.

Although not shown in FIG. 4, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 560 is disposed on the source and drain electrodes 552 and 554 with covering the thin film transistor Tr over the whole first substrate 502. The passivation layer 560 has a drain contact hole 562 that exposes the drain electrode 554 of the thin film transistor Tr.

The organic light emitting diode (OLED) D is located over the passivation layer 560. The OLED D includes a first electrode 610 that is connected to the drain electrode 554 of the thin film transistor Tr, a second electrode 620 facing from the first electrode 610 and an emissive layer 630 disposed between the first and second electrodes 610 and 620.

One of the first electrode 610 formed for each pixel region and the second electrode 620 formed integrally may be an anode and the other of the first electrode 610 and the second electrode 620 may be a cathode. One of the first and second electrodes 610 and 620 may be a transmissive (or semi-transmissive) electrode and the other of the first and second electrodes 610 and 620 may be reflective electrode.

For example, the first electrode 610 may be an anode and may include a conductive material having relatively high work function value. For example, the first electrode 610 may include, ITO, IZO, ITZO, SnO, ZnO, ICO, AZO, and the like.

The second electrode 620 is disposed over the first substrate 502 above which the emissive layer 630 is disposed. The second electrode 620 may be disposed over a whole display area. The second electrode 620 may be a cathode and may include a conductive material with a relatively low work function value, for example, a low-resistant metal. As an example, the second electrode 620 may include, but is not limited to, Al, Mg, Ca, Ag, alloy thereof or combination thereof such as Al—Mg or Ag:Mg.

When the organic light emitting display device 500 is a bottom-emission type, the first electrode may have a single-layered structure of transparent conductive oxide. Alternatively, when the organic light emitting display device 500 is a bottom-emission type, a reflective electrode or a reflective layer may be disposed under the first electrode. For example, the reflective electrode or the reflective layer may include, but is not limited to, Ag or APC alloy. In the OLED of a top-emission type, the first electrode 610 may have a triple-layered structure of ITO/Ag/ITO or ITO/APC/ITO. The second electrode 620 is thin so as to have light-transmissive (or semi-transmissive) property.

A bank layer 564 is disposed on the passivation layer 560 in order to cover edges of the first electrode 610. The bank layer 564 exposes a center of the first electrode 610 correspondingly to each of the red pixel region RP, the green pixel region GP and the blue pixel region BP. The bank layer 564 may be omitted.

An emissive layer 630 including multiple emitting parts is disposed on the first electrode 610. Each emitting part may include an emitting material layer, respectively. Each emitting part may further include at least one of an HIL, an HTL, an EBL, an ETL and an EIL.

The color filter layer 580 is disposed over the OLED D and includes a red color filter 582, a green color filter 584 and a blue color filter 586 each of which is disposed correspondingly to the red pixel region RP, the green pixel region GP and the blue pixel region BP, respectively. Although not shown in FIG. 4, the color filter layer 580 may be attached to the OLED D through an adhesive layer. Alternatively, the color filter layer 580 may be disposed directly on the OLED D.

In addition, an encapsulation film may be disposed over the second electrode 620 in order to prevent outer moisture from penetrating into the OLED D. The encapsulation film may have, but is not limited to, a laminated structure of a first inorganic insulating film, an organic insulating film and a second inorganic insulating film (170 in FIG. 2).

The organic light emitting display device 500 may further comprise a polarizing plate in order to reduce reflection of external light. As an example, the polarizing plate may be a circular polarizing plate. When the organic light emitting display device is a bottom-emission type, the polarizing plate may be disposed under the first substrate 502. Alternatively, when the organic light emitting display device 500 is a top-emission type, the polarizing plate may be attached onto the encapsulation film, for example, on the second substrate 504.

In FIG. 4, the light emitted from the OLED D is transmitted through the second electrode 620 and the color filter layer 580 is disposed over the OLED D. Alternatively, the light emitted from the OLED D is transmitted through the first electrode 610 and the color filter layer 580 may be disposed between the OLED D and the first substrate 502. In addition, a color conversion layer may be formed between the OLED D and the color filter layer 580. The color conversion layer may include a red color conversion layer, a green color conversion layer and a blue color conversion layer each of which is disposed correspondingly to each pixel region (RP, GP and BP), respectively, so as to covert the white (W) color light to each of a red, green and blue color lights, respectively.

As described above, the white (W) color light emitted from the OLED D is transmitted through the red color filter 582, the green color filter 584 and the blue color filter 586 each of which is disposed correspondingly to the red pixel region RP, the green pixel region GP and the blue pixel region BP, respectively, so that red, green and blue color lights are displayed in the red pixel region RP, the green pixel region GP and the blue pixel region BP.

Figure 5:
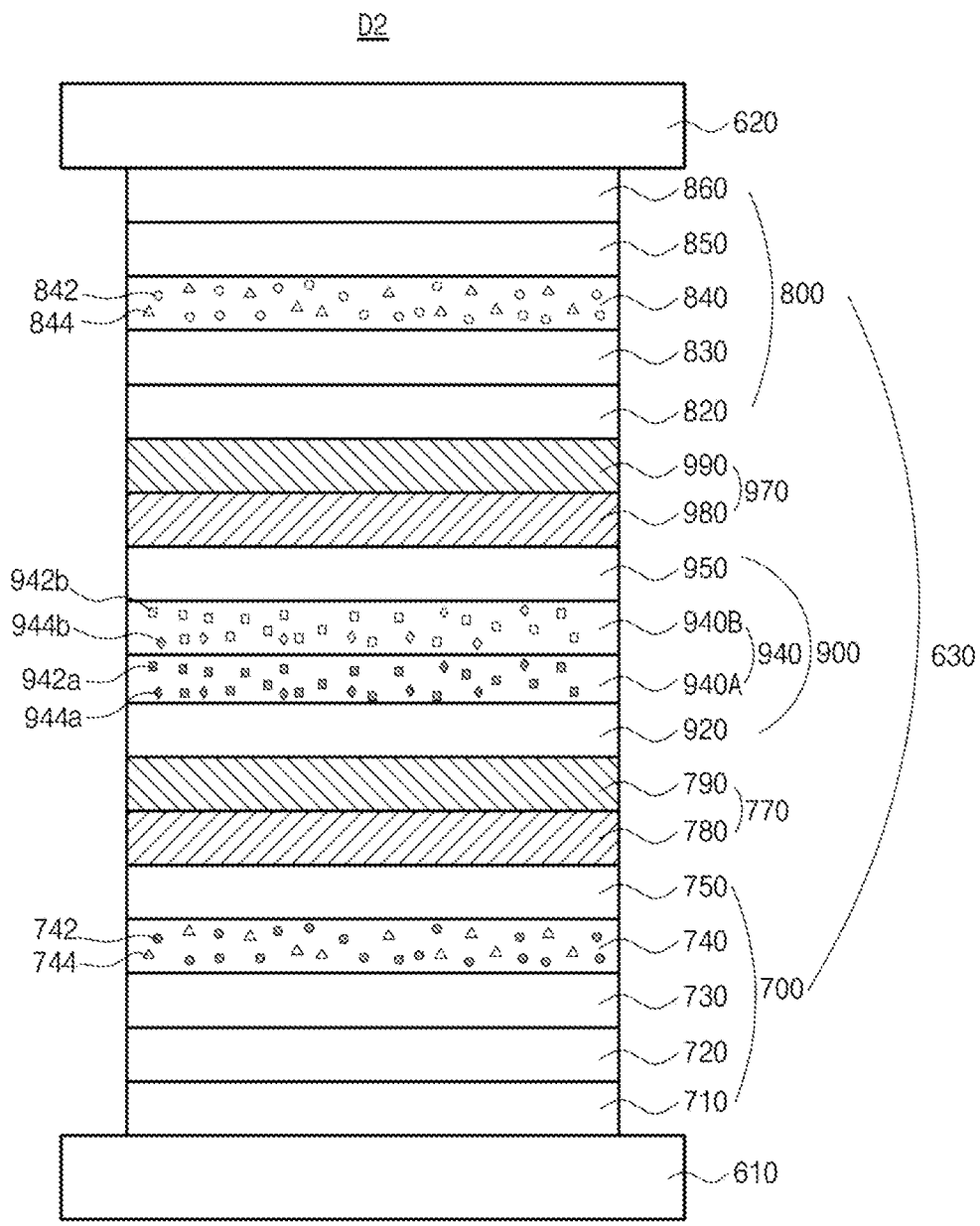
FIG. 5 is a cross-sectional view illustrating an organic light emitting diode having three emitting parts in accordance with another exemplary aspect of the present disclosure.

FIG. 5 is a schematic cross-sectional view illustrating an organic light emitting diode having three emitting parts in accordance with another exemplary aspect of the present disclosure. As illustrated in FIG. 5, the organic light emitting diode (OLED) D2 includes first and second electrodes 610 and 620 and an emissive layer 630 disposed between the first and second electrodes 610 and 620.

One of the first and second electrodes 610 and 620 may be an anode and the other of the first and second electrodes 610 and 620 may be a cathode. As an example, the first electrode 610 may be an anode injecting holes and the second electrode 620 may be a cathode injecting electrons. One of the first and second electrodes 610 and 620 may be a reflective electrode and the other of the first and second electrodes 610 and 620 may be a transmissive (or semi-transmissive) electrode. As an example, each of the first and second electrodes 610 and 620 may have a thickness of, but is not limited to, about 100 Å to about 2000 Å, for example, about 100 Å to about 1000 Å.

The emissive layer 630 includes a first emitting part 700, a second emitting part 800 and a third emitting part 900. The emissive layer 630 further includes a first charge generation layer (CGL1) 770 disposed between the first emitting part 700 and the third emitting part 900 and a second charge generation layer (CGL2) 970 disposed between the second emitting part 800 and the third emitting part 900. As the CGL1 770 is disposed between the first and third emitting parts 700 and 900, and the CGL2 970 is disposed between the second and third emitting parts 800 and 900, the first emitting part 700, the CGL1 770, the third emitting part 900, the CGL2 970 and the second emitting part 800 are disposed sequentially over the first electrode 610. In other words, the first emitting part 700 is disposed between the first electrode 610 and the CGL1 770, the second emitting part 800 is disposed between the second electrode 620 and the CGL2 970, and the third emitting part 900 is disposed between the CGL1 770 and the CGL2 970.

The first emitting part 700 includes a first emitting material layer (lower EML, EML1) 740. The first emitting part 700 may further comprise at least one of an HIL 710 disposed between the first electrode 610 and the EML1 740, a HTL1 (lower HTL) 720 disposed between the HIL 710 and the EML1 740 and an ETL1 (lower ETL) 750 disposed between the EML1 740 and the CGL1 770. Alternatively, the first emitting part 700 may further comprise an EBL1 (lower EBL) 730 disposed between the HTL1 720 and the EML1 740.

The second emitting part 800 includes a second emitting material layer (upper EML, EML2) 840. The second emitting part 800 may further comprise at least one of a HTL2 (upper HTL) 820 disposed between the CGL2 970 and the EML2 840, an ETL2 (upper ETL) 850 disposed between the second electrode 620 and the EML2 840 and an EIL 860 disposed between the second electrode 620 and the ETL2 850. Alternatively, the second emitting part 800 may further comprise an EBL2 (upper EBL) 830 disposed between the HTL2 820 and the EML2 840.

The third emitting part 900 includes a third emitting material layer (middle EML, EML3) 940. The third emitting part 900 may further include at least one of a third hole transport layer (middle HTL, HTL3) 920 disposed between the CGL1 770 and the EML3 940 and a third electron transport layer (middle ETL, ETL3) 950 disposed between the EML3 940 and the CGL2 970.

The EML1 740 includes a first host 742 of an anthracene-based organic compound and a first dopant 744 of a boron-based organic compound, so that the EML1 740 emits blue light. The EML2 840 includes a second host 842 of an anthracene-based organic compound and a second dopant 844 of a boron-based organic compound, so that the EML2 840 emits blue light.

As an example, the first host 742 may be an anthracene-based organic compound where at least the carbon atoms in the anthracene core are deuterated and may have the structure of Formulae 1 and 2. The second host 842 may be an anthracene-based organic compound where none of the carbon atoms of the aromatic rings in the molecules is deuterated or a part of the carbon atoms is deuterated, and may have the structure of Formulae 3 and 4.

Each of the first and second dopants 744 and 844 includes a boron-based organic compound, so that both the EML1 740 and the EML2 840 emit blue light. The first dopant 744 may be identical to or different from the second dopant 844. Each of the first and second dopants 744 and 844 may have independently the structure of Formulae 5 and 6.

The contents of the first dopant 744 and the second dopant 844 in each of the EML1 740 and the EML2 840 may be, but is not limited to, about 1 wt % to about 10 wt %, for example, about 1 wt % to about 5 wt %. As an example, each of the EML1 740 and the EML2 840 may have a thickness of, but is not limited to, about 100 Å to about 1000 Å, for example, about 200 Å to about 500 Å.

The HIL 710 is disposed between the first electrode 610 and the HTL1 720 and improves an interface property between the inorganic first electrode 610 and the organic HTL1 720. The HIL 710 may include a hole injection host and a hole injection dopant.

In one exemplary aspect, the hole injection host may include, but is not limited to, an anthracene-based organic compound having the following structure of Formula 16:

Formula 16

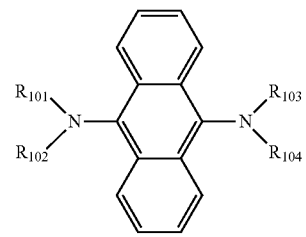

wherein each of $R_{101}$, $R_{102}$, $R_{103}$ and $R_{104}$ is independently a $C_6$-$C_{30}$ aryl group, wherein the $C_6$-$C_{30}$ aryl group may be unsubstituted or substituted with a $C_1$-$C_{10}$ alkyl group.

For example, each of $R_{101}$, $R_{102}$, $R_{103}$ and $R_{104}$ in Formula 16 may comprise independently a phenyl group, a naphthyl group (e.g., 1-naphthyl group and 2-naphthyl group) and a phenanthrenyl group each of which is unsubstituted or substituted with a $C_1$-$C_{10}$ alkyl group. As an example, the hole injection host may be selected from, but is not limited to, the following anthracene-based compounds having the structure of Formula 17:

Formula 17

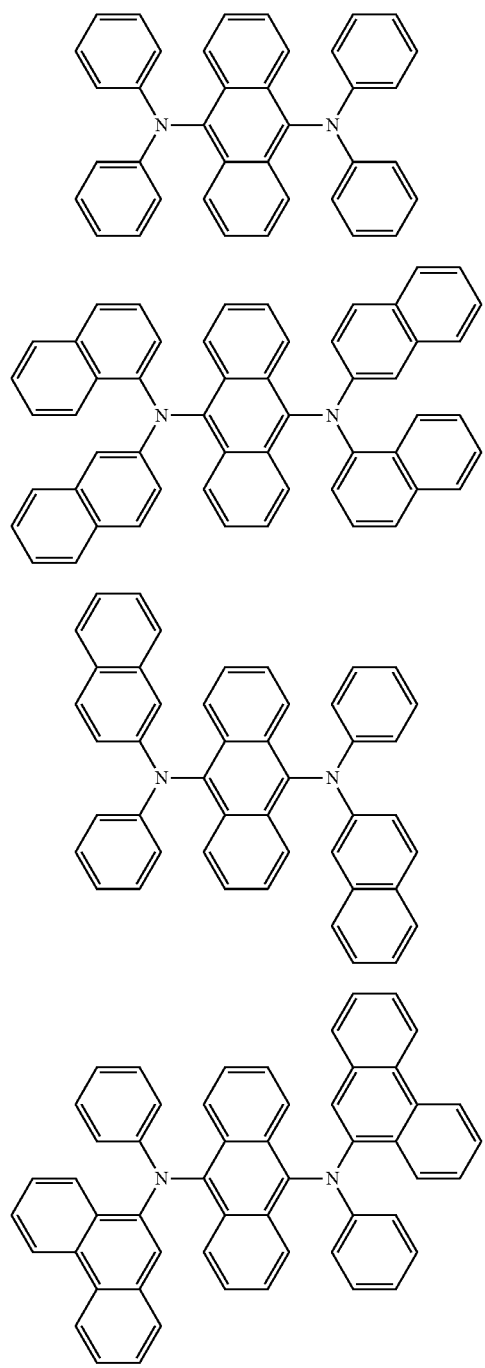

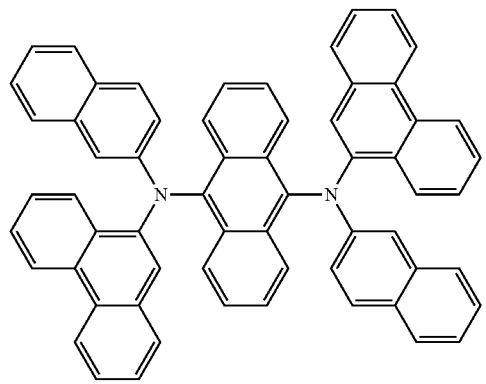

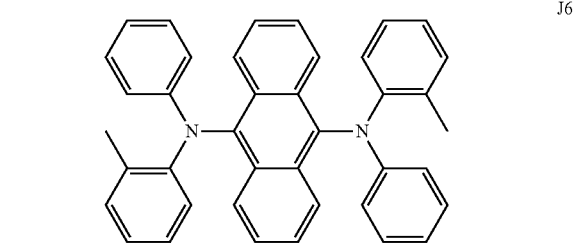

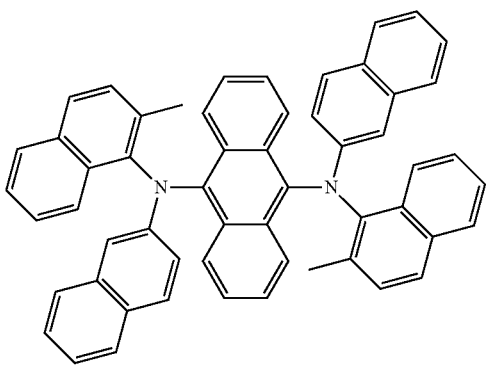

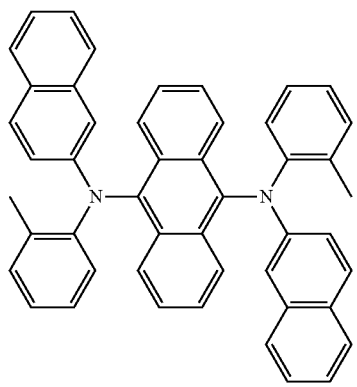

-continued

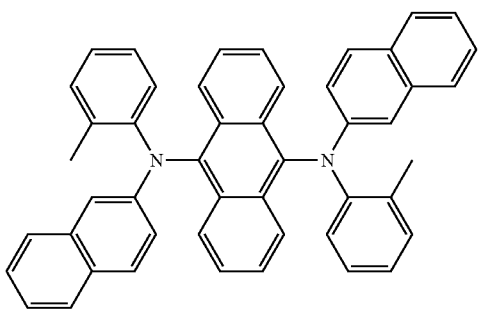
J9

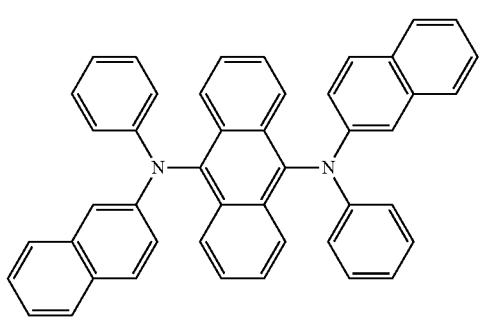
J10

The hole injection dopant may comprise, but is not limited to, an alkali metal halide such as LiF, NaF and CsF and/or an alkaline earth metal halide such as $BaF_2$ and $MgF_2$.

The hole injection host having the structure of Formulae 16 and 17 and the hole injection dopant of the alkali metal halide and/or the alkaline earth metal halide in the HIL 710 may be mixed with a weight ratio of, but is not limited to, about 9:1 to about 5:5, for example, about 8:2 to about 5:5. As an example, the HIL 710 may have a thickness of, but is not limited to, about 5 Å to about 200 Å, for example, about 10 Å to about 100 Å.

Each of the HTL1 720, the HTL2 820 and the HTL3 920 transports holes into the EML1 740, the EML2 840 and the EML3 940, respectively. In one exemplary aspect, each of the HTL1 720, the HTL2 820 and the HTL3 920 may include independently, but is not limited to, the spirofluorene-based organic compound having the structure of Formulae 7 and 8. The HTL1 720 may have a thickness of about 300 Å to about 2000 Å, for example, about 500 Å to about 1000 Å, the HTL2 820 may have a thickness of about 300 Å to about 2000 Å, for example, about 500 Å to about 900 Å and the HTL3 920 may have a thickness of about 10 Å to about 300 Å, for example, about 10 Å to about 150 Å, but is not limited thereto.

The ETL1 750 transports electrons into the EML1 740. In one exemplary aspect, the ETL1 750 may include an organic compound having the triplet energy level of equal to or more than about 2.6 eV. As an example, the ETL1 750 may include the azine-based organic compound having the structure of Formulae 10 and 11. The ETL1 750 may have a thickness of, but is not limited to, about 30 Å to about 300 Å, for example, about 50 Å to about 150 Å.

The ETL2 850 transports electrons into the EML2 840 and may include an organic compound having excellent electron injection property. As an example, the ETL2 850 may include the benzimidazole-based organic compound having the structure of Formulae 12 to 13.

In one exemplary aspect, the ETL2 850 may consist of the benzimidazole-based organic compound. Since the benzimidazole-based organic compound having the structure of Formulae 12 to 13 has excellent electron injection property and charge mobility, the ETL2 850 including the benzimidazole-based organic compound and disposed adjacently to the second electrode 620 providing electrons can maximize its electron injection property and charge mobility.

In another exemplary aspect, the ETL2 850 may include the benzimidazole-based organic compound having the structure of Formulae 12 to 13 and the azine-based organic compound having the structure of Formulae 10 to 11. In this case, the benzimidazole-based organic compound and the azine-based organic compound in the ETL2 850 may be mixed with a weight ratio of, but is not limited to, about 1:4 to about 4:1, for example, about 1:2 to about 2:1. The ETL2 850 may have a thickness of, but is not limited to, about 30 Å to about 500 Å, for example, about 50 Å to about 350 Å.

The ETL3 950 transports electrons into the EML3 840. In an exemplary aspect, the ETL3 950 may include the benzimidazole-based organic compound having the structure of Formulae 12 to 13. The ETL3 950 may have a thickness of, but is not limited to, about 30 Å to about 500 Å, for example, about 50 Å to about 350 Å.

The EIL 860 is disposed between the second electrode 620 and the ETL2 850, and can improve physical properties of the second electrode 620, and therefore, can enhance the lifespan of the OLED D2. In one exemplary embodiment, the EIL 860 may include, but is not limited to, an alkali metal halide or alkaline earth metal halide such as LiF, CsF, NaF, $BaF_2$ and the like, and/or an organic metal compound such as lithium benzoate, sodium stearate, and the like.

Alternatively, the EIL 860 may be doped with an alkali metal such as Li, Na, K and Cs, an alkaline earth metal such as Mg, Sr, Ba and Ra and/or a lanthanide metal such as Yb in addition to the alkali metal halide, the alkaline earth metal halide and the organic metal compound. The EIL 860 may have a thickness of, but is not limited to, about 5 Å to about 100 Å, for example, about 10 Å to about 50 Å.

The EBL1 730 prevents electrons from transporting to the first electrode 610 via the EML1 740, and the EBL2 830 prevents electrons from transporting to the CGL2 970 via the EML2 840. In one exemplary aspect, each of the EBL1 730 and the EBL2 830 may include independently, but is not limited to, an spirofluorene-based organic compound having the following structure of Formula 18:

Formula 18

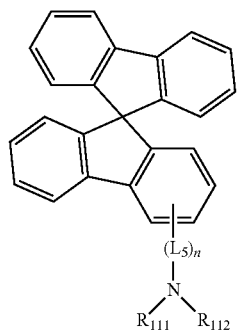

wherein $L_5$ is a $C_6$-$C_{30}$ arylene group; n is 0 or 1; each of $R_{11}$ and $R_{112}$ is independently a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group may be unsubstituted or substituted with at least one of a $C_1$-$C_{10}$ alkyl group and a $C_6$-$C_{20}$ aryl group.

For example, $L_5$ in Formula 18 comprise a phenylene group and each of $R_{111}$ and $R_{112}$ in Formula 18 may comprise independently a phenyl group, a biphenyl group, a fluorenyl group, a carbazolyl group, a phenyl-carbazolyl group, a carbazolyl-phenyl group, a dibenzofuranyl group and a dibenzothiophenyl group each of which is independently unsubstituted or substituted with at least one of a $C_1$-$C_{10}$ alkyl group and a $C_6$-$C_{20}$ aryl group (e.g., phenyl group).

As an example, each of the EBL1 730 and the EBL2 830 may be independently selected from, but is not limited to, the following spirofluorene-based organic compounds having the structure of Formula 19:

Formula 19

K1
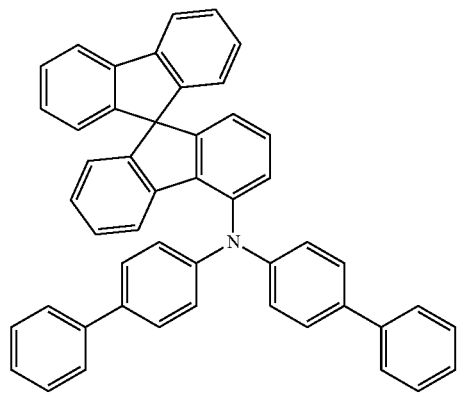

K2
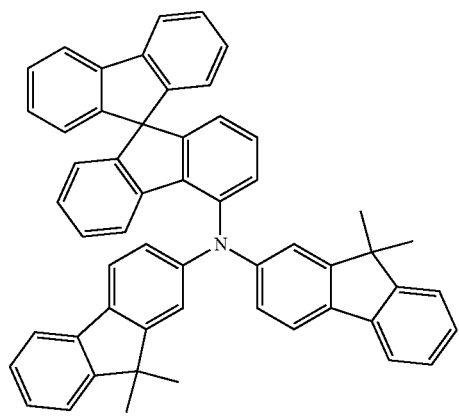

K3
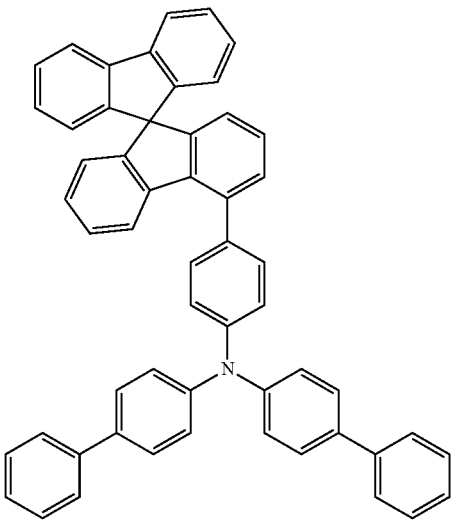

K4
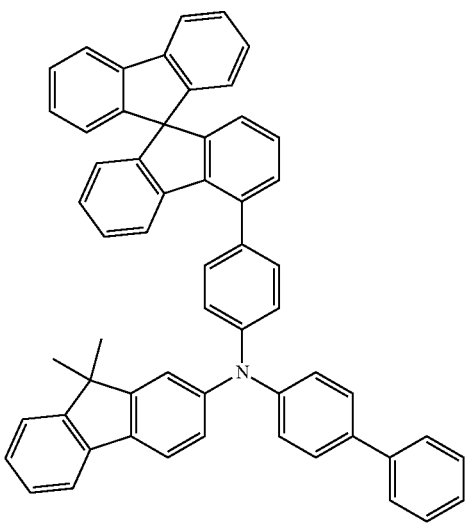

K5
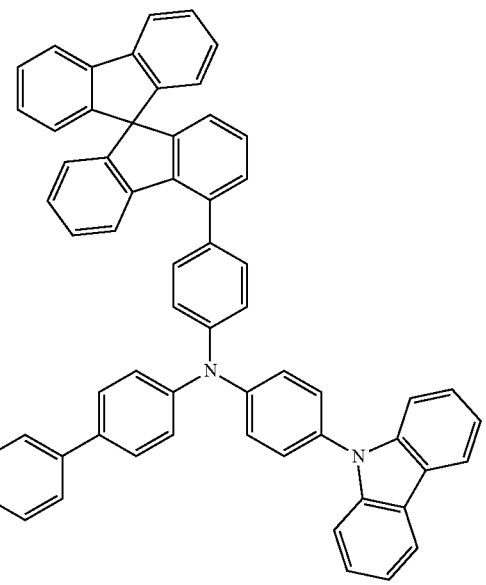

-continued

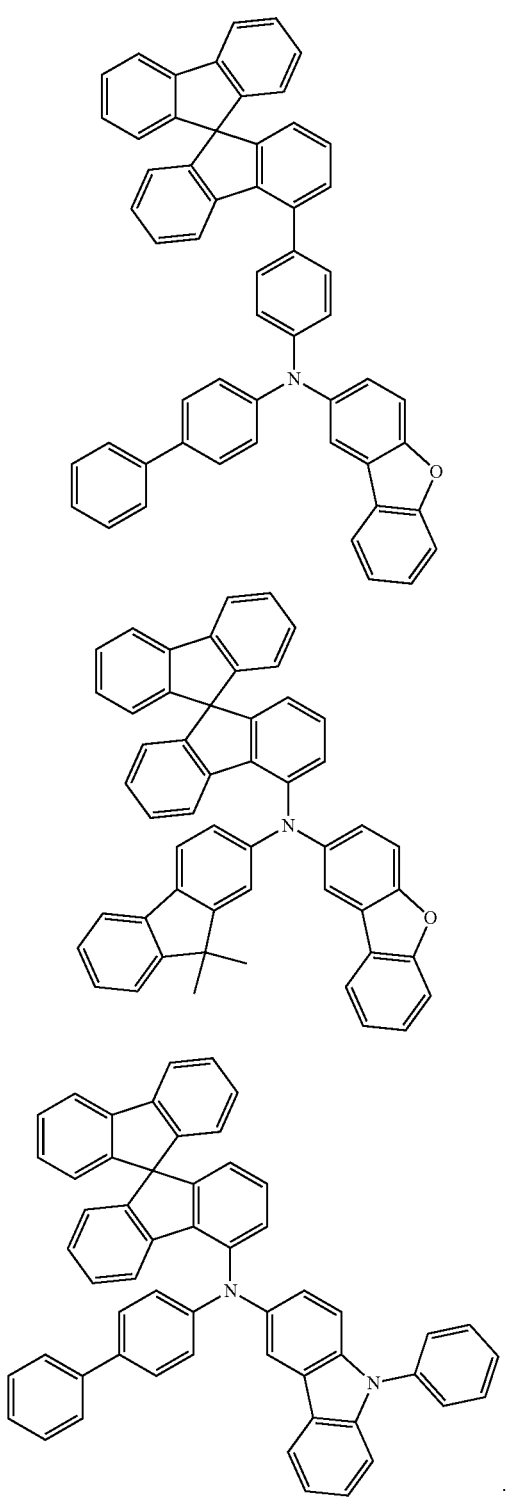

Each of the EBL1 730 and the EBL2 830 may have independently a thickness of, but is not limited to, about 30 Å to about 500 Å, for example, about 50 Å to about 250 Å.

The CGL1 770 is disposed between the first emitting part 700 and the second emitting part 800, particularly the third emitting part 900. The CGL1 770 includes a first N-type CGL (N-CGL1) 780 disposed between the ETL1 750 and the HTL3 920 and a first P-type CGL (P-CGL1) 790 disposed between the N-CGL1 780 and the HTL3 920. The N-CGL1 780 provides electrons with the EML1 740 of the first emitting part 700 and the P-CGL1 790 provides holes with the EML3 940 of the third emitting part 900.

The CGL2 970 is disposed between the second emitting part 800 and the third emitting part 900. The CGL2 970 includes a second N-CGL (N-CGL2) 980 disposed between the ETL3 950 and the HTL2 820 and a second P-type CGL (P-CGL2) 990 disposed between the N-CGL2 980 and the HTL2 820. The N-CGL2 980 provides electrons with the EML3 940 of the third emitting part and the P-CGL2 990 provides holes with the EML2 840 of the second emitting part.

Each of the N-CGL1 780 and the N-CGL2 980 may be an organic layer including an N-type host and an N-type dopant, respectively. In one exemplary aspect, the N-type host may include the phenanthroline-based organic compound having the structure of Formulae 14 to 15. The N-type dopant may include an alkali metal such as Li, Na, K and Cs and/or an alkaline earth metal such as Mg, Sr, Ba and Ra. For example, the contents of the N-type dopant in each of the N-CGL1 780 and the N-CGL2 980 may be, but is not limited to, about 1 wt % to about 10 wt %. The N-CGL1 780 may have a thickness of, but is not limited to, about 30 Å to about 500 Å, for example, about 50 Å to about 250 Å, and the N-CGL2 980 may have a thickness of, but is not limited to, about 30 Å to about 600 Å, for example, about 50 Å to about 400 Å.

Each of the P-CGL1 790 and the P-CGL2 999 may be an organic layer including a P-type host and a P-type dopant, respectively. In one exemplary aspect, the P-type host may include the spirofluorene-based organic compound having the structure of Formulae 7 and 8, and the P-type dopant may include anyone selected from the radialene-based organic compound having the structure of Formula 9, but is not limited thereto. The contents of the P-type dopant in each of the P-CGL1 790 and the P-CGL2 990 may be, but is not limited to, about 1 wt % to about 40 wt %, for example, about 3 wt % to about 30 wt %. Each of the P-CGL1 790 and the P-CGL2 990 may have independently a thickness of, but is not limited to, about 30 Å to about 500 Å, for example, about 50 Å t about 200 Å.

The EML3 940 includes a lower middle EML (first layer) 940A and an upper middle EML (second layer) 940B. The lower middle EML 940A is disposed adjacently to the first electrode 610 and the upper middle EML 940B is disposed adjacently to the second electrode 620. One of the lower middle EML 940A and the upper middle EML 940B may be a green emitting material layer and the other of the lower middle EML 940A and the upper middle EML 940B may be a red emitting material layer. The green emitting material layer and the red emitting material layers are disposed sequentially so as to form the EML3 940.

For example, the lower middle EML 940A may be a red emitting material layer. In this case, the lower middle EML 940A may include red host (third host) 942a and red dopant (third dopant) 944a. In an exemplary aspect, the red host 942a may include a P-type red host (hole-type red host) and an N-type red host (electron-type red host).

As an example, the P-type red host may include, but is not limited to, the spirofluorene-based organic compound having the structure of Formulae 7 to 8. The N-type red host may include, but is not limited to, a quinazoline-carbazole-based organic compound having the following structure of Formula 20:

Formula 20

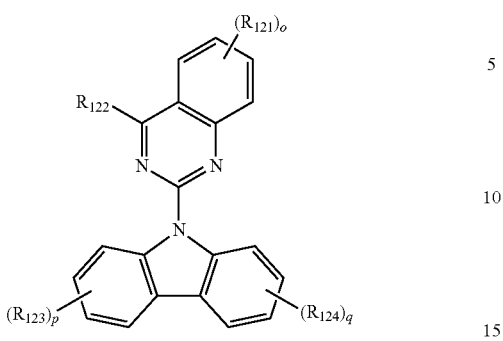

wherein $R_{121}$ is protium, deuterium, a $C_1$-$C_{20}$ alkyl group or a $C_6$-$C_{30}$ aryl group; $R_{122}$ is a $C_6$-$C_{30}$ aryl group; each of $R_{123}$ and $R_{124}$ is independently protium, deuterium, a $C_5$-$C_{30}$ hetero aryl group, wherein the $C_5$-$C_{30}$ hetero aryl group is unsubstituted or substituted with a $C_6$-$C_{30}$ aryl group which may be unsubstituted or further substituted with other $C_6$-$C_{30}$ aryl group, or each of adjacent two of $R_{123}$ and adjacent two of $R_{124}$ form a $C_6$-$C_{10}$ aromatic ring in case of each of p and q is independently two or more, wherein at least one of $R_{123}$ and $R_{124}$ may be a $C_5$-$C_{30}$ hetero aryl group or at least one of adjacent two of $R_{123}$ and adjacent two of $R_{124}$ may form a $C_6$-$C_{10}$ aromatic ring; each of o, p and q is a number of substituents and is independently an integer of 0 to 4.

For example, $R_{121}$ may comprise protium and deuterium, $R_{122}$ may comprise a phenyl group, $R_{123}$ may comprise protium and deuterium or adjacent two of $R_{123}$ may form a phenyl ring, and $R_{124}$ may comprise a carbazolyl group and a benzocarbazolyl group each of which may be substituted with independently a phenyl group and/or a naphthyl group each of which may be independently unsubstituted or further substituted with other phenyl group and/or other naphthyl group in Formula 20. As an example, the N-type red host may be selected from, but is not limited to, the following organic compounds having the structure of Formula 21:

Formula 21

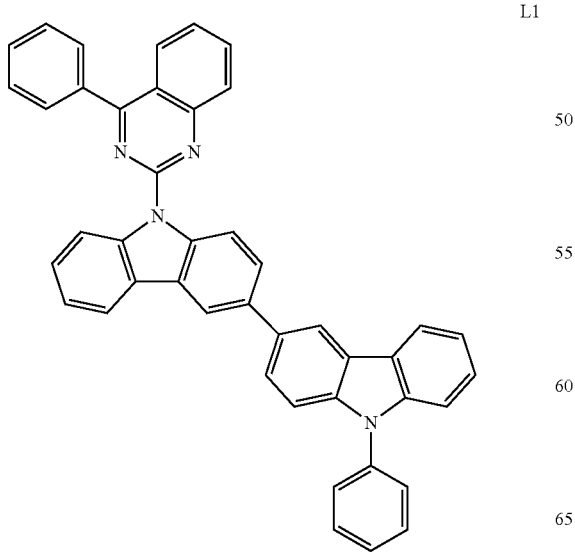
L1

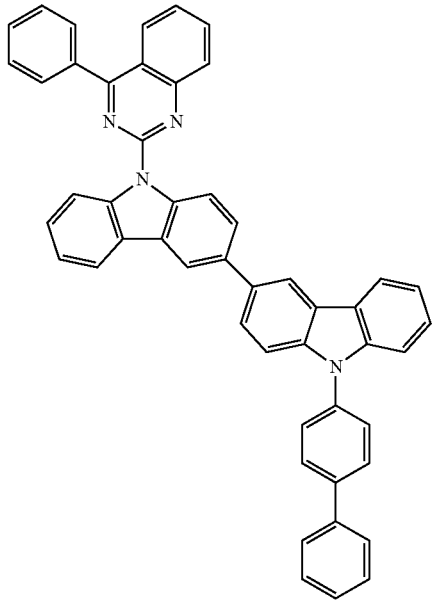
L2

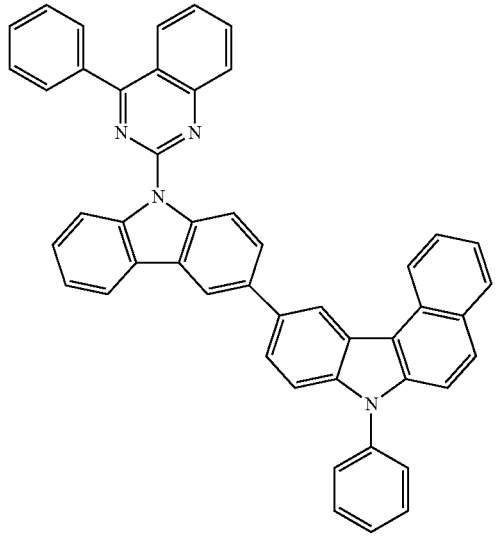
L3

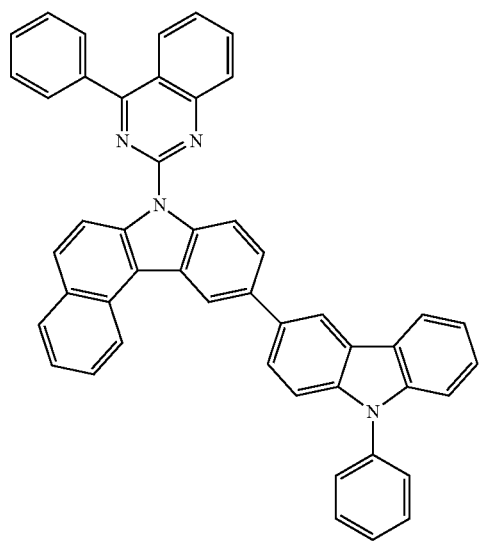
L4
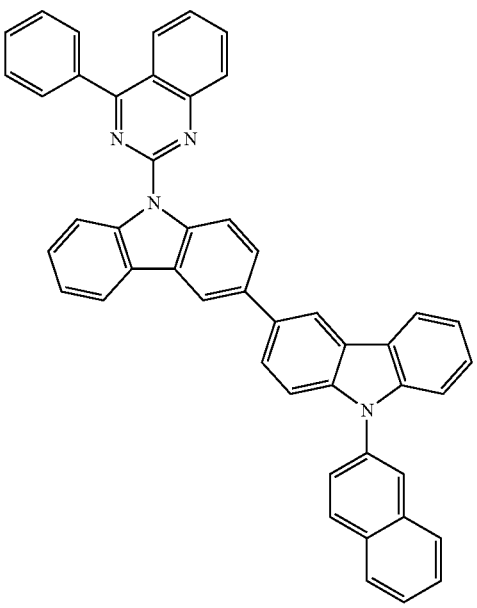
L6
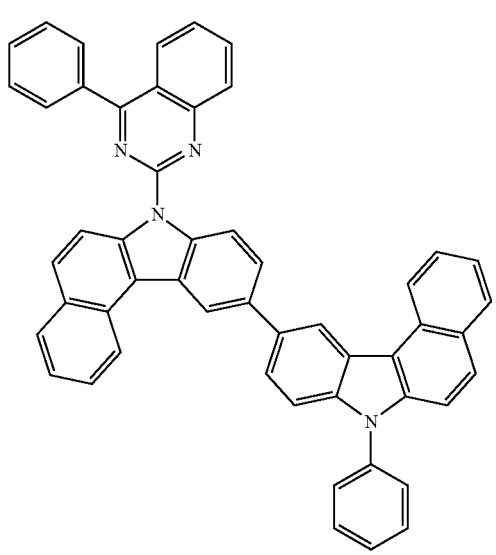
L5
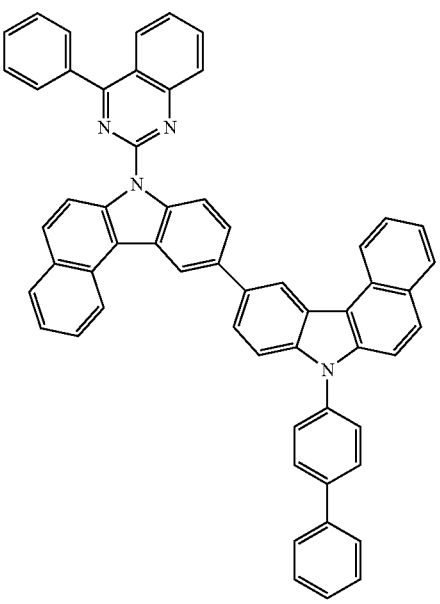
L7

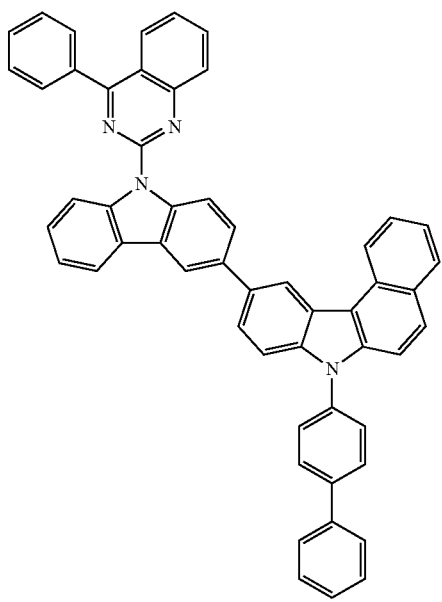

L8

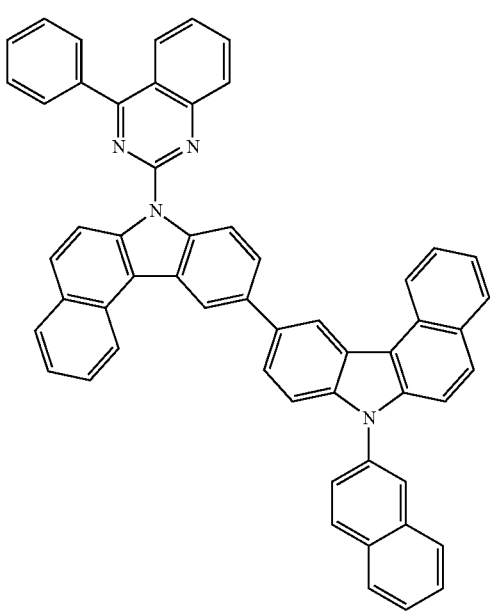

L9

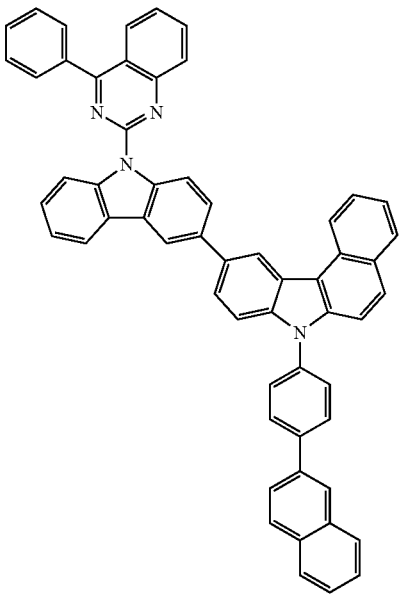

L10

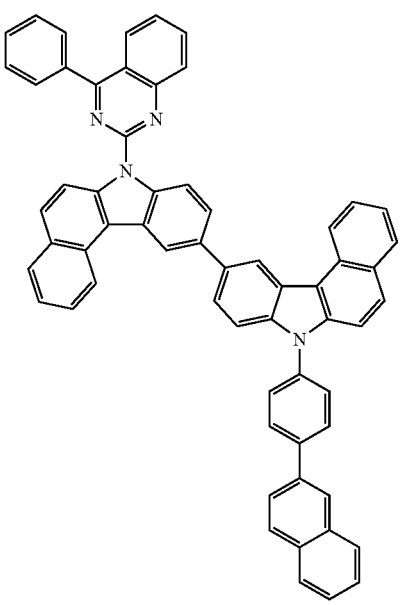

L11

In one exemplary aspect, the P-type red host and the N-type red host in the lower middle EML 940A may be mixed with a weight ratio of, but is not limited to, about 1:9 to about 9:1, for example, about 2:8 to about 8:2 or about 7:3 to about 3:7.

The red dopant 944*a* may include at least one of red phosphorescent material, red fluorescent material and red delayed fluorescent material. In one exemplary aspect, the red phosphorescent material may have, but is not limited to, the following structure of Formula 22:

Formula 22

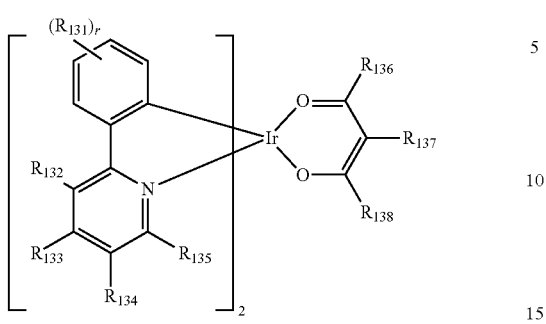

wherein $R_{131}$ is protium, deuterium, a halogen atom, a $C_1$-$C_6$ alkyl group, a $C_3$-$C_6$ cyclo alkyl group, a $C_6$-$C_{10}$ aryl group or a $C_3$-$C_{10}$ hetero aryl group, when r is more than 2, $R_{131}$ may be identical to or different form each other; each of $R_{132}$ to $R_{135}$ is independently protium, deuterium, a halogen atom, a $C_1$-$C_6$ alkyl group, a $C_3$-$C_6$ cyclo alkyl group, a $C_6$-$C_{10}$ aryl group or a $C_3$-$C_{10}$ hetero aryl group, or adjacent two of $R_{132}$ to $R_{135}$ form a $C_6$-$C_{10}$ aryl ring, wherein at least one of adjacent two of $R_{132}$, $R_{133}$, $R_{134}$ and $R_{135}$ may form a $C_6$-$C_{10}$ aryl ring; each of $R_{136}$, $R_{137}$ and $R_{138}$ is independently protium, deuterium or a $C_1$-$C_6$ alkyl group; r is a number of substituents and is an integer of 0 to 4.

In Formula 22, $R_{131}$ may comprise protium, deuterium and a $C_1$-$C_6$ alkyl group, each of $R_{132}$, $R_{133}$, $R_{134}$ and $R_{135}$ may comprise independently protium, deuterium, a $C_1$-$C_6$ alkyl group, or at least one of adjacent two of $R_{132}$, $R_{133}$, $R_{134}$ and $R_{135}$ may form a phenyl ring. As an example, the red dopant 944a may be selected from, but is not limited to, the following red phosphorescent material having the structure of Formula 23:

Formula 23

M1

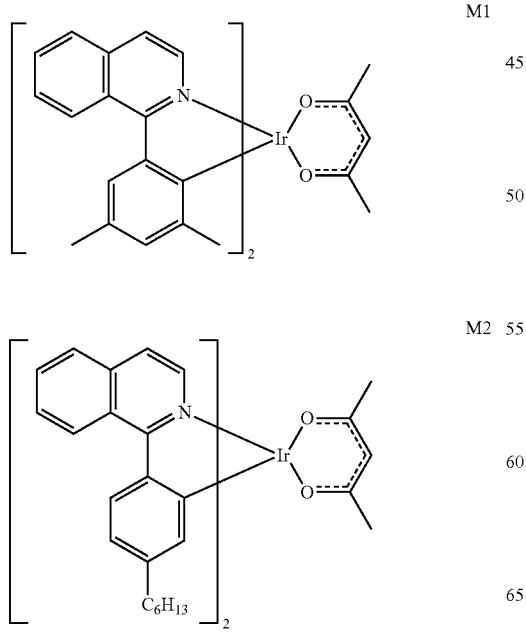

M2

M3

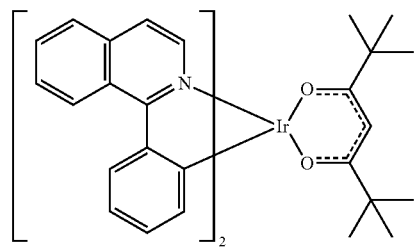

M4

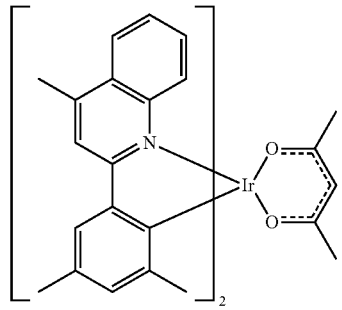

M5

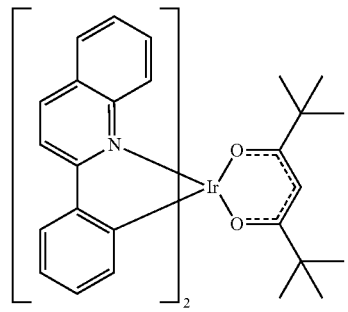

M6

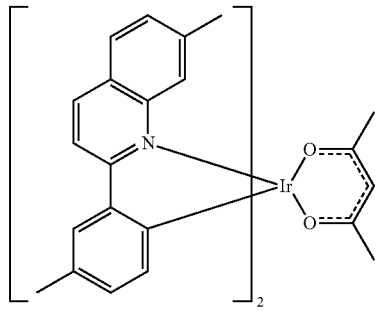

M7

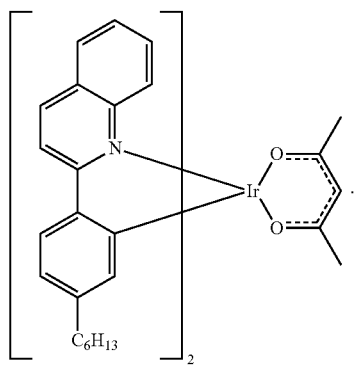

The upper middle EML 940B may be a green emitting material layer. In this case, the upper middle EML 940B may include green host (fourth host) 942b and green dopant (fourth dopant) 944b. In one exemplary aspect, the green host 942b may include a P-type green host (hole-type green host) and an N-type green host (electron-type green host).

As an example, the P-type green host may include, but is not limited to, a biscarbazole-based organic compound having the following structure of Formula 24:

Formula 24

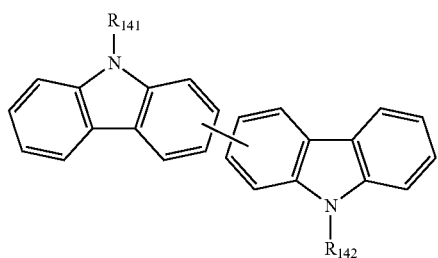

wherein each of $R_{141}$ and $R_{142}$ is independently a $C_6$-$C_{30}$ aryl group, wherein the $C_6$-$C_{30}$ aryl group may be unsubstituted or further substituted with other $C_6$-$C_{10}$ aryl group.

In Formula 24, each of $R_{141}$ and $R_{142}$ may comprise independently a phenyl group and a naphthyl group each of which may be independently unsubstituted or substituted with other phenyl group and/or other naphthyl group. As an example, the P-type green host may be selected from, but is not limited to, the following biscarbazole-based organic compounds having the structure of Formula 25:

Formula 25

P1

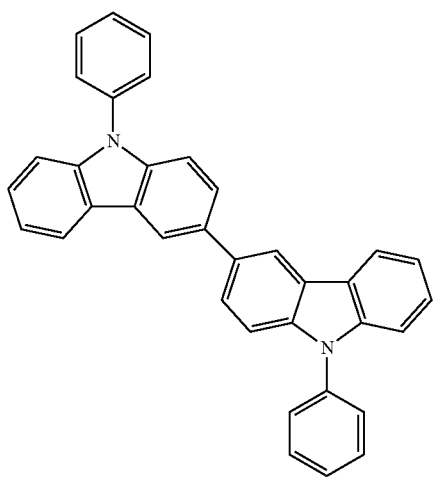

-continued

P2

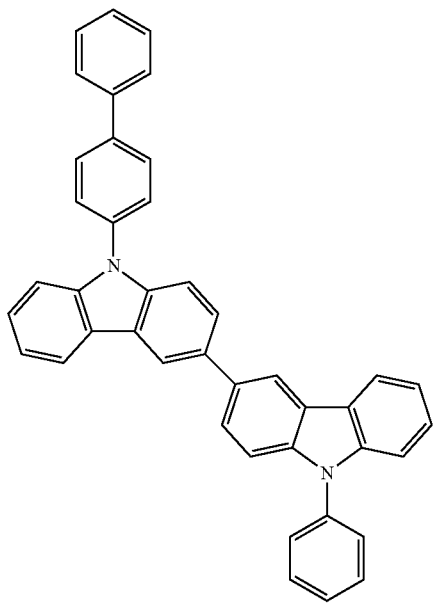

P3

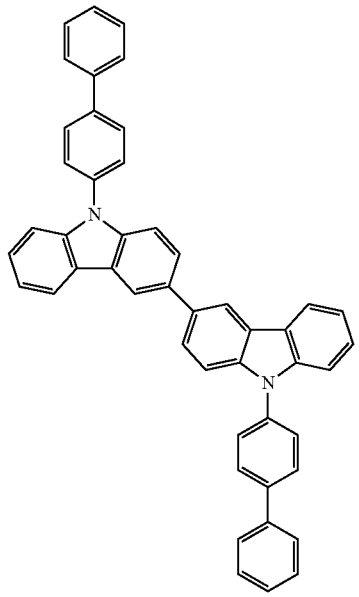

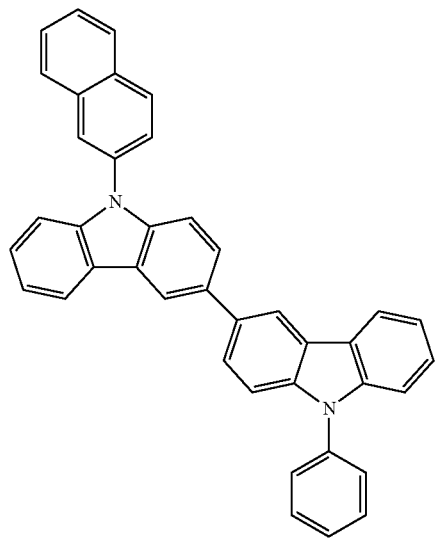
P4
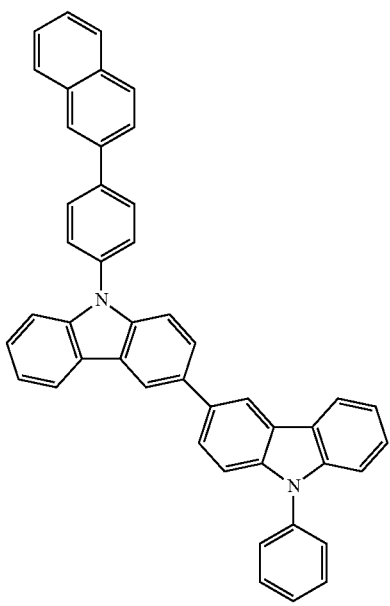
P6
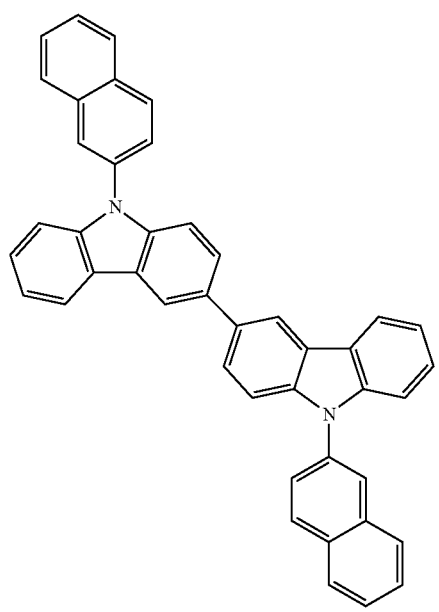
P5
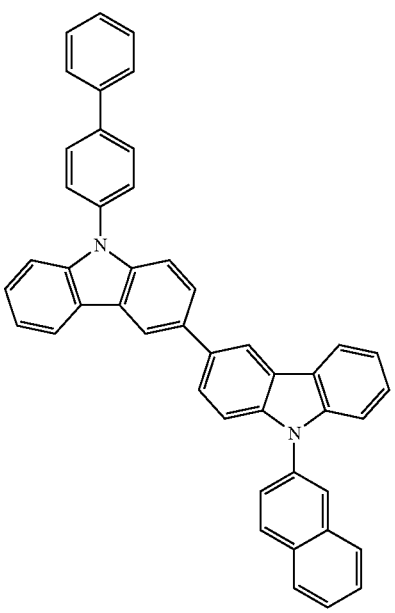
P7

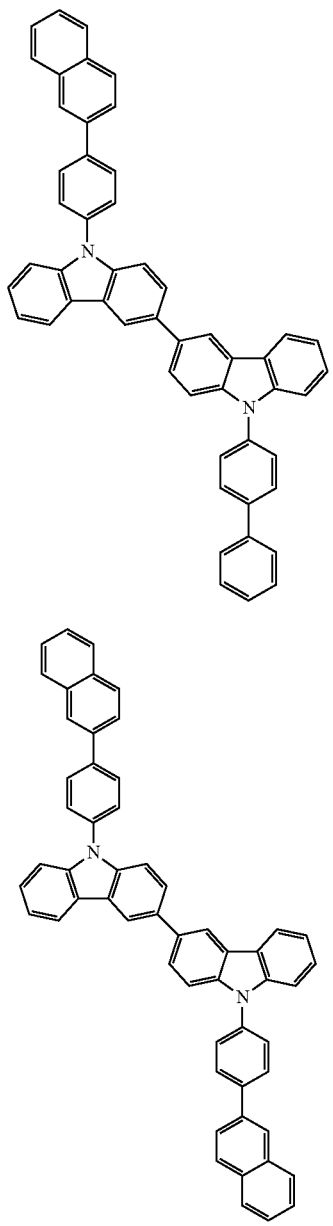

The N-type green host may include, but is not limited to, a triazine-based organic compound having the following structure of Formula 26:

Formula 26

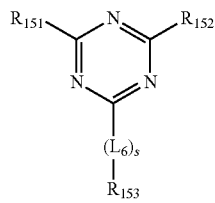

wherein each of $R_{151}$ and $R_{152}$ is independently a $C_6$-$C_{30}$ aryl group; $R_{153}$ is a $C_{10}$-$C_{20}$ fused hetero aryl group which may be unsubstituted or further substituted with $C_{10}$-$C_{20}$ fused aryl group; $L_6$ is a $C_6$-$C_{30}$ arylene group; s is 0 or 1.

In Formula 26, each of $R_{151}$ and $R_{152}$ may comprise independently a phenyl group, $R_{153}$ may comprise a dibenzofuranyl group and a dibenzothiophenyl group each of which may be independently unsubstituted or substituted with a triphenylenyl group and/or a phenanthrenyl group, and $L_6$ may comprise a phenylene group. As an example, the N-type green host may be selected from, but is not limited to, the following triazine-based organic compound having the structure of Formula 27:

Formula 27

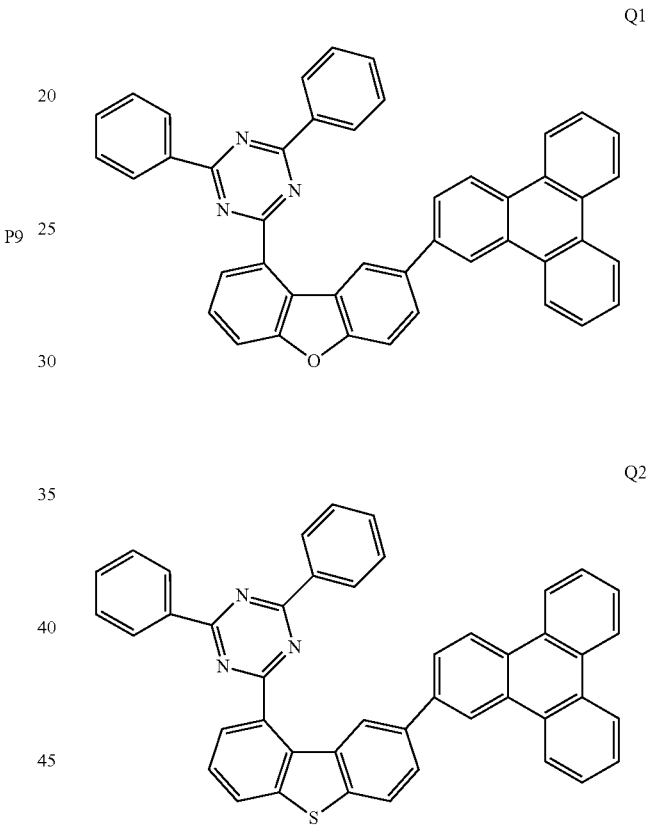

Q4
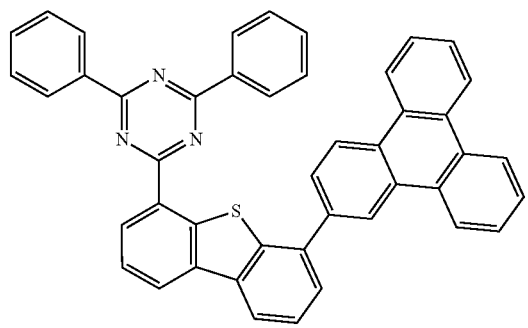
Q5
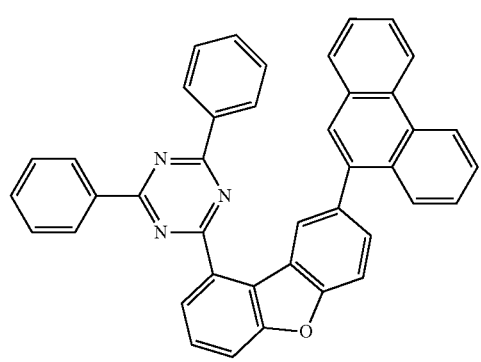
Q6
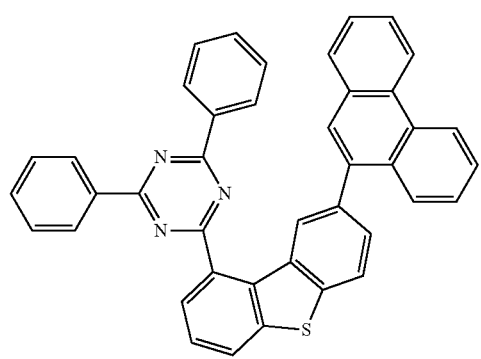
Q7
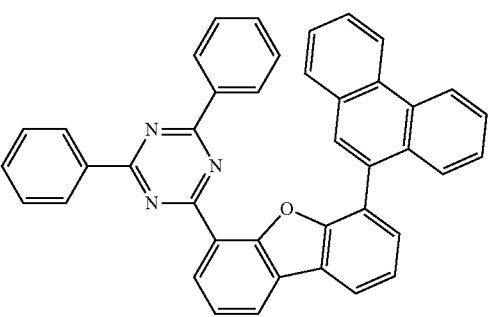
Q8
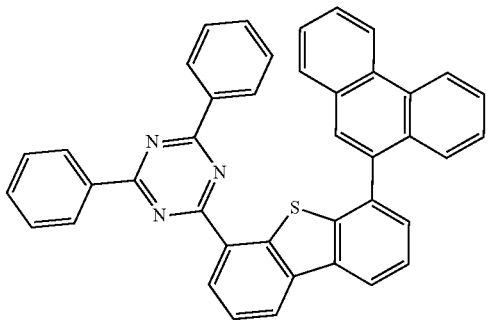
Q9
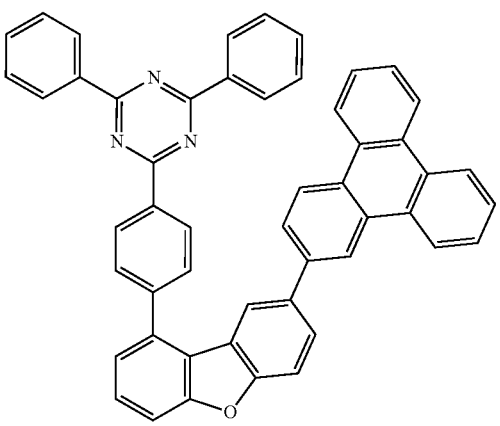
Q10
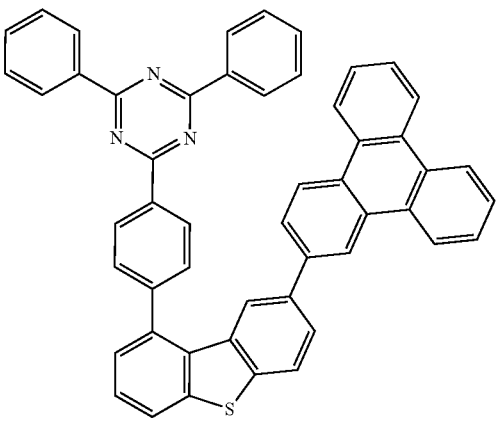
Q11
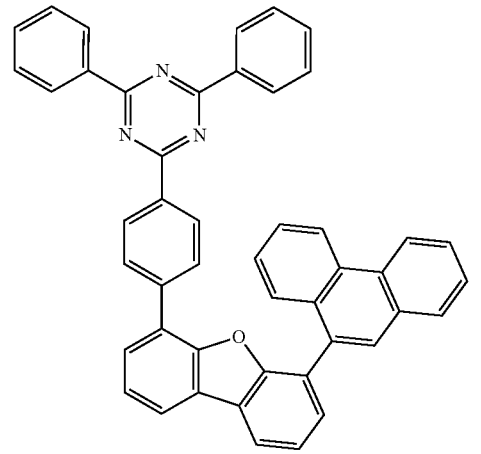

Q12 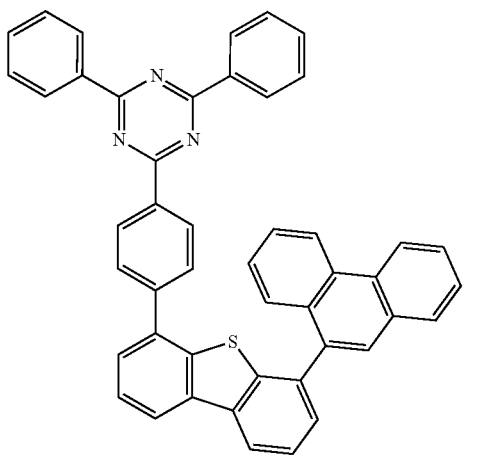

Q13 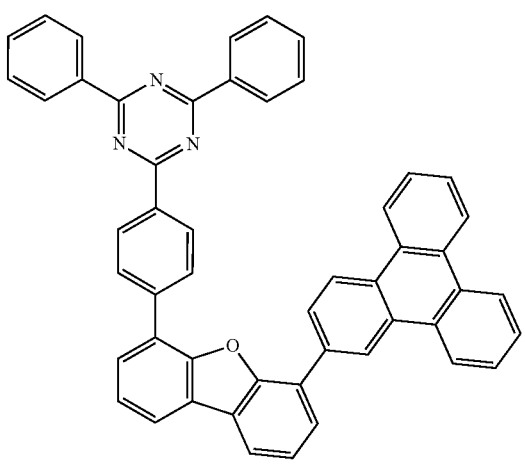

Q14 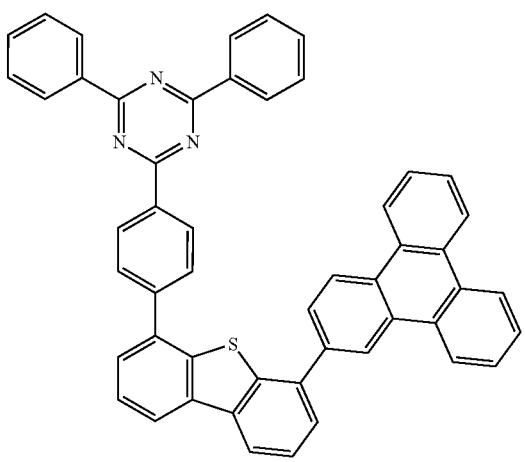

Q15 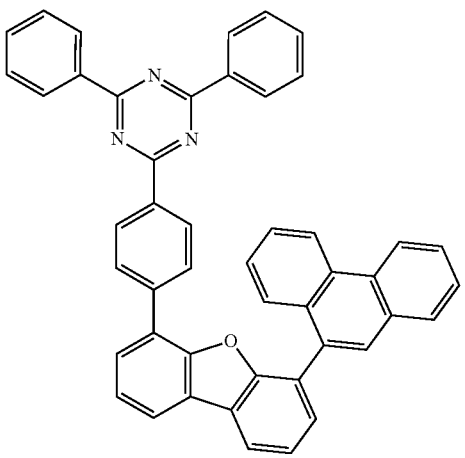

Q16 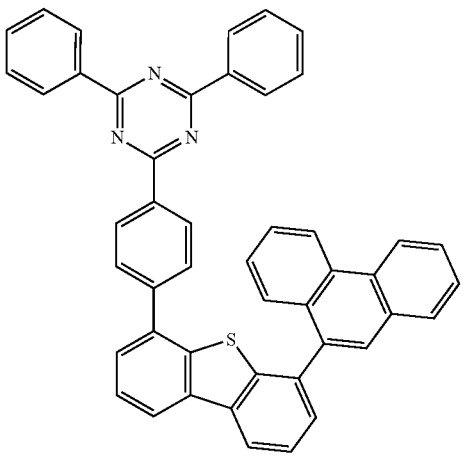

In one exemplary aspect, the P-type green host and the N-type green host in the upper middle EML 940B may be mixed with a weight ratio of, but is not limited to, about 1:9 to about 9:1, for example, about 2:8 to about 8:2 or about 7:3 to about 3:7.

The green dopant 944b may comprise at least one of green phosphorescent material, green fluorescent material and green delayed fluorescent material. In one exemplary aspect, the green phosphorescent material may have, but is not limited to, the following structure of Formula 28:

Formula 28

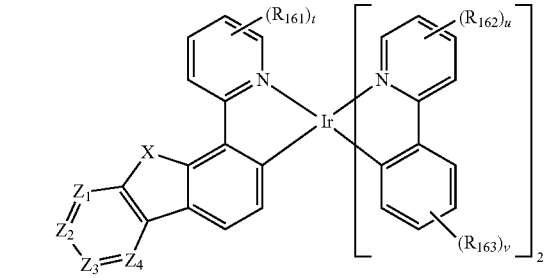

wherein each of $R_{161}$, $R_{161}$ and $R_{163}$ is independently protium, deuterium, a halogen atom, a $C_1$-$C_{10}$ alkyl group, a $C_3$-$C_6$ cyclo alkyl group, a $C_6$-$C_{10}$ aryl group or a $C_3$-$C_{10}$ hetero aryl group; each of t, u and v is a number of substituents and is independently an integer of 0 to 4; X is O or S; each of $Z_1$ to $Z_4$ is independently N or $CR_{164}$, wherein $R_{164}$ is protium, deuterium, a halogen atom, a $C_1$-$C_{10}$ alkyl group, a $C_3$-$C_6$ cyclo alkyl group, a $C_6$-$C_{10}$ aryl group or a $C_3$-$C_{10}$ hetero aryl group.

In Formula 28, each of $R_{161}$, $R_{161}$ and $R_{163}$ may comprise independently protium, deuterium and a $C_1$-$C_{10}$ alkyl group, and at least one, for example at least two or at least three, of $Z_1$ to $Z_4$ may be $CR_{164}$, and $R_{164}$ may comprise protium, deuterium and a $C_1$-$C_{10}$ alkyl group. As an example, the green dopant 944b may be selected from, the following green phosphorescent materials having the structure of Formula 29:

Formula 29

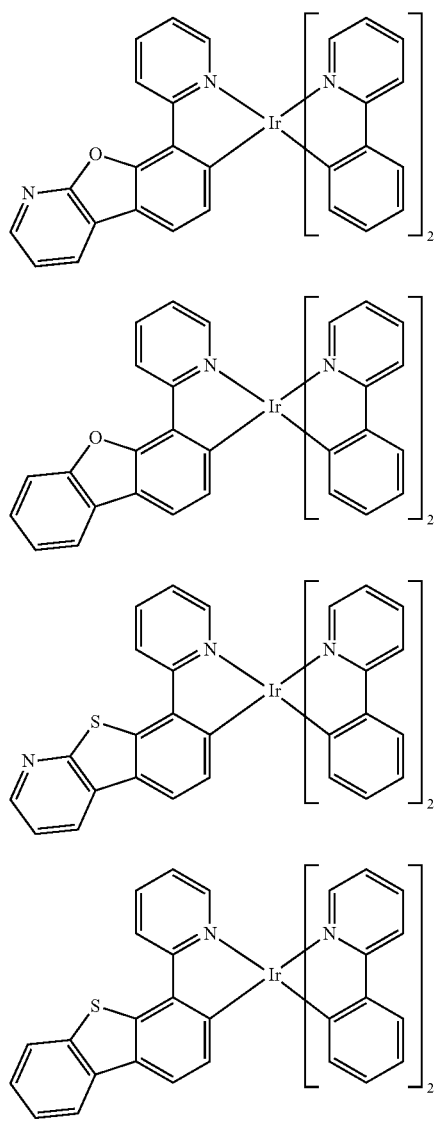

The contents of the green dopant 944b in the upper middle EML 940B may be, but is not limited to, about 1 wt % to about 10 wt %, for example, about 1 wt % to about 5 wt %. The upper middle EML 940B may have a thickness of, but is not limited to, about 30 Å to about 600 Å, for example, about 50 Å to about 400 Å.

The EML1 740 disposed adjacently to the first electrode 610 includes the first host 742 having excellent hole injection property and the EML2 840 disposed adjacently to the second electrode 620 includes the second host 842 having excellent electron injection property. Accordingly, the OLED D2 can lower its driving voltage and improve its luminous efficiency and luminous lifespan. The white light emitted from the OLED D2 in the red pixel region RP, the green pixel region GP and the blue pixel region BP transmits the color filter layer 580 (FIG. 4) in each pixel region, so that the organic light emitting display device 500 (FIG. 4) can implement full-color images.

In FIG. 5, the OLED D2 has three emitting parts to form a tandem structure. Alternatively, an OLED may further comprise at least one emitting part and at least one charge generation layer between the emitting parts.

Figure 6:
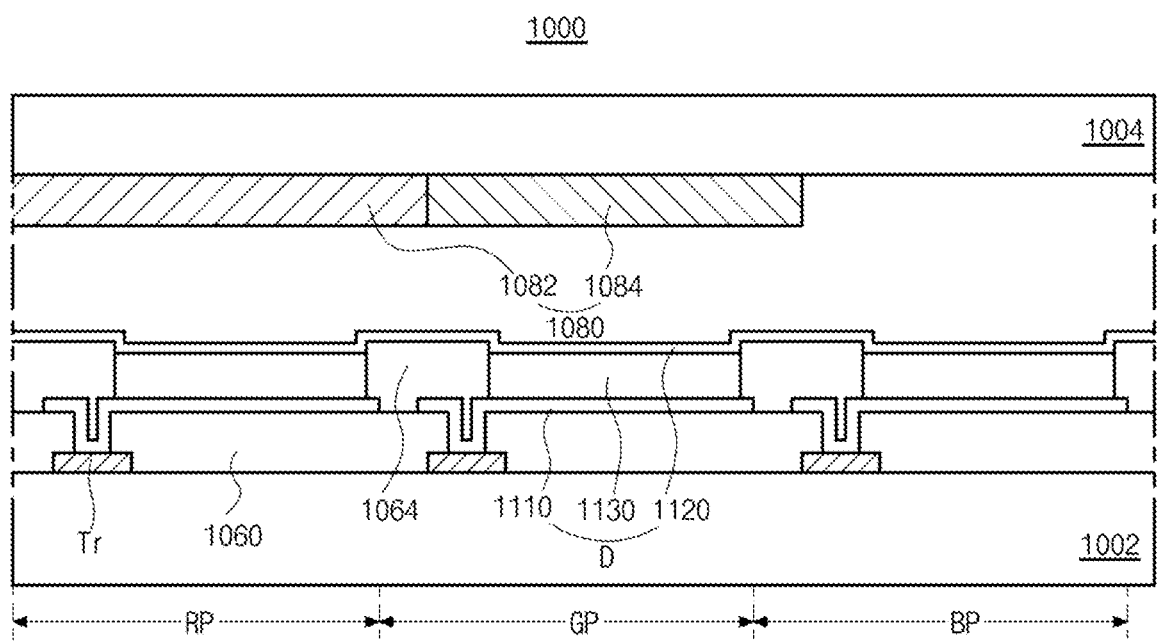
FIG. 6 is a schematic cross-section view illustrating an organic light emitting display device in accordance with still another exemplary aspect of the present disclosure.

In addition, an organic light emitting device in accordance with the present disclosure may include a color conversion layer. FIG. 6 is a schematic cross-sectional view illustrating an organic light emitting display device as an organic light emitting device in still another exemplary aspect of the present disclosure.

As illustrated in FIG. 6, the organic light emitting display device 1000 comprises a first substrate 1002 that defines each of a red pixel region RP, a green pixel region GP and a blue pixel region BP, a second substrate 1004 facing the first substrate 1002, a thin film transistor Tr over the first substrate 1002, an organic light emitting diode (OLED) D disposed between the first and second substrates 1002 and 1004 and emitting blue (B) light and a color conversion layer 1080 disposed between the OLED D and the second substrate 1004. Although not shown in FIG. 6, a color filter layer may be disposed between the second substrate 1004 and the respective color conversion layer 1080.

The thin film transistor Tr is disposed over the first substrate 1002 correspondingly to each of the red pixel region RP, the green pixel region GP and the blue pixel region BP. A passivation layer 1060, which has a drain contact hole exposing one electrode, for example a drain electrode, constituting the thin film transistor Tr, is formed with covering the thin film transistor Tr over the whole first substrate 1002.

The OLED D, which includes a first electrode 1110, an emissive layer 1130 and the second electrode 1120, is disposed over the passivation layer 1060. The first electrode 1110 may be connected to the drain electrode of the thin film transistor Tr through the drain contact hole. In addition, a bank layer 1064 covering edges of the first electrode 1110 is formed at the boundary between the red pixel region RP, the green pixel region GP and the blue pixel region BP. In this case, the OLED D may have a structure of FIG. 2 and can emit blue (B) light. The OLED D is disposed in each of the red pixel region RP, the green pixel region GP and the blue pixel region BP to provide blue (B) light.

The color conversion layer 1080 may include a first color conversion layer 1082 corresponding to the red pixel region RP and a second color conversion layer 1084 corresponding to the green pixel region GP. As an example, the color conversion layer 1080 may include an inorganic luminescent material such as quantum dot (QD).

The blue (B) light emitted from the OLED D in the red pixel region RP is converted into red (R) light by the first color conversion layer 1082 and the blue (B) light emitted from the OLED D in the green pixel region GP is converted into green (G) light by the second color conversion layer 1084. Accordingly, the organic light emitting display device 1000 can implement a color image.

Synthesis Example 1

Synthesis of Host 1-2

(1) Synthesis of Intermediate A-1

Reaction Formula 1-1

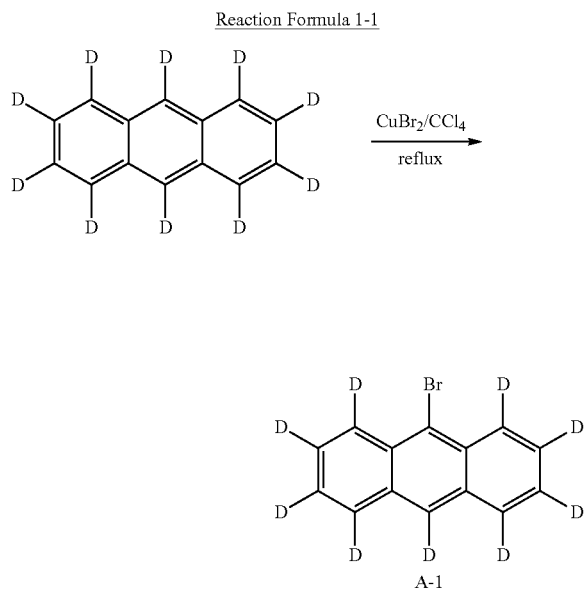

Anhydrous cupric bromide (45 g, 0.202 mol) was added into CCl$_4$ solution dissolving anthracene-D10 (18.8 g, 0.10 mol). The reactants were stirred for 12 hours with heating under nitrogen atmosphere. After the reaction was complete, white CuBr(I) was filtered off, the filtrate was passed through 35 nm Alumina column to be purified. The solvent in the purified reactant solution was removed under vacuum condition to obtain a mixture including the Intermediate A-1 (9-bromoanthracne-D9). The mixture includes the Intermediate A-1 as major component, and the stating material (anthracene-D10) and the dibromo-byproduct as minor component. The mixture without additional purification was used as the starting material in the reaction Formula 1-2.

(2) Synthesis of Intermediate A-2

Reaction Formula 1-2

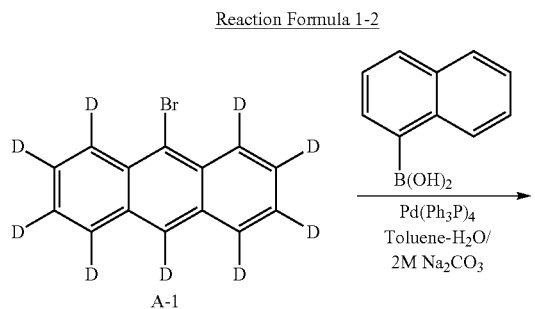

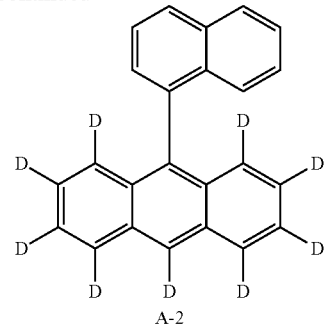

The intermediate A-1 (2.66 g, 0.01 mol) and naphtalene-1-boronic acid (1.72 g, 0.01 mol) was added into a rounded-bottom flask, and then toluene (30 ml) was added into the flask to form a mixed solution. Under a nitrogen atmosphere, the mixed solution was stirred with addition of Na$_2$CO$_3$ aqueous solution dissolving Na$_2$CO$_3$ (2.12 g) in distilled water (10 ml). Pd(PPh$_3$)$_4$ (tetrakis(triphenylphosphine)palladium(0), 0.25 g, 0.025 mmol) as catalyst was further added into the mixed solution and stirred. After the reaction was complete, the reaction solution was added into methanol solution to precipitate a product, and the precipitated product was filtered. In the reduce-pressure filter, the precipitated product was washed sequentially using water, hydrogen chloride aqueous solution (10% concentration), water and methanol. The precipitated product was purified to give an intermediate A-2 of white powder (2.6 g, yield: 83%).

(3) Synthesis of Intermediate A-3

Reaction Formula 1-3

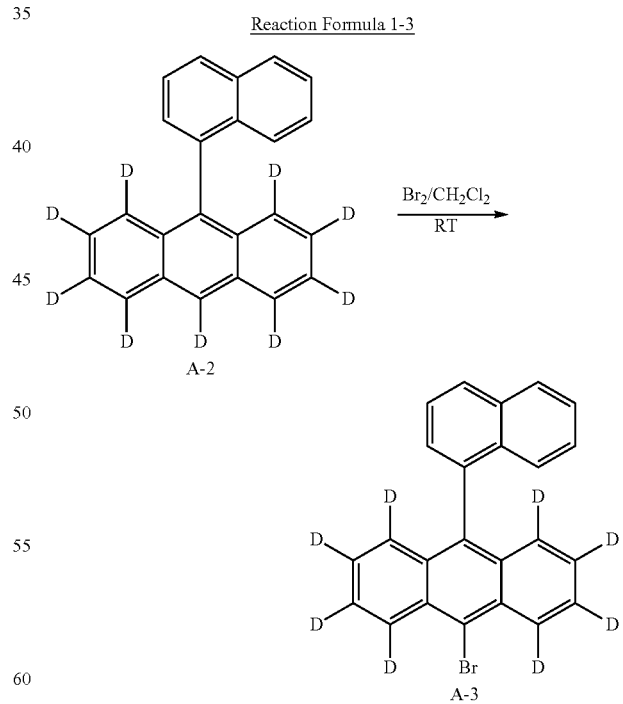

After dissolving the intermediate A-2 (2.8 g, 8.75 mmol) into dichloromethane (50 ml), Br$_2$ (1.4 g, 8.75 mmol) was added into the solution and then the solution was stirred at room temperature (RT). After the reaction was complete, 2M of Na$_2$S$_2$O$_3$ aqueous solution (10 ml) was added into the In addition, when the light emitted from the OLED D is displayed through the first substrate 1002, the color conversion layer 1080 may be disposed between the OLED D and the first substrate 1002.

reactant and stirred. The organic layer was separated and washed with Na$_2$S$_2$O$_3$ aqueous solution (10% concentration, 10 ml) and distilled water. The organic layer was separated again, and water in the organic layer was removed by MgSO$_4$. After the organic solution was concentrated, excessive methanol was added to obtain a product. The product was filtered to give the intermediate A-3 (3.3 g)

(4) Synthesis of Host 1-2

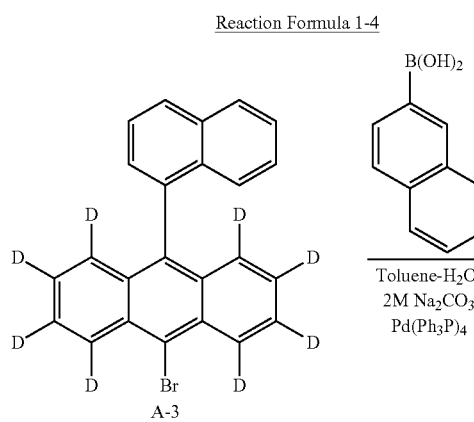

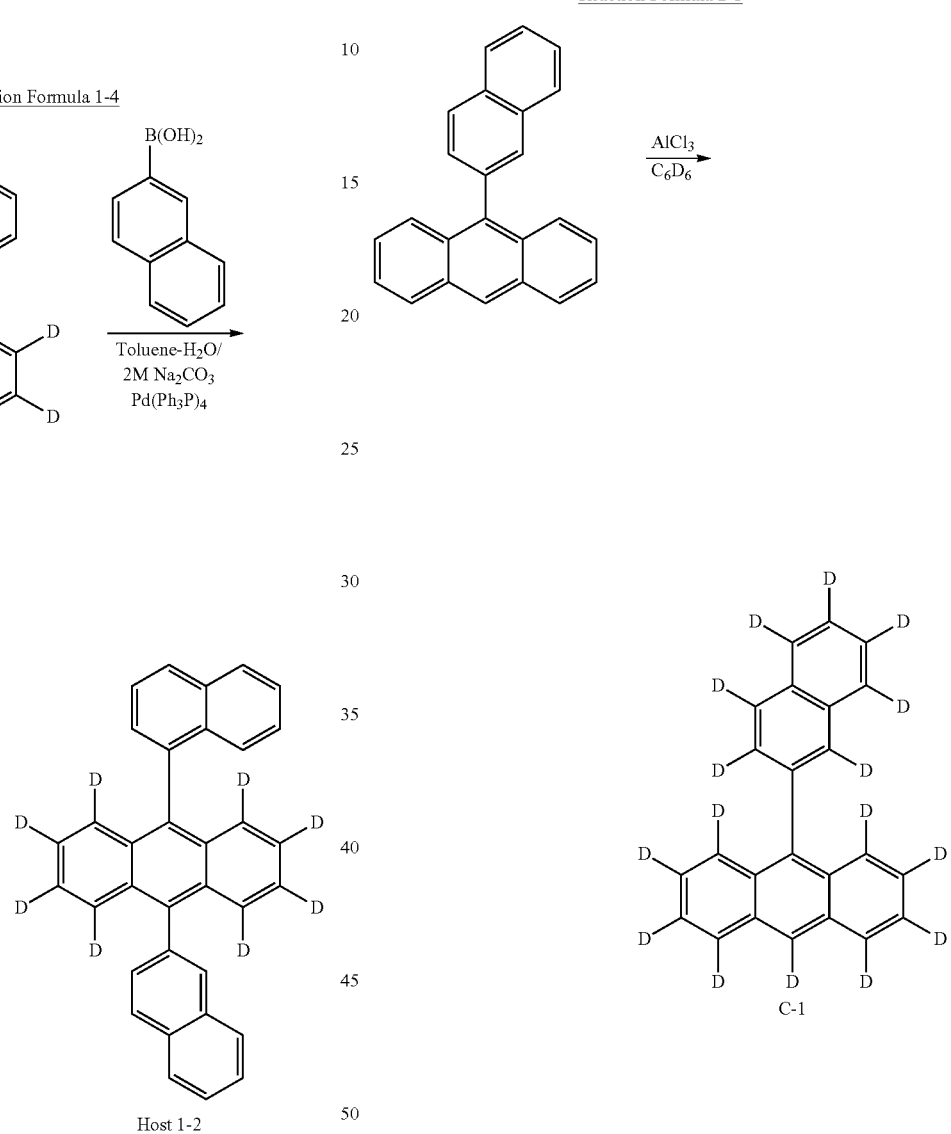

The intermediate A-3 (1.96 g, 0.05 mol) and naphtalene-2-boronic acid (1.02 g, 0.06 mol) were added and dissolved into toluene (30 ml). The mixed solution was stirred under a nitrogen atmosphere. Na$_2$CO$_3$ aqueous solution (1 ml) dissolving Na$_2$CO$_3$ (1.90 g) into distilled water (8 ml) was added into the mixed solution and then Pd(PPh$_3$)$_4$ (0.125 g, 0.0125 mmol) was further added. The mixed solution was heated and reacted under a nitrogen atmosphere. After the reaction was complete, the organic layer was separated, and methanol was added into the organic layer to precipitate a white solid mixture. The white solid mixture was purified by silica-gel column chromatography using chloroform and hexane (volume ratio=1:3) as an eluent to give the Host 1-2 (2.30 g).

Synthesis Example 2

Synthesis of Host 1-3
(1) Synthesis of Intermediate B-1

AlCl$_3$ (0.391 g, 4 mmol) was added into a benzene-D6 solution (C$_6$D$_6$, 100 ml) dissolving 10-(naphtalen-1-yl)anthracene (3.05 g, 10 mmol). After the mixed solution was stirred at RT for 6 hours, D$_2$O (50 ml) was added into the mixed solution. Organic layer was separated from the aqueous layer, and then the aqueous layer was washed with dichloromethane (CH$_2$Cl$_2$). After the organic layer was separated, MgSO$_4$ was added with stirring to dry the organic layer, and then, only the organic solvent was separated through filtering. The separated organic solvent was removed by rotation evaporation to obtain a crude product. The crude product was purified with column chromatography to give the Intermediate B-1 (2.88 g, 9 mmol).

(2) Synthesis of Intermediate B-2

Reaction Formula 2-2

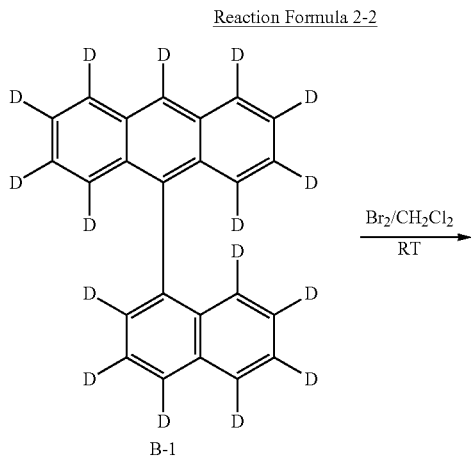

(3) Synthesis of Host 1-3

Reaction Formula 2-3

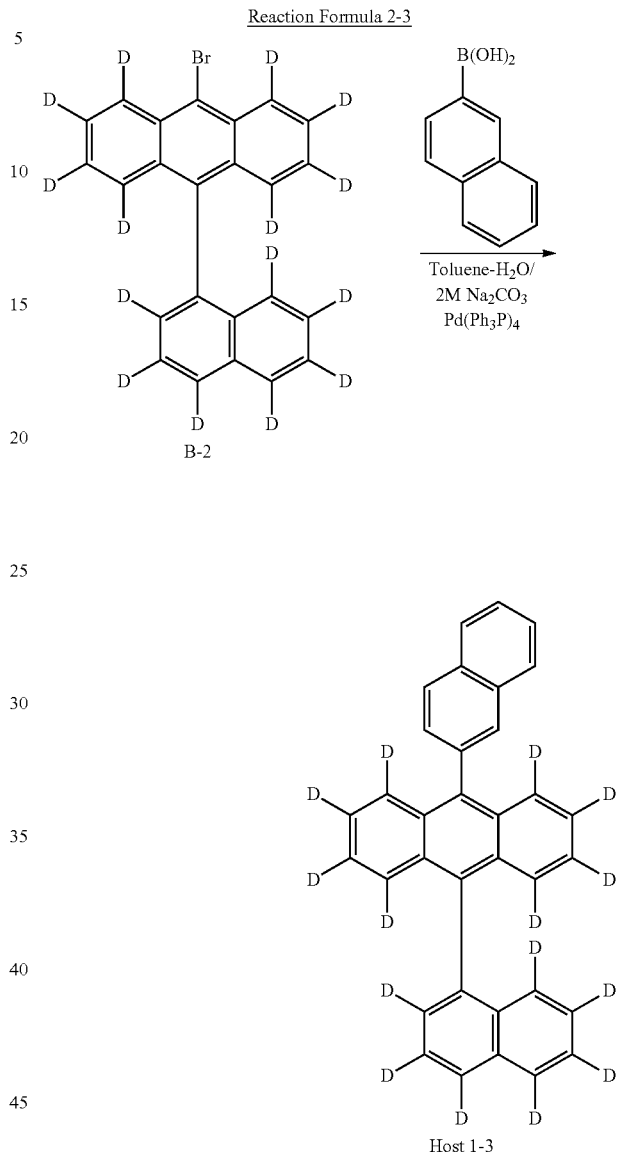

After the Intermediate B-1 (2.88 g, 9 mmol) was dissolved in dichloromethane (50 ml), $Br_2$ (1.45 g, 9 mmol) was added into the solution and then the solution was stirred. After the reaction was complete, 2M of $Na_2S_2O_3$ aqueous solution (10 ml) was added into the reactant and stirred. The organic layer was separated and washed with $Na_2S_2O_3$ aqueous solution (10% concentration, 10 ml) and distilled water. The organic layer was separated again, and water in the organic layer was removed by $MgSO_4$. After the organic solution was concentrated, excessive methanol was added to obtain a product. The product was filtered to give the intermediate B-2 (2.8 g).

The intermediate B-2 (2.8 g, 7 mmol) and naphhtalene-2-boronic acid (1.38 g, 8 mmol) was added into a rounded-bottom flask, and then toluene (30 ml) was added into the flask to form a mixed solution. Under a nitrogen atmosphere, the mixed solution was stirred with addition of $Na_2CO_3$ aqueous solution dissolving $Na_2CO_3$ (2.12 g) in distilled water (10 ml). $Pd(PPh_3)_4$ (0.25 g, 0.025 mmol) as catalyst was further added into the mixed solution and stirred. After the reaction was completed, the reaction solution was added into methanol solution to precipitate a product, and the precipitated product was filtered. In the reduce-pressure filter, the precipitated product was washed sequentially using water, hydrogen chloride aqueous solution (10% concentration), water and methanol. The precipitated product was purified to give Host 1-3 (2.65 g).

Synthesis Example 3

Synthesis of Intermediate 1-4

(1) Synthesis of Intermediate C-1

Reaction Formula 3-1

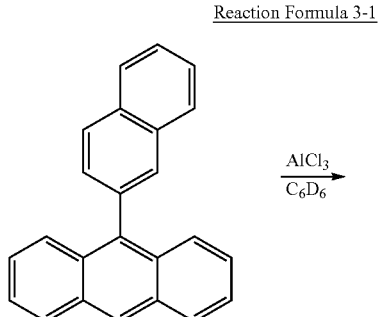

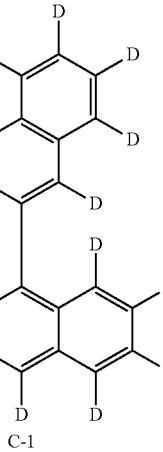

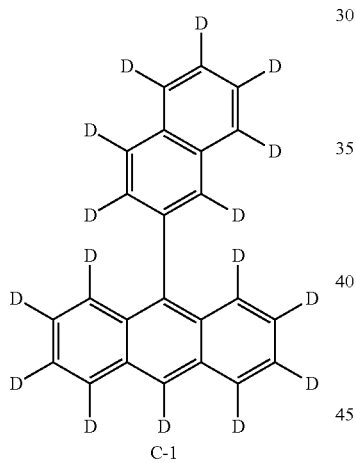

C-1

(2) Synthesis of Intermediate C-2

Reaction Formula 3-2

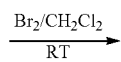

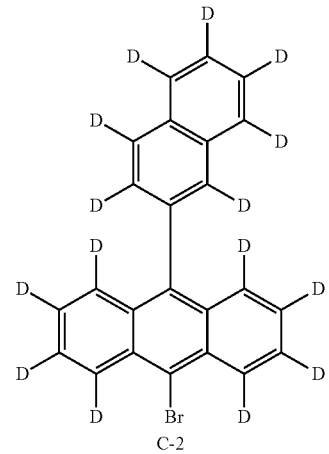

C-2

AlCl₃ (0.391 g, 4 mmol) was added into a benzene-D6 solution ($C_6D_6$, 100 ml) dissolving 10-(naphtalen-2-yl)anthracene (3.05 g, 10 mmol). After the mixed solution was stirred at RT for 6 hours, $D_2O$ (50 ml) was added into the mixed solution. Organic layer was separated from the aqueous layer, and then the aqueous layer was washed with dichloromethane ($CH_2Cl_2$). After the organic layer was separated, $MgSO_4$ was added with stirring to dry the organic layer, and then, only the organic solvent was separated through filtering. The separated organic solvent was removed by rotation evaporation to obtain a crude product. The crude product was purified with column chromatography to give the Intermediate C-1 (2.88 g, 9 mmol).

After the Intermediate C-1 (2.88 g, 9 mmol) was dissolved in dichloromethane (50 ml), $Br_2$ (1.45 g, 9 mmol) was added into the solution and then the solution was stirred. After the reaction was complete, 2M of $Na_2S_2O_3$ aqueous solution (10 ml) was added into the reactant and stirred. The organic layer was separated and washed with $Na_2S_2O_3$ aqueous solution (10% concentration, 10 ml) and distilled water. The organic layer was separated again, and water in the organic layer was removed by $MgSO_4$. After the organic solution was concentrated, excessive methanol was added to obtain a product. The product was filtered to give the intermediate C-2 (2.8 g).

81

(3) Synthesis of Host 1-4

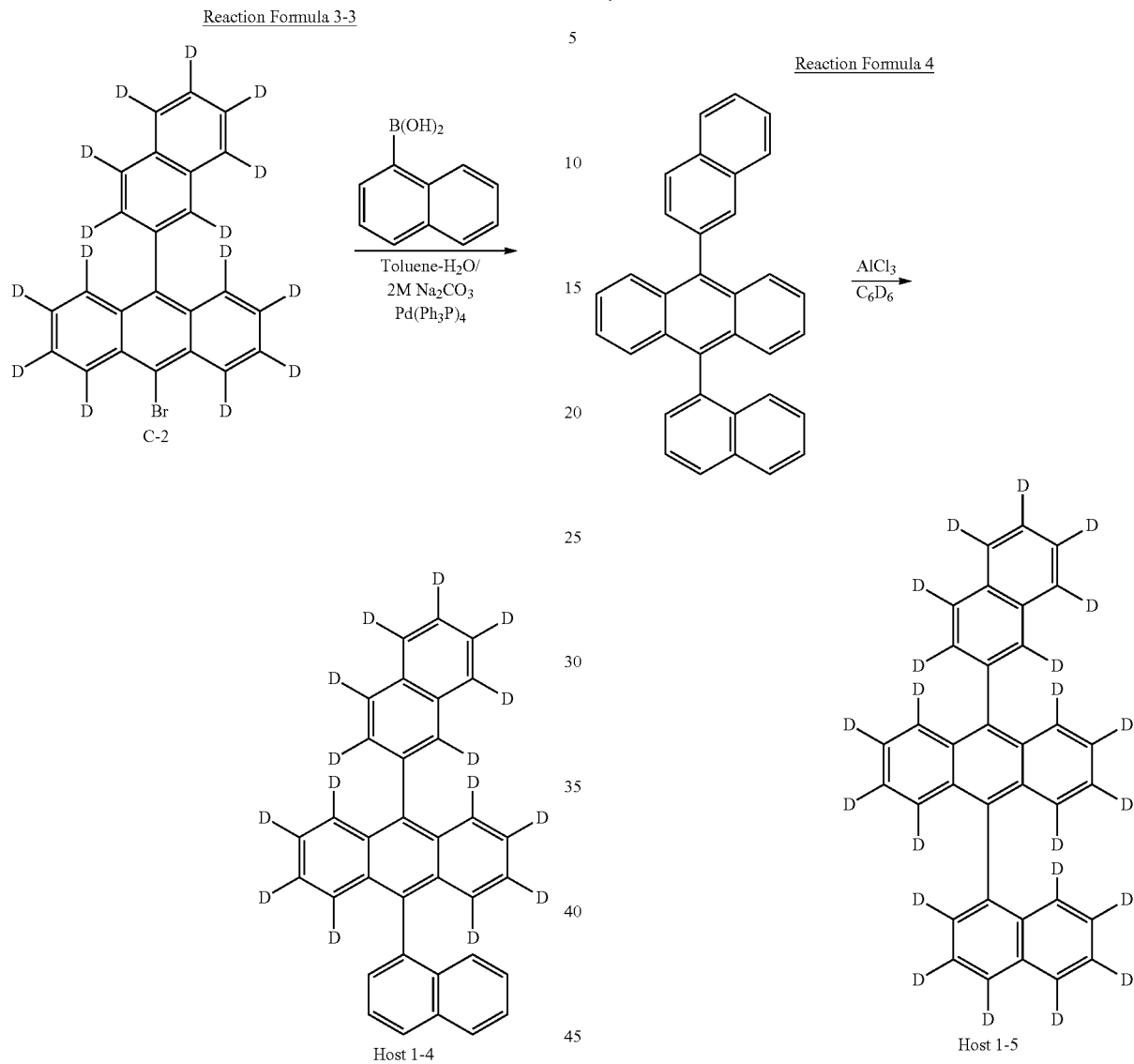

82

Synthesis Example 4

Synthesis of Host 1-5

The intermediate C-2 (2.8 g, 7 mmol) and naphhtalene-1-boronic acid (1.38 g, 8 mmol) was added into a rounded-bottom flask, and then toluene (30 ml) was added into the flask to form a mixed solution. Under a nitrogen atmosphere, the mixed solution was stirred with addition of $Na_2CO_3$ aqueous solution dissolving $Na_2CO_3$ (2.12 g) in distilled water (10 ml). $Pd(PPh_3)_4$ (0.25 g, 0.025 mmol) as catalyst was further added into the mixed solution and stirred. After the reaction was complete, the reaction solution was added into methanol solution to precipitate a product, and the precipitated product was filtered. In the reduce-pressure filter, the precipitated product was washed sequentially using water, hydrogen chloride aqueous solution (10% concentration), water and methanol. The precipitated product was purified to give Host 1-4 (2.65 g).

$AlCl_3$ (0.391 g, 4 mmol) was added into a benzene-D6 solution ($C_6D_6$, 100 ml) dissolving α,β-ADN (9-(1-naphthyl)-10-(2-naphthyl)anthracene, 4.3 g, 10 mmol). After the mixed solution was stirred at RT for 6 hours, $D_2O$ (50 ml) was added into the mixed solution. Organic layer was separated from the aqueous layer, and then the aqueous layer was washed with dichloromethane ($CH_2Cl_2$). After the organic layer was separated, $MgSO_4$ was added with stirring to dry the organic layer, and then, only the organic solvent was separated through filtering. The separated organic solvent was removed by rotation evaporation to obtain a crude product. The crude product was purified with column chromatography to give Host 1-5 (4 g).

Example 1 (EX.1)

Fabrication of Organic Light Emitting Diode (OLED)

An organic light emitting diode having a tandem structure with two emitting parts was fabricated by applying Host 1-5 as the first host in the EML1 and Host 1-3 as the second host in the EML2. A glass substrate onto which ITO was coated as a thin film was washed with UV-treated ozone, and then transferred to a vacuum chamber for depositing emissive layer. Subsequently, an emissive layer and a cathode were deposited by evaporation from a heating boat under about $10^{-7}$ Torr as the following order.

HIL (E3 in Formula 8 (97 wt %), I1 (3 wt %) in Formula 9, 100 Å); HTL1 (E3 in Formula 8, 300 Å), EML1 (Host 1-5 (98 wt %), Dopant 1 (2 wt %), 250 Å), ETL1 (F1 in Formula 11, 150 Å), n-CGL (H1 in Formula 15 (95 wt %), Li (2 wt %), 120 Å), p-CGL (E3 in Formula 8 (85 wt %), I1 in Formula 9 (3 wt %), 75 Å), HTL2 (E3 in Formula 8, 300 Å), EML2 (Host 1-3 (98 wt %), Dopant 1 (2 wt %), 250 Å), ETL2 (F1 in Formula 11 and G1 in Formula 13 (1:1 by weight, 50 wt %), Liq (50 wt %), 350 Å), EIL (LiF (50 wt %), Yb (50 wt %), 20 Å), and a cathode (Ag:Mg=10:1 by weight, 175 Å).

And then, the OLED was transferred from the deposition chamber to a dry box for film formation, followed by encapsulation using UV-curable epoxy and moisture getter.

Example 2 (EX. 2)

Fabrication of OLED

An OLED was fabricated using the same procedure and the same material as Example 1, except that Host 1-4 as the second host in the EML2 instead of Host 1-3 was used.

Example 3 (EX. 3)

Fabrication of OLED

An OLED was fabricated using the same procedure and the same material as Example, 1, except that Host 1-2 as the first host in the EML1 instead of Host 1-5 and Host 1-4 as the second host in the EML2 instead of Host 1-3 were used.

Example 4 (EX. 4)

Fabrication of OLED

An OLED was fabricated using the same procedure and the same material as Example 3, except that Host 1-5 as the second host in the EML2 instead of Host 1-4 was used.

Comparative Example 1 (Ref. 1)

Fabrication of OLED

An OLED was fabricated using the same procedure and the same material as Example 1, except that Host 1-1 as the first host in the EML1 instead of Host 1-5 and Host 1-1 as the second host in the EML2 instead of Host 1-3 were used.

Comparative Example 2 (Ref. 2)

Fabrication of OLED

An OLED was fabricated using the same procedure and the same material as Example 1, except that Host 1-1 as the first host in the EML1 instead of Host 1-5 and Host 1-5 as the second host in the EML2 instead of Host 1-3 were used.

Comparative Example 3 (Ref. 3)

Fabrication of OLED

An OLED was fabricated using the same procedure and the same material as Example 1, except that Host 1-2 as the first host in the EML1 instead of Host 1-5 and Host 1-2 as the second host in the EML2 instead of Host 1-3 were used.

Comparative Example 4 (Ref. 4)

Fabrication of OLED

An OLED was fabricated using the same procedure and the same material as Example 1, except that Host 1-3 as the first host in the EML1 instead of Host 1-5 was used.

Comparative Example 5 (Ref. 5)

Fabrication of OLED

An OLED was fabricated using the same procedure and the same material as Example 1, except that Host 1-4 as the first host in the EML1 instead of Host 1-5 and Host 1-4 as the second host in the EML2 instead of Host 1-3 were used.

Comparative Example 6 (Ref. 6)

Fabrication of OLED

An OLED was fabricated using the same procedure and the same material as Example 1, except that Host 1-5 as the second host in the EML2 instead of Host 1-3 was used.

Comparative Example 7 (Ref. 7)

Fabrication of OLED

An OLED was fabricated using the same procedure and the same material as Example 1, except that Host 1-3 as the first host in the EML1 instead of Host 1-5 and Host 1-5 as the second host in the EML2 instead of Host 1-3 were used.

Comparative Example 8 (Ref. 8)

Fabrication of OLED

An OLED was fabricated using the same procedure and the same material as Example 1, except that Host 1-4 as the first host in the EML1 instead of Host 1-5 and Host 1-5 as the second host in the EML2 instead of Host 1-3 were used.

Experimental Example 1

Measurements of Luminous Properties of OLEDs

Each of the OLEDs fabricated in Examples 1 to 4 and Comparative Examples 1 to 8 was connected to an external power source and then luminous properties for all the OLEDs were evaluated using a constant current source (KEITHLEY) and a photometer PR650 at room temperature. In particular, driving voltage (V), current efficiency (Cd/A) and color coordinates at a current density of 10 mA/cm$^2$ and time period ($T_{95}$) at which the luminance was reduced to 95% from initial luminance at 3000 nit, at RT and at a current density of 22.5 mA/cm$^2$. The measurement results are indicated in the following Table 1.

TABLE 1

Luminous Properties of OLED

| Sample | Host$^a$ | V | cd/A | ($T_{95}$, hr) | (CIE x, y) | |
|---|---|---|---|---|---|---|
| Ref. 1 | 1-1/1-1 | 7.08 | 13.73 | 30 | 0.143 | 0.041 |
| Ref. 2 | 1-1/1-5 | 7.23 | 13.04 | 36 | 0.143 | 0.041 |
| Ref. 3 | 1-2/1-2 | 7.18 | 13.04 | 40 | 0.143 | 0.041 |
| Ref. 4 | 1-3/1-3 | 7.21 | 13.72 | 44 | 0.143 | 0.041 |
| Ref. 5 | 1-4/1-4 | 7.19 | 13.55 | 44 | 0.143 | 0.041 |
| Ref. 6 | 1-5/1-5 | 7.25 | 12.91 | 45 | 0.143 | 0.041 |
| Ref. 7 | 1-3/1-5 | 7.23 | 13.04 | 43 | 0.143 | 0.041 |
| Ref. 8 | 1-4/1-5 | 7.23 | 13.04 | 43 | 0.143 | 0.041 |
| Ex. 1 | 1-5/1-3 | 6.98 | 14.42 | 45 | 0.143 | 0.041 |

TABLE 1-continued

Luminous Properties of OLED

| Sample | Host[a] | V | cd/A | ($T_{95}$, hr) | (CIE x, y) | |
|---|---|---|---|---|---|---|
| Ex. 2 | 1-5/1-4 | 6.98 | 14.55 | 45 | 0.143 | 0.041 |
| Ex. 3 | 1-2/1-4 | 7.14 | 14.55 | 45 | 0.142 | 0.042 |
| Ex. 4 | 1-2/1-5 | 7.00 | 14.21 | 45 | 0.142 | 0.042 |

[a]EML1/EML2

As indicated in Table 1, compared to the OLEDs fabricated in Comparative Examples 1 and 3-5 where the EML1 and the EML2 includes the same host of Host 1-1 (anthracene-based compound in which none of the carbon atoms in the aromatic rings is substituted with deuterium, 0% deuteration rate), Host 1-2, Host 1-3 or Host 1-4 (anthracene-based compound in which a part of carbon atoms in the aromatic rings is substituted with deuterium), the OLEDs fabricated in Examples 1-4 where the EML1 includes Host 1-5 (anthracene-based compound in which all the carbon atoms in the aromatic rings are substituted with deuterium, 100% of deuteration rate) or Host 1-2 (anthracene-based compound in which the carbon atoms in only the anthracene core are substituted with deuterium, about 36% of deuteration rate) as the first host, and the EML2 includes Host 1-3, Host 1-4 (anthracene-based compound having about 68% of deuteration rate) or Host 1-5 as the second host lowered their driving voltage by up to 2.8% and improved their current efficiency and luminous lifespan by up to 11.6% and 50%, respectively.

In addition, compared to the OLEDs fabricated in Comparative Examples 2 and 6-8 where the EML1 includes Host 1-1 (0% of deuteration rate), Host 1-5 (100% of deuteration rate), Host 1-3 or Host 1-4 (about 68% of deuteration rate) as the first host and the EML2 includes Host 1-5 (100% of deuteration rate) as the second host, the OLEDs fabricated in Examples lowered their driving voltage by up to 3.7% and improved their current efficiency and luminous lifespan by up to 11.6% and 25%, respectively.

Example 5 (EX. 5)

Fabrication of OLED

An OLED was fabricated using the same procedure and the same material as Example 1, except that Dopant 2 as the dopant in the EML1 and the EML2 instead of Dopant 1 was used.

Example 6 (EX. 6)

Fabrication of OLED

An OLED was fabricated using the same procedure and the same material as Example 5, except that Host 1-4 as the second host in the EML2 instead of Host 1-3 was used.

Comparative Example 9 (Ref. 9)

Fabrication of OLED

An OLED was fabricated using the same procedure and the same material as Example 5, except that Host 1-1 as the first host in the EML1 instead of Host 1-5 and Host 1-1 as the second host in the EML2 instead of Host 1-3 were used.

Comparative Example 10 (Ref. 10)

Fabrication of OLED

An OLED was fabricated using the same procedure and the same material as Example 5, except that Host 1-1 as the first host in the EML1 instead of Host 1-5 and Host 1-5 as the second host in the EML2 instead of Host 1-3 were used.

Comparative Example 11 (Ref. 11)

Fabrication of OLED

An OLED was fabricated using the same procedure and the same material as Example 5, except that Host 1-2 as the first host in the EML1 instead of Host 1-5 and Host 1-2 as the second host in the EML2 instead of Host 1-3 were used.

Comparative Example 12 (Ref. 12)

Fabrication of OLED

An OLED was fabricated using the same procedure and the same material as Example 5, except that Host 1-3 as the first host in the EML1 instead of Host 1-5 was used.

Comparative Example 13 (Ref. 13)

Fabrication of OLED

An OLED was fabricated using the same procedure and the same material as Example 5, except that Host 1-4 as the first host in the EML1 instead of Host 1-5 and Host 1-4 as the second host in the EML2 instead of Host 1-3 were used.

Comparative Example 14 (Ref. 14)

Fabrication of OLED

An OLED was fabricated using the same procedure and the same material as Example 5, except that Host 1-5 as the second host in the EML2 instead of Host 1-3 was used.

Comparative Example 15 (Ref. 15)

Fabrication of OLED

An OLED was fabricated using the same procedure and the same material as Example 5, except that Host 1-3 as the first host in the EML1 instead of Host 1-5 and Host 1-5 as the second host in the EML2 instead of Host 1-3 were used.

Comparative Example 16 (Ref. 16)

Fabrication of OLED

An OLED was fabricated using the same procedure and the same material as Example 5, except that Host 1-4 as the first host in the EML1 instead of Host 1-5 and Host 1-5 as the second host in the EML2 instead of Host 1-3 were used.

Experimental Example 2

Measurement of Luminous Properties of OLEDs

Luminous properties for each of the OLEDs fabricated in Examples 5 to 6 and Comparative Examples 9 to 16 were measured as Experimental Example 1. The measurement results are indicated in the following Table 2.

TABLE 2

| | | Luminous Properties of OLED | | | | |
|---|---|---|---|---|---|---|
| Sample | Host[a] | V | cd/A | ($T_{95}$, hr) | (CIE x, | y) |
| Ref. 9 | 1-1/1-1 | 7.08 | 14.01 | 25 | 0.14 | 0.039 |
| Ref. 10 | 1-1/1-5 | 7.23 | 13.31 | 30 | 0.14 | 0.039 |
| Ref. 11 | 1-2/1-2 | 7.18 | 13.31 | 33 | 0.14 | 0.039 |
| Ref. 12 | 1-3/1-3 | 7.21 | 13.23 | 36 | 0.14 | 0.039 |
| Ref. 13 | 1-4/1-4 | 7.11 | 13.35 | 37 | 0.14 | 0.039 |
| Ref. 14 | 1-5/1-5 | 7.25 | 13.17 | 37 | 0.14 | 0.039 |
| Ref. 15 | 1-3/1-5 | 7.23 | 13.31 | 36 | 0.14 | 0.039 |
| Ref. 16 | 1-4/1-5 | 7.23 | 13.31 | 36 | 0.14 | 0.039 |
| Ex. 5 | 1-5/1-3 | 6.98 | 14.71 | 37 | 0.14 | 0.039 |
| Ex. 6 | 1-5/1-4 | 6.98 | 14.85 | 37 | 0.14 | 0.039 |

[a]EML1/EML2

As indicated in Table 2, compared to the OLEDs fabricated in Comparative Examples 9 and 11-13 where the EML1 and the EML2 includes the same host of Host 1-1 (anthracene-based compound in which none of the carbon atoms in the aromatic rings is substituted with deuterium, 0% deuteration rate), Host 1-2, Host 1-3 or Host 1-4 (anthracene-based compound in which a part of carbon atoms in the aromatic rings is substituted with deuterium), the OLEDs fabricated in Examples 5-6 where the EML1 includes Host 1-5 (anthracene-based compound in which all the carbon atoms in the aromatic rings are substituted with deuterium, 100% of deuteration rate) as the first host, and the EML2 includes Host 1-3 or Host 1-4 (anthracene-based compound having about 68% of deuteration rate) as the second host lowered their driving voltage by up to 2.8% and improved their current efficiency and luminous lifespan by up to 11.6% and 48%, respectively.

In addition, compared to the OLEDs fabricated in Comparative Examples 10 and 14-16 where the EML1 includes Host 1-1 (0% of deuteration rate), Host 1-5 (100% of deuteration rate), Host 1-3 or Host 1-4 (about 68% of deuteration rate) as the first host and the EML2 includes Host 1-5 (100% of deuteration rate) as the second host, the OLEDs fabricated in Examples lowered their driving voltage by up to 3.7% and improved their current efficiency and luminous lifespan by up to 11.6% and 23.3%, respectively.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode, comprising:
    a first electrode;
    a second electrode facing the first electrode;
    a first emitting part disposed between the first and second electrodes and comprising a first emitting material layer;
    a second emitting part disposed between the first emitting part and the second electrode and comprising a second emitting material layer; and
    a first charge generation layer disposed between the first and second emitting parts,
    wherein the first emitting material layer includes a first host having the following structure of Formula 1; and
    wherein the second emitting material layer includes a second host having the following structure of Formula 3:

Formula 1

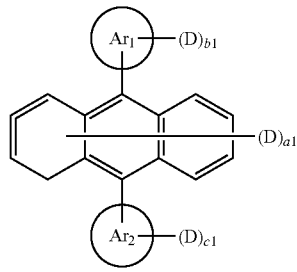

Formula 3

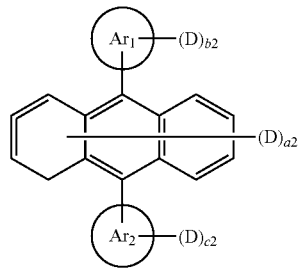

wherein:
    each of $Ar_1$ and $Ar_2$ is independently a $C_6$-$C_{20}$ aryl group;
    D represents deuterium;
    each of a1 and a2 is independently an integer of 0 to 8;
    each of b1, b2, c1 and c2 is independently a number of deuterium substituted carbon atoms in $Ar_1$ and $Ar_2$ not linked to the anthracene core; and
    a sum of a1, b1 and c1 is different from a sum of a2, b2 and c2.

2. The organic light emitting diode of claim 1, wherein each of Ar1 and Ar2 is selected from the group consisting of a phenyl group, a naphthyl group and an anthracenyl group.

3. The organic light emitting diode of claim 1, wherein the first host is selected from one of the following organic compounds:

Host 1-2

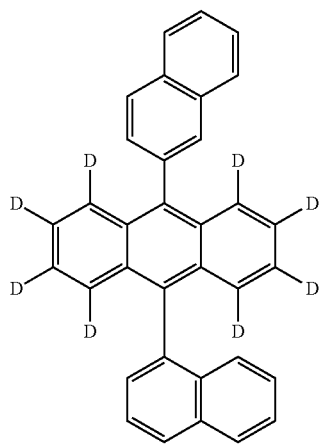

Host 1-5

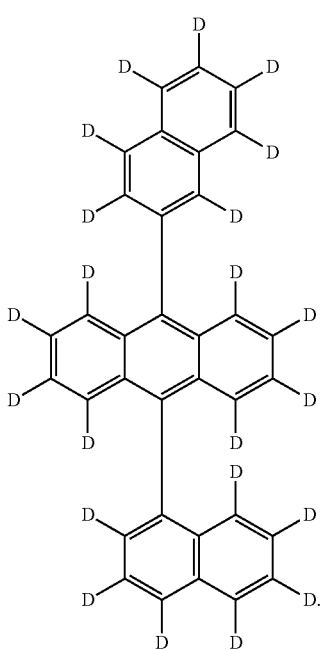

4. The organic light emitting diode of claim 1, wherein the second host is selected from one of the following organic compounds:

Host 1-1

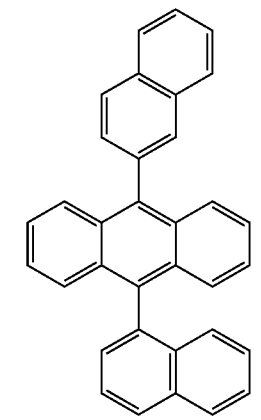

Host 1-2

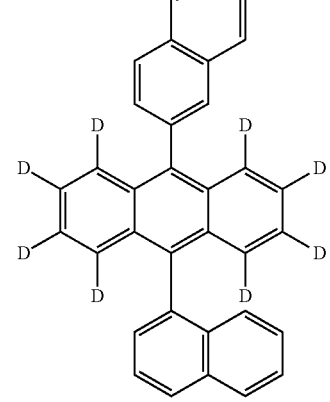

Host 1-3

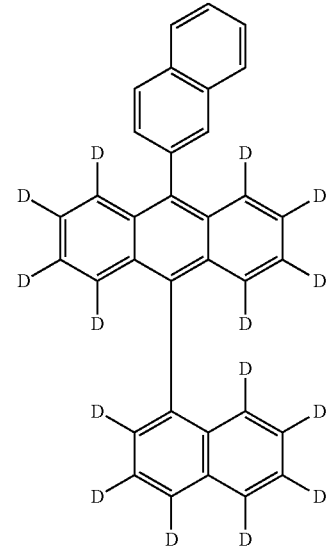

Host 1-4

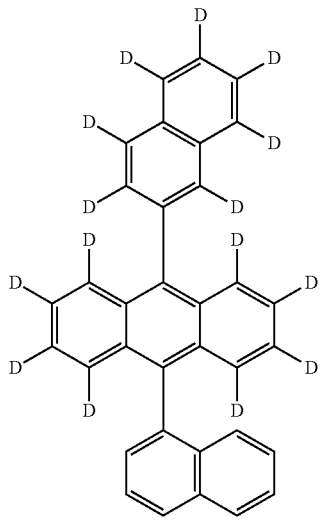

Host 1-5

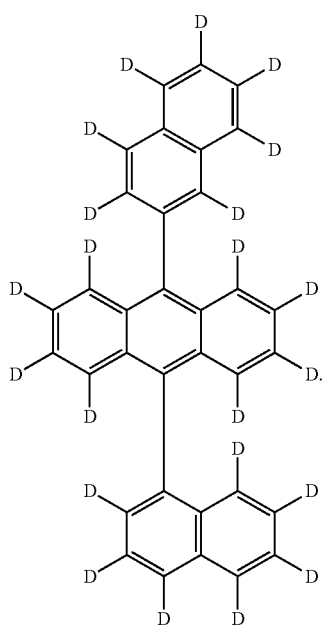

5. The organic light emitting diode of claim 1, wherein the first emitting material layer includes a first dopant and the second emitting material layer includes a second dopant, and wherein each of the first dopant and the second dopant includes independently a boron-based compound having the following structure of Formula 5:

Formula 5

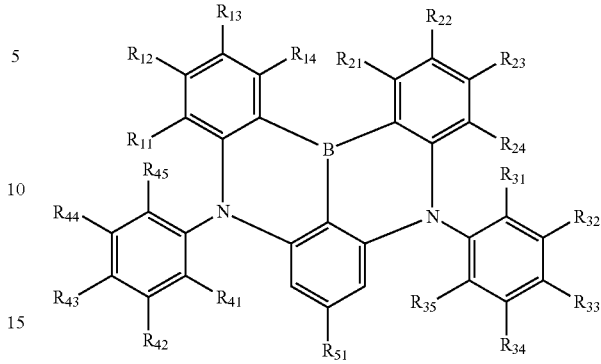

wherein:
each of $R_{11}$, $R_{12}$, $R_{13}$, $R_{14}$, $R_{21}$, $R_{22}$, $R_{23}$, $R_{24}$, $R_{31}$, $R_{32}$, $R_{33}$, $R_{34}$, $R_{35}$, $R_{41}$, $R_{42}$, $R_{43}$, $R_{44}$ and $R_{45}$ is independently selected from the group consisting of hydrogen, deuterium, a $C_1$-$C_{10}$ alkyl group, a $C_6$-$C_{30}$ aryl group, a $C_6$-$C_{30}$ aryl amino group and a $C_5$-$C_{30}$ hetero aryl group, or adjacent two of $R_{31}$, $R_{32}$, $R_{33}$, $R_{34}$, and $R_{35}$ together with the carbon atoms to which they are attached or adjacent two of $R_{41}$, $R_{42}$, $R_{43}$, $R_{44}$ and $R_{45}$ together with the carbon atoms to which they are attached forms independently an unsubstituted or substituted $C_6$-$C_{10}$ aromatic ring or an unsubstituted or substituted $C_5$-$C_{10}$ hetero aromatic ring; and
$R_{51}$ is selected from the group consisting of hydrogen, deuterium, a $C_1$-$C_{10}$ alkyl group, a $C_3$-$C_{15}$ cyclo alkyl group, a $C_6$-$C_{30}$ aryl group, a $C_5$-$C_{30}$ hetero aryl group and a $C_6$-$C_{30}$ aryl amino group,
wherein each of the $C_6$-$C_{30}$ aryl group and the $C_5$-$C_{30}$ hetero aryl group is optionally substituted with deuterium or a $C_1$-$C_{10}$ alkyl group, and
wherein the aryl ring of the $C_6$-$C_{30}$ aryl amino group is optionally substituted with deuterium or at least one of a $C_1$-$C_{10}$ alkyl group and a $C_6$-$C_{20}$ aryl group.

6. The organic light emitting diode of claim 5, wherein each of the first dopant and the second dopant is independently selected from one of the following compounds:

Dopant 1

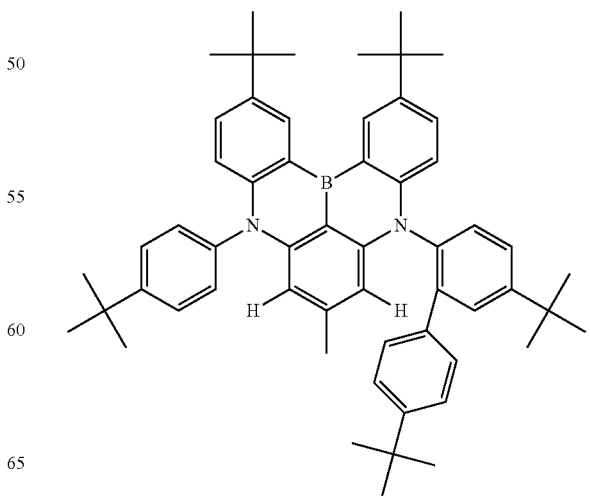

Dopant 2
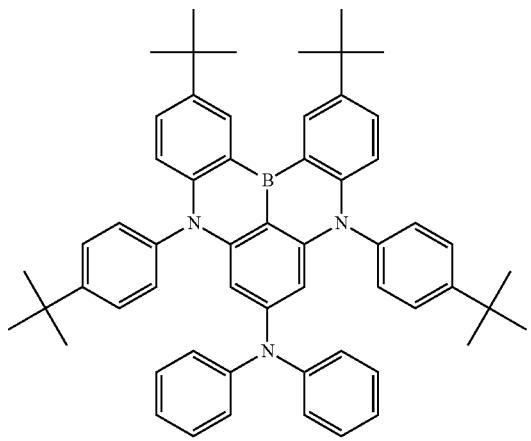
Dopant 3
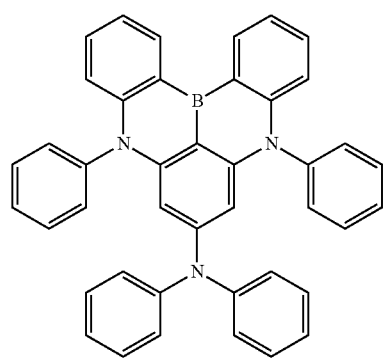
Dopant 4
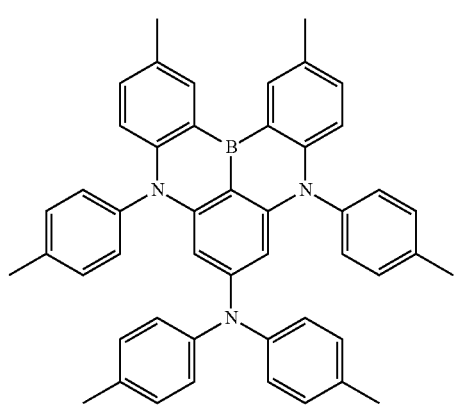
Dopant 5
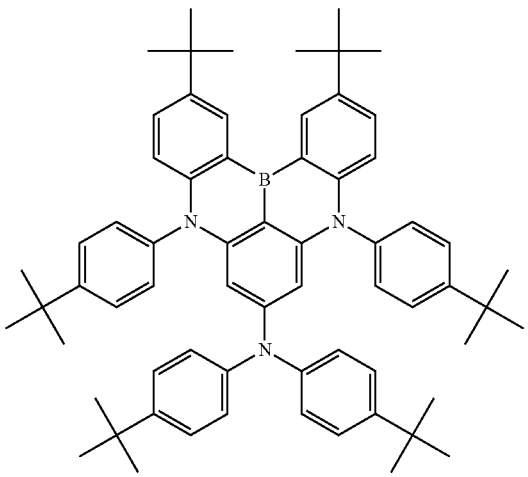
Dopant 6
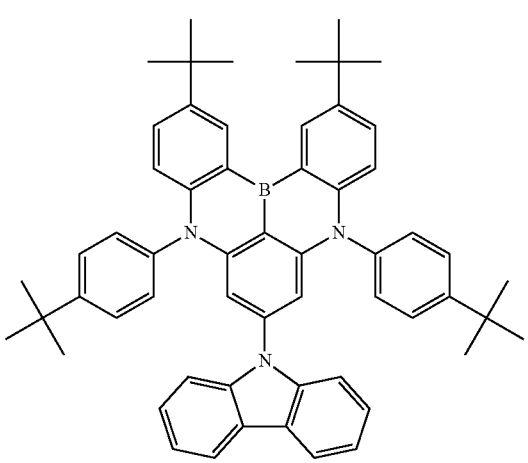
Dopant 7

Dopant 8
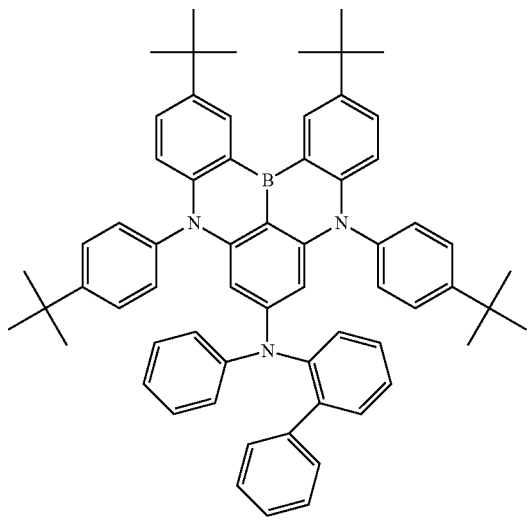
Dopant 9
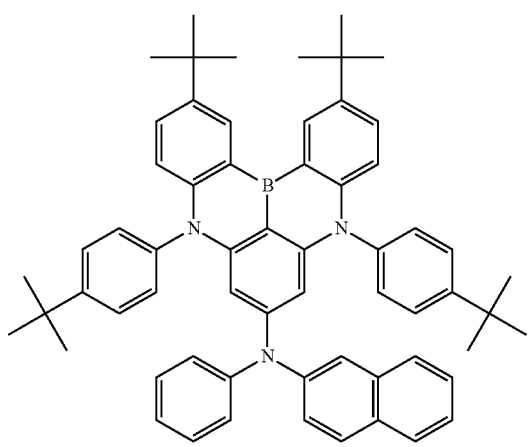
Dopant 10
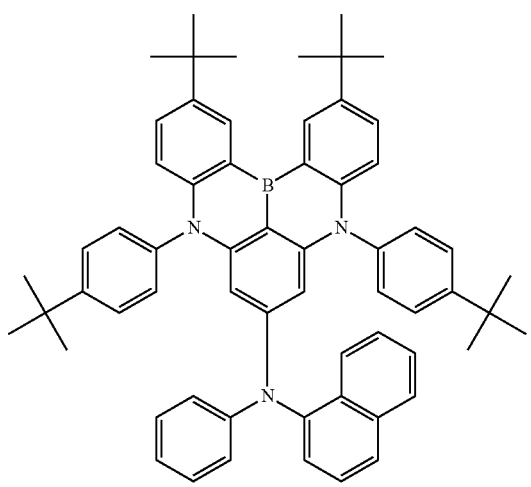
Dopant 11
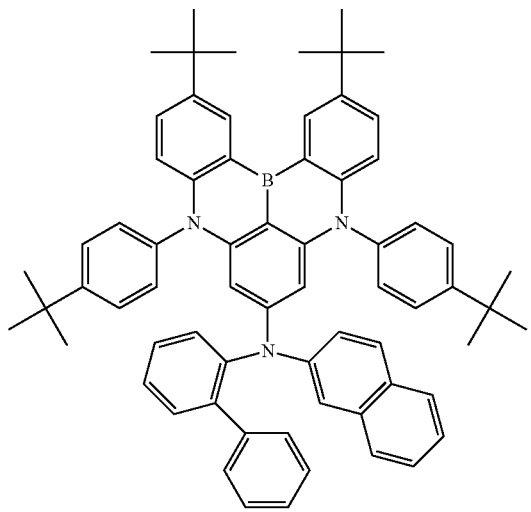
Dopant 12
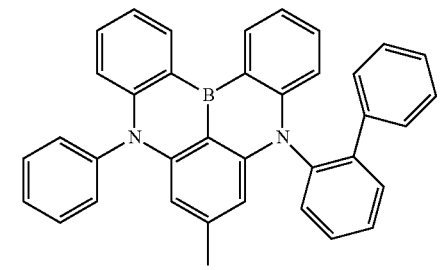
Dopant 13
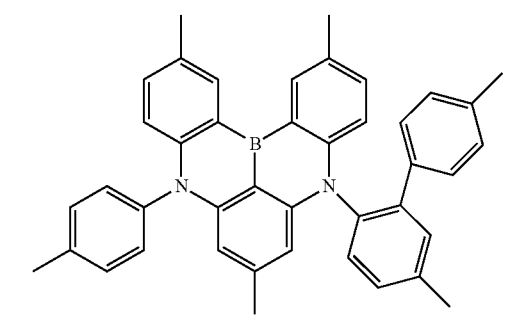
Dopant 14
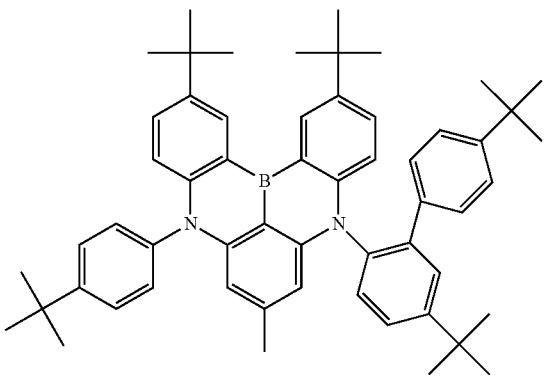

Dopant 15

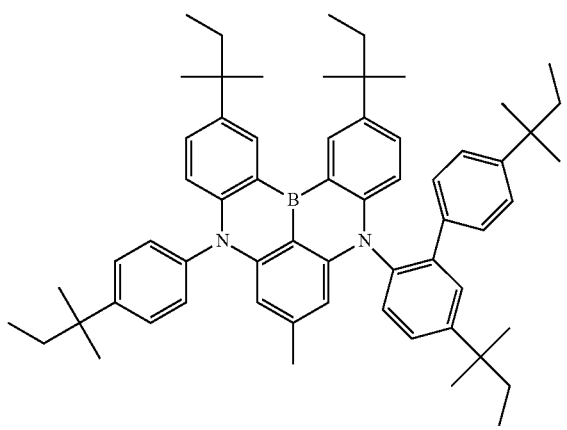

Dopant 16

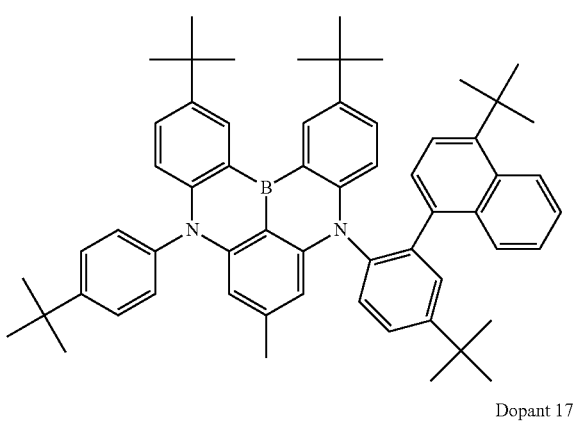

Dopant 17

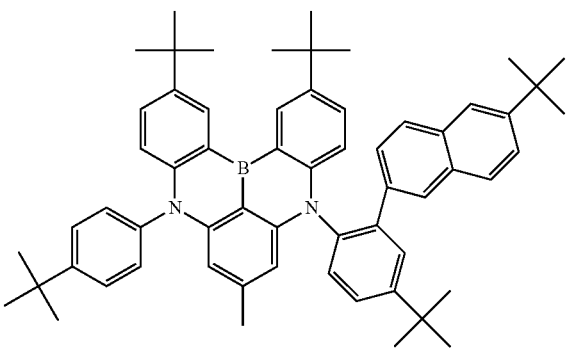

Dopant 18

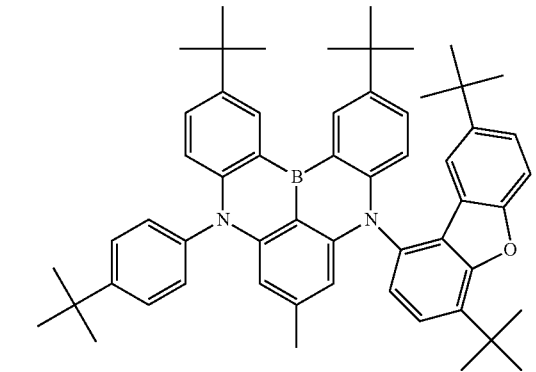

Dopant 19

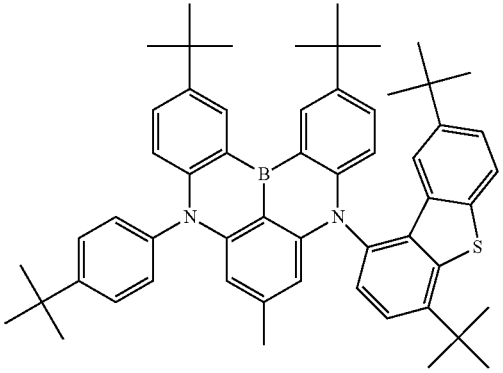

7. The organic light emitting diode of claim 1, wherein the first emitting part further comprises at least one of a first hole transport layer disposed between the first electrode and the first emitting material layer and a first electron transport layer disposed between the first emitting material layer and the first charge generation layer, and the second emitting part further comprises at least one of a second hole transport layer disposed between the first charge generation layer and the second emitting material layer and a second electron transport layer disposed between the second emitting material layer and the second electrode.

8. The organic light emitting diode of claim 7, wherein each of the first and second hole transport layer independently comprises a spirofluorene-based organic compound having the following structure of Formula 7:

Formula 7

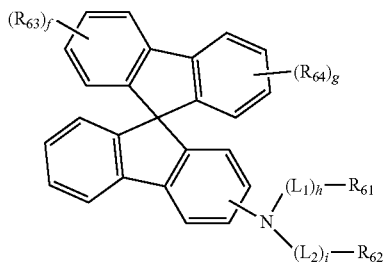

wherein:
each of $R_{61}$ and $R_{62}$ is independently a $C_6$-$C_{30}$ aryl group or a $C_3$-$C_{30}$ hetero aryl group, wherein each of the $C_6$-$C_{30}$ aryl group and the $C_3$-$C_{30}$ hetero aryl group is optionally substituted with at least one of a $C_1$-$C_{10}$ alley group and a $C_6$-$C_{30}$ aryl group;
each of $R_{63}$ and $R_{64}$ is independently hydrogen, deuterium or a $C_1$-$C_{20}$ alkyl group;
each off and g is a number of substituents and is independently an integer of 0 to 4;
each of $L_1$ and $L_2$ is independently a $C_6$-$C_{30}$ arylene group, wherein the $C_6$-$C_{30}$ arylene group is optionally substituted with at least one of a $C_1$-$C_{10}$ alkyl group and a $C_6$-$C_{30}$ aryl group; and
each of h and i is independently an integer of 0 or 1.

9. The organic light emitting diode of claim 7, wherein the first electron transport layer includes an azine-based organic compound having the following structure of Formula 10:

Formula 10

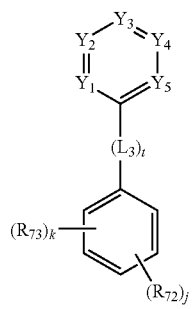

wherein:
each of $Y_1$, $Y_2$, $Y_3$, $Y_4$ and $Y_5$ is independently $CR_{71}$ or nitrogen, provided that one to three of $Y_1$, $Y_2$, $Y_3$, $Y_4$ and $Y_5$ is nitrogen;
$R_{71}$ is hydrogen or a $C_6$-$C_{30}$ aryl group;
$L_3$ is a $C_6$-$C_{30}$ arylene group;
$R_{72}$ is a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group is optionally substituted further with a $C_6$-$C_{30}$ aryl group or a $C_3$-$C_{30}$ hetero aryl group;
$R_{73}$ is hydrogen or adjacent two of $R_{73}$ form a $C_6$-$C_{20}$ aromatic ring when k is 2 or more;
j is 1 or 2;
k is an integer of 0 to 4; and
l is 0 or 1.

10. The organic light emitting diode of claim 9, wherein the second electron transport layer comprises a benzimidazole-based organic compound having the following structure of Formula 12:

Formula 12

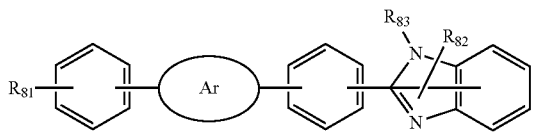

wherein:
Ar is a $C_{10}$-$C_{30}$ arylene group;
$R_{81}$ is a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group is optionally substituted with a $C_1$-$C_{10}$ alkyl group; and
each of $R_{82}$ and $R_{83}$ is independently hydrogen, a $C_1$-$C_{10}$ alkyl group or a $C_6$-$C_{30}$ aryl group.

11. The organic light emitting diode of claim 1, further comprising a third emitting part disposed between the first charge generation layer and the second emitting part and including a third emitting material layer, and a second charge generation layer disposed between the second emitting part and the third emitting part.

12. The organic light emitting diode of claim 11, wherein:
the first emitting part further comprises at least one of a first hole transport layer disposed between the first electrode and the first emitting material layer and a first electron transport layer disposed between the first emitting material layer and the first charge generation layer;
the second emitting part further comprises at least one of a second hole transport layer disposed between the second charge generation layer and the second emitting material layer and a second electron transport layer disposed between the second emitting material layer and the second electrode; and
the third emitting part further comprises at least one of a third hole transport layer disposed between the first charge generation layer and the third emitting material layer and a third electron transport layer disposed between the third emitting material layer and the second charge generation layer.

13. The organic light emitting diode of claim 12, wherein each of the first hole transport layer, the second hole transport layer and the third hole transport layer comprises independently a spirofluorene-based organic compound having the following structure of Formula 7:

Formula 7

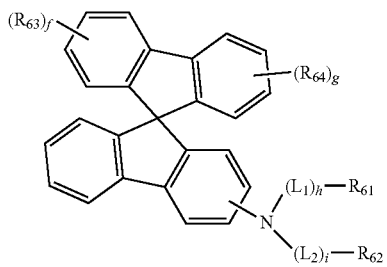

wherein:
each of $R_{61}$ and $R_{62}$ is independently a $C_6$-$C_{30}$ aryl group or a $C_3$-$C_{30}$ hetero aryl group, wherein each of the $C_6$-$C_{30}$ aryl group and the $C_5$-$C_{30}$ hetero aryl group is optionally substituted with at least one of a $C_1$-$C_{10}$ alley group and a $C_6$-$C_{30}$ aryl group;
each of $R_{63}$ and $R_{64}$ is independently hydrogen, deuterium, or a $C_1$-$C_{20}$ alkyl group; each off and g is a number of substituents and is independently an integer of 0 to 4;
each of $L_1$ and $L_2$ is independently a $C_6$-$C_{30}$ arylene group, wherein the $C_6$-$C_{30}$ arylene group is optionally substituted with at least one of a $C_1$-$C_{10}$ alkyl group and a $C_6$-$C_{30}$ aryl group; and
each of h and i is an integer of 0 or 1.

14. The organic light emitting diode of claim 12, wherein the first electron transport layer includes an azine-based organic compound having the following structure of Formula 10:

Formula 10

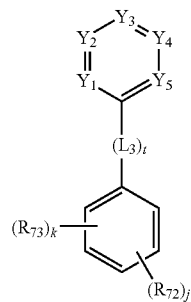

wherein:

each of $Y_1, Y_2, Y_3, Y_4$ and $Y_5$ is independently $CR_{71}$ or nitrogen, provided that one to three of $Y_1, Y_2, Y_3, Y_4$ and $Y_5$ is nitrogen;

$R_{71}$ is hydrogen or a $C_6$-$C_{30}$ aryl group;

$L_3$ is a $C_6$-$C_{30}$ arylene group;

$R_{72}$ is a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group is optionally substituted further with a $C_6$-$C_{30}$ aryl group or a $C_3$-$C_{30}$ hetero aryl group;

$R_{73}$ is hydrogen or adjacent two of $R_{73}$ form a $C_6$-$C_{20}$ aromatic ring when k is 2 or more;

j is 1 or 2;

k is an integer of 0 to 4; and l is 0 or 1.

15. The organic light emitting diode of claim 14, wherein each of the second electron transport layer and the third electron transport layer comprises independently a benzimidazole-based organic compound having the following structure of Formula 12:

Formula 12

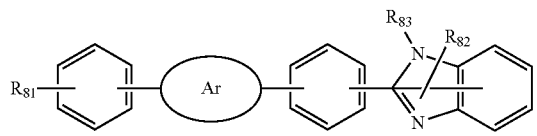

wherein:

Ar is a $C_{10}$-$C_{30}$ arylene group;

$R_{81}$ is a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group is optionally substituted with a $C_1$-$C_{10}$ alkyl group; and each of $R_{82}$ and $R_{83}$ is independently hydrogen, a $C_1$-$C_{10}$ alkyl group or a $C_6$-$C_{30}$ aryl group.

16. The organic light emitting diode of claim 12, wherein the first emitting part further comprises a first electron blocking layer disposed between the first hole transport layer and the first emitting material layer, and the second emitting part further comprises a second electron blocking layer disposed between the second hole transport layer and the second emitting material layer.

17. The organic light emitting diode of claim 16, wherein each of the first electron blocking layer and the second electron blocking layer comprises independently a spiro-fluorene-based organic compound having the following structure of Formula 18:

Formula 18

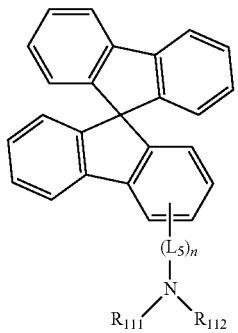

wherein:

$L_5$ is a $C_6$-$C_{30}$ arylene group;

n is 0 or 1; and each of $R_{111}$ and $R_{112}$ is independently a $C_6$-$C_{30}$ aryl group or a $C_5$-$C_{30}$ hetero aryl group, wherein each of the $C_6$-$C_{30}$ aryl group and the $C_5$-$C_{30}$ hetero aryl group is optionally substituted with at least one of a $C_1$-$C_{10}$ alkyl group and a $C_6$-$C_{20}$ aryl group.

18. The organic light emitting diode of claim 12, wherein the third emitting material layer comprises a lower emitting material layer disposed between the third hole transport layer and the third electron transport layer and an upper emitting material layer disposed between the lower emitting material layer and the third electron transport layer, and wherein one of the lower emitting material layer and the upper emitting material layer includes a red emitting material layer and the other of the lower emitting material layer and the upper emitting material layer includes a green emitting material layer.

19. An organic light emitting device, comprising:
a substrate; and
an organic light emitting diode of claim 1 over the substrate.

20. The organic light emitting device of claim 19, wherein the substrate defines a red pixel region, a green pixel region and a blue pixel region, wherein the organic light emitting diode is located correspondingly to the red pixel region, the green pixel region and the blue pixel region, and the organic light emitting device further comprises an color filter layer disposed between the substrate and the organic light emitting diode or over the organic light emitting diode correspondingly to the red pixel region, the green pixel region and the blue pixel region.

21. The organic light emitting device of claim 19, wherein the substrate defines a red pixel region, a green pixel region and a blue pixel region, wherein the organic light emitting diode is located correspondingly to the red pixel region, the green pixel region and the blue pixel region, and the organic light emitting device further comprises a color conversion layer disposed between the substrate and the organic light emitting diode or over the organic light emitting diode correspondingly to the red pixel region and the green pixel region.

* * * * *

UNITED STATES PATENT AND TRADEMARK OFFICE
CERTIFICATE OF CORRECTION

PATENT NO. : 12,398,318 B2
APPLICATION NO. : 17/539410
DATED : August 26, 2025
INVENTOR(S) : Young-Jun Yu et al.

Page 1 of 1

It is certified that error appears in the above-identified patent and that said Letters Patent is hereby corrected as shown below:

In the Claims

Column 98, Claim 8, Line 54:
"$C_1$-$C_{10}$ alley" should read: --$C_1$-$C_{10}$ alkyl--.

Signed and Sealed this
Eighteenth Day of November, 2025

John A. Squires
*Director of the United States Patent and Trademark Office*